(12) United States Patent
Schmukler et al.

(10) Patent No.: US 8,605,566 B2
(45) Date of Patent: *Dec. 10, 2013

(54) METHOD AND SYSTEM FOR SIGNAL EMULATION

(75) Inventors: Bruce C. Schmukler, Duluth, GA (US);
Arvind Raghavan, Waltham, MA (US);
Ziba Nami, Duluth, GA (US); Jyothi Emmanuel Peddi, Austell, GA (US);
Andrew Joo Kim, Atlanta, GA (US);
Michael G. Vrazel, Chamblee, GA (US); Charles E. Summers, Woodstock, GA (US)

(73) Assignee: Quellan, Inc., Atlanta, GA (US)

( * ) Notice: Subject to any disclaimer, the term of this patent is extended or adjusted under 35 U.S.C. 154(b) by 626 days.

This patent is subject to a terminal disclaimer.

(21) Appl. No.: 12/868,190

(22) Filed: Aug. 25, 2010

(65) Prior Publication Data
US 2011/0069604 A1    Mar. 24, 2011

Related U.S. Application Data

(63) Continuation of application No. 11/509,112, filed on Aug. 23, 2006, now Pat. No. 7,804,760, and a continuation-in-part of application No. 11/334,864, filed on Jan. 19, 2006, now Pat. No. 7,626,916, which is a continuation of application No. 10/911,915, filed on Aug. 5, 2004, now Pat. No. 7,050,388.

(60) Provisional application No. 60/494,072, filed on Aug. 7, 2003, provisional application No. 60/710,573, filed on Aug. 23, 2005.

(51) Int. Cl.
*H04B 3/20*      (2006.01)

(52) U.S. Cl.
USPC .......................................................... 370/201

(58) Field of Classification Search
USPC .......................... 370/201, 286, 290, 291, 292
See application file for complete search history.

(56) References Cited

U.S. PATENT DOCUMENTS

| | | | |
|---|---|---|---|
| 2,632,058 A | 3/1953 | Gray | 178/15 |
| 3,445,771 A | 5/1969 | Clapham et al. | 325/42 |

(Continued)

FOREIGN PATENT DOCUMENTS

| | | |
|---|---|---|
| EP | 0 527 966 B1 | 9/1994 |
| EP | 0 584 865 B1 | 3/2000 |

(Continued)

OTHER PUBLICATIONS

André et al.; *InP DHBT Technology and Design Methodology for High-Bit-Rate Optical Communications Circuits*; IEEE Journal of Solid-State Circuits; vol. 33, No. 9, Sep. 1998; pp. 1328-1335.

(Continued)

*Primary Examiner* — Melvin Marcelo
(74) *Attorney, Agent, or Firm* — King & Spalding

(57) ABSTRACT

A circuit can process a sample of a signal to emulate, simulate, or model an effect on the signal. Thus, an emulation circuit can produce a representation of a real-world signal transformation by processing the signal according to one or more signal processing parameters that are characteristic of the real-world signal transformation. The emulation circuit can apply analog signal processing and/or mixed signal processing to the signal. The signal processing can comprise feeding the signal through two signal paths, each having a different delay, and creating a weighted sum of the outputs of the two signal paths. The signal processing can also (or alternatively) comprise routing the signal through a network of delay elements, wherein a bank of switching or routing elements determines the route and thus the resulting delay.

28 Claims, 28 Drawing Sheets

(56) References Cited

U.S. PATENT DOCUMENTS

| | | | |
|---|---|---|---|
| 3,571,725 A | 3/1971 | Kaneko et al. | 328/14 |
| 3,599,122 A | 8/1971 | Leuthoki | 333/29 |
| 3,633,108 A | 1/1972 | Kneuer | 325/323 |
| 3,714,437 A | 1/1973 | Kinsel | 359/185 |
| 3,806,915 A | 4/1974 | Higgins et al. | 340/347 |
| 3,977,795 A | 8/1976 | Buschmann | 356/256 |
| 4,201,909 A | 5/1980 | Dogliotti et al. | 455/608 |
| 4,287,756 A | 9/1981 | Gallagher | 73/61.1 R |
| 4,288,872 A | 9/1981 | Tamburelli | 375/14 |
| 4,349,914 A | 9/1982 | Evans | 375/40 |
| 4,363,127 A | 12/1982 | Evans et al. | 375/30 |
| 4,386,339 A | 5/1983 | Henry et al. | 340/347 |
| 4,387,461 A | 6/1983 | Evans | 371/5 |
| 4,393,499 A | 7/1983 | Evans | 371/5 |
| 4,410,878 A | 10/1983 | Stach | 340/347 DD |
| 4,464,771 A | 8/1984 | Sorensen | 375/120 |
| 4,470,126 A | 9/1984 | Haque | 364/825 |
| 4,475,227 A | 10/1984 | Belfield | 381/30 |
| 4,479,266 A | 10/1984 | Eumurian et al. | 455/608 |
| 4,521,883 A | 6/1985 | Roché | 370/100 |
| 4,580,263 A | 4/1986 | Watanabe et al. | 371/5 |
| 4,584,720 A | 4/1986 | Garrett | 455/608 |
| 4,618,941 A | 10/1986 | Linder et al. | 364/724 |
| 4,646,173 A | 2/1987 | Kammeyer et al. | 360/51 |
| 4,651,026 A | 3/1987 | Serfaty et al. | 307/269 |
| 4,751,497 A | 6/1988 | Torii | 340/347 |
| 4,830,493 A | 5/1989 | Giebeler | 356/328 |
| 4,847,521 A | 7/1989 | Huignard et al. | 307/425 |
| 4,864,590 A | 9/1989 | Arnon et al. | 375/14 |
| 4,873,700 A | 10/1989 | Wong | 375/76 |
| 4,912,726 A | 3/1990 | Iwamatsu et al. | 375/20 |
| 4,942,593 A | 7/1990 | Whiteside et al. | 375/118 |
| 4,953,041 A | 8/1990 | Huber | 360/46 |
| 4,959,535 A | 9/1990 | Garrett | 250/214 R |
| 4,978,957 A | 12/1990 | Hotta et al. | 341/156 |
| 5,007,106 A | 4/1991 | Kahn et al. | 455/619 |
| 5,008,957 A | 4/1991 | Kiyono | 455/618 |
| 5,012,475 A | 4/1991 | Campbell | 372/29 |
| 5,067,126 A | 11/1991 | Moore | 370/112 |
| 5,072,221 A | 12/1991 | Schmidt | 341/159 |
| 5,111,065 A | 5/1992 | Roberge | 307/270 |
| 5,113,278 A | 5/1992 | Degura et al. | 359/154 |
| 5,115,450 A | 5/1992 | Arcuri | 375/7 |
| 5,121,411 A | 6/1992 | Fluharty | 375/20 |
| 5,128,790 A | 7/1992 | Heidemann et al. | 359/192 |
| 5,132,639 A | 7/1992 | Blauvelt et al. | 330/149 |
| 5,151,698 A | 9/1992 | Pophillat | 341/52 |
| 5,181,034 A | 1/1993 | Takakura et al. | 341/144 |
| 5,181,136 A | 1/1993 | Kavehrad et al. | 359/190 |
| 5,184,131 A | 2/1993 | Ikeda | 341/165 |
| 5,208,833 A | 5/1993 | Erhart et al. | 375/20 |
| 5,222,103 A | 6/1993 | Gross | 375/54 |
| 5,223,834 A | 6/1993 | Wang et al. | 341/136 |
| 5,225,798 A | 7/1993 | Hunsinger et al. | 333/165 |
| 5,237,590 A | 8/1993 | Kazawa et al. | 375/20 |
| 5,243,613 A | 9/1993 | Gysel et al. | 372/26 |
| 5,252,930 A | 10/1993 | Blauvelt | 330/149 |
| 5,282,072 A | 1/1994 | Nazarathy et al. | 359/157 |
| 5,283,679 A | 2/1994 | Wedding | 359/154 |
| 5,291,031 A | 3/1994 | MacDonald et al. | 250/577 |
| 5,293,406 A | 3/1994 | Suzuki | 375/59 |
| 5,300,930 A | 4/1994 | Burger et al. | 341/96 |
| 5,321,543 A | 6/1994 | Huber | 359/187 |
| 5,321,710 A | 6/1994 | Cornish et al. | 372/26 |
| 5,327,279 A | 7/1994 | Farina et al. | 359/180 |
| 5,343,322 A | 8/1994 | Pirio et al. | 359/173 |
| 5,351,148 A | 9/1994 | Maeda et al. | 359/124 |
| 5,355,240 A | 10/1994 | Prigent et al. | 359/161 |
| 5,361,156 A | 11/1994 | Pidgeon | 359/161 |
| 5,371,625 A | 12/1994 | Wedding et al. | 319/173 |
| 5,373,384 A | 12/1994 | Hebert | 359/161 |
| 5,376,786 A | 12/1994 | MacDonald | 250/227.12 |
| 5,382,955 A | 1/1995 | Knierim | 341/64 |
| 5,387,887 A | 2/1995 | Zimmerman et al. | 333/166 |
| 5,408,485 A | 4/1995 | Ries | 372/38 |
| 5,413,047 A | 5/1995 | Evans et al. | 102/302 |
| 5,416,628 A | 5/1995 | Betti et al. | 359/181 |
| 5,418,637 A | 5/1995 | Kuo | 359/161 |
| 5,424,680 A | 6/1995 | Nazarathy et al. | 330/149 |
| 5,428,643 A | 6/1995 | Razzell | 375/308 |
| 5,428,831 A | 6/1995 | Monzello et al. | 455/296 |
| 5,436,752 A | 7/1995 | Wedding | 359/195 |
| 5,436,756 A | 7/1995 | Knox et al. | 359/260 |
| 5,444,864 A | 8/1995 | Smith | 455/84 |
| 5,450,044 A | 9/1995 | Hulick | 332/103 |
| 5,481,389 A | 1/1996 | Pidgeon et al. | 359/161 |
| 5,481,568 A | 1/1996 | Yada | 375/340 |
| 5,483,552 A | 1/1996 | Shimazaki et al. | 375/233 |
| 5,504,633 A | 4/1996 | Van Den Enden | 360/65 |
| 5,510,919 A | 4/1996 | Wedding | 359/115 |
| 5,515,196 A | 5/1996 | Kitajima et al. | 359/180 |
| 5,528,710 A | 6/1996 | Burton et al. | 385/16 |
| 5,541,955 A | 7/1996 | Jacobsmeyer | 375/222 |
| 5,548,253 A | 8/1996 | Durrant | 332/103 |
| 5,557,439 A | 9/1996 | Alexander et al. | 359/130 |
| 5,574,743 A | 11/1996 | van der Poel et al. | 372/46 |
| 5,574,978 A | 11/1996 | Talwar et al. | |
| 5,589,786 A | 12/1996 | Bella et al. | 327/108 |
| 5,604,724 A | 2/1997 | Shiokawa | |
| 5,606,734 A | 2/1997 | Bahu | 455/303 |
| 5,612,653 A | 3/1997 | Dodds et al. | 333/124 |
| 5,617,135 A | 4/1997 | Noda et al. | 348/12 |
| 5,621,764 A | 4/1997 | Ushirokawa et al. | 375/317 |
| 5,625,360 A | 4/1997 | Garrity et al. | 341/144 |
| 5,625,722 A | 4/1997 | Froberg et al. | 385/1 |
| 5,644,325 A | 7/1997 | King et al. | 345/20 |
| 5,648,987 A | 7/1997 | Yang et al. | 375/232 |
| 5,670,871 A | 9/1997 | Man et al. | 324/96 |
| 5,675,600 A | 10/1997 | Yamamoto | 372/38 |
| 5,678,198 A | 10/1997 | Lemson | 455/67.1 |
| 5,689,356 A | 11/1997 | Rainal | 359/181 |
| 5,691,978 A | 11/1997 | Kenworthy | 370/278 |
| 5,692,011 A | 11/1997 | Nobakht et al. | 375/233 |
| 5,699,022 A | 12/1997 | Tovar | 333/18 |
| 5,706,008 A | 1/1998 | Huntley, Jr. et al. | 341/156 |
| 5,721,315 A | 2/1998 | Evans et al. | 525/74 |
| 5,723,176 A | 3/1998 | Keyworth et al. | 427/163.2 |
| 5,751,726 A | 5/1998 | Kim | 371/6 |
| 5,754,681 A | 5/1998 | Watanabe et al. | 382/159 |
| 5,757,763 A | 5/1998 | Green et al. | 369/275.3 |
| 5,761,243 A | 6/1998 | Russell et al. | 375/233 |
| 5,764,542 A | 6/1998 | Gaudette et al. | 364/574 |
| 5,774,505 A | 6/1998 | Baugh | 375/348 |
| 5,783,630 A | 7/1998 | Evans et al. | 525/74 |
| 5,784,032 A | 7/1998 | Johnston et al. | 343/702 |
| 5,790,595 A | 8/1998 | Benthin et al. | 375/224 |
| 5,798,854 A | 8/1998 | Blauvelt et al. | 359/161 |
| 5,801,657 A | 9/1998 | Fowler et al. | 341/155 |
| 5,802,089 A | 9/1998 | Link | 372/38 |
| 5,812,578 A | 9/1998 | Schemmann et al. | 372/46 |
| 5,825,211 A | 10/1998 | Smith et al. | 327/19 |
| 5,825,257 A | 10/1998 | Klymyshyn et al. | 332/100 |
| 5,825,825 A | 10/1998 | Altmann et al. | 375/293 |
| 5,828,329 A | 10/1998 | Burns | 341/155 |
| 5,835,848 A | 11/1998 | Bi et al. | 455/24 |
| 5,839,105 A | 11/1998 | Ostendorf et al. | 704/256 |
| 5,841,841 A | 11/1998 | Dodds et al. | 379/93.08 |
| 5,844,436 A | 12/1998 | Altmann | 327/156 |
| 5,848,139 A | 12/1998 | Grover | 379/114 |
| 5,850,409 A | 12/1998 | Link | 372/38 |
| 5,850,505 A | 12/1998 | Grover et al. | 395/182.02 |
| 5,852,389 A | 12/1998 | Kumar et al. | 332/103 |
| 5,859,862 A | 1/1999 | Hikasa et al. | 372/38 |
| 5,861,966 A | 1/1999 | Ortel | 351/125 |
| 5,872,468 A | 2/1999 | Dyke | 327/72 |
| 5,878,390 A | 3/1999 | Kawai et al. | 704/231 |
| 5,880,870 A | 3/1999 | Sieben et al. | 359/181 |
| 5,883,910 A | 3/1999 | Link | 372/38 |
| 5,887,022 A | 3/1999 | Lee et al. | 375/202 |
| 5,889,759 A | 3/1999 | McGibney | 370/207 |
| 5,896,392 A | 4/1999 | Ono et al. | 371/5.2 |
| 5,912,749 A | 6/1999 | Harstead et al. | 359/123 |
| 5,920,600 A | 7/1999 | Yamaoka et al. | 375/376 |
| 5,923,226 A | 7/1999 | Kakura et al. | 333/18 |

(56) References Cited

U.S. PATENT DOCUMENTS

| | | | |
|---|---|---|---|
| 5,942,576 A | 8/1999 | Evans et al. | 525/73 |
| 5,943,380 A | 8/1999 | Marchesani et al. | 375/376 |
| 5,943,457 A | 8/1999 | Hayward et al. | 385/24 |
| 5,949,926 A | 9/1999 | Davies | 385/3 |
| 5,959,032 A | 9/1999 | Evans et al. | 525/74 |
| 5,959,750 A | 9/1999 | Eskildsen et al. | 359/134 |
| 5,965,667 A | 10/1999 | Evans et al. | 525/74 |
| 5,968,198 A | 10/1999 | Hassan et al. | 714/752 |
| 5,978,417 A | 11/1999 | Baker et al. | 375/232 |
| 5,983,178 A | 11/1999 | Naito et al. | 704/245 |
| 5,985,999 A | 11/1999 | Dominguez et al. | 525/74 |
| 5,995,565 A | 11/1999 | Tong et al. | 375/346 |
| 5,999,300 A | 12/1999 | Davies et al. | 359/183 |
| 6,002,274 A | 12/1999 | Smith et al. | 327/19 |
| 6,002,717 A | 12/1999 | Gaudet | 375/232 |
| 6,009,424 A | 12/1999 | Lepage et al. | 707/6 |
| 6,011,952 A | 1/2000 | Dankberg et al. | 455/24 |
| 6,021,110 A | 2/2000 | McGibney | 370/208 |
| 6,028,658 A | 2/2000 | Hamada et al. | 352/129 |
| 6,031,048 A | 2/2000 | Evans et al. | 525/73 |
| 6,031,866 A | 2/2000 | Oler et al. | 375/219 |
| 6,031,874 A | 2/2000 | Chennakeshu et al. | 375/262 |
| 6,034,996 A | 3/2000 | Herzberg | 375/265 |
| 6,035,080 A | 3/2000 | Henry et al. | 385/24 |
| 6,041,299 A | 3/2000 | Schuster et al. | 704/232 |
| 6,052,420 A | 4/2000 | Yeap et al. | 375/346 |
| 6,072,364 A | 6/2000 | Jeckeln et al. | 330/149 |
| 6,072,615 A | 6/2000 | Mamyshev | 359/183 |
| 6,078,627 A | 6/2000 | Crayford | 375/286 |
| 6,084,931 A | 7/2000 | Powell, II et al. | 375/355 |
| 6,091,782 A | 7/2000 | Harano | 375/232 |
| 6,093,496 A | 7/2000 | Dominguez et al. | 428/500 |
| 6,093,773 A | 7/2000 | Evans et al. | 525/73 |
| 6,108,474 A | 8/2000 | Eggleton et al. | 385/122 |
| 6,111,477 A | 8/2000 | Klymyshyn et al. | 333/139 |
| 6,118,563 A | 9/2000 | Boskovic et al. | 359/124 |
| 6,118,567 A | 9/2000 | Alameh et al. | 359/189 |
| 6,127,480 A | 10/2000 | Dominguez et al. | 525/74 |
| 6,140,416 A | 10/2000 | Evans et al. | 525/74 |
| 6,140,858 A | 10/2000 | Dumont | 327/317 |
| 6,140,972 A | 10/2000 | Johnston et al. | 343/725 |
| 6,141,127 A | 10/2000 | Boivin et al. | 359/124 |
| 6,141,387 A | 10/2000 | Zhang | 375/261 |
| 6,148,428 A | 11/2000 | Welch et al. | 714/752 |
| 6,151,150 A | 11/2000 | Kikuchi | 359/194 |
| 6,154,301 A | 11/2000 | Harvey | 359/193 |
| 6,163,638 A | 12/2000 | Eggleton et al. | 385/37 |
| 6,169,764 B1 | 1/2001 | Babanezhad | 375/233 |
| 6,169,912 B1 | 1/2001 | Zuckerman | 455/570 |
| 6,181,454 B1 | 1/2001 | Nagahori et al. | 359/189 |
| 6,191,719 B1 | 2/2001 | Bult et al. | 341/144 |
| 6,201,916 B1 | 3/2001 | Eggleton et al. | 385/122 |
| 6,208,792 B1 | 3/2001 | Hwang et al. | 385/129 |
| 6,211,978 B1 | 4/2001 | Wojtunik | 359/114 |
| 6,212,654 B1 | 4/2001 | Lou et al. | 714/701 |
| 6,214,914 B1 | 4/2001 | Evans et al. | 524/323 |
| 6,215,812 B1 | 4/2001 | Young et al. | 375/144 |
| 6,219,633 B1 | 4/2001 | Lepage | 704/9 |
| 6,222,861 B1 | 4/2001 | Kuo et al. | 372/20 |
| 6,226,112 B1 | 5/2001 | Denk et al. | 359/138 |
| 6,236,963 B1 | 5/2001 | Naito et al. | 704/241 |
| 6,259,836 B1 | 7/2001 | Dodds | 385/24 |
| 6,259,847 B1 | 7/2001 | Lenz et al. | 385/131 |
| 6,268,816 B1 | 7/2001 | Bult et al. | 341/144 |
| 6,271,690 B1 | 8/2001 | Hirano et al. | 327/75 |
| 6,271,944 B1 | 8/2001 | Schemmann et al. | 359/124 |
| 6,281,824 B1 | 8/2001 | Masuda | 341/144 |
| 6,285,709 B1 | 9/2001 | Alelyunas et al. | |
| 6,288,668 B1 | 9/2001 | Tsukamoto et al. | 341/172 |
| 6,289,055 B1 | 9/2001 | Knotz | 375/286 |
| 6,289,151 B1 | 9/2001 | Kazarinov et al. | 385/32 |
| 6,295,325 B1 | 9/2001 | Farrow et al. | 375/327 |
| 6,297,678 B1 | 10/2001 | Gholami | 327/198 |
| 6,298,459 B1 | 10/2001 | Tsukamoto | 714/746 |
| 6,304,199 B1 | 10/2001 | Fang et al. | 341/118 |
| 6,311,045 B1 | 10/2001 | Domokos | 455/78 |
| 6,313,713 B1 | 11/2001 | Ho et al. | 333/1.1 |
| 6,314,147 B1 | 11/2001 | Liang et al. | 375/346 |
| 6,317,247 B1 | 11/2001 | Yang et al. | 359/245 |
| 6,317,469 B1 | 11/2001 | Herbert | 375/293 |
| 6,341,023 B1 | 1/2002 | Puc | 359/124 |
| 6,356,374 B1 | 3/2002 | Farhan | 359/180 |
| 6,388,786 B1 | 5/2002 | Ono et al. | 359/181 |
| 6,411,117 B1 | 6/2002 | Hatamian | 324/765 |
| 6,421,155 B1 | 7/2002 | Yano | 359/181 |
| 6,445,476 B1 | 9/2002 | Kahn et al. | 359/184 |
| 6,473,131 B1 | 10/2002 | Neugebauer et al. | 348/572 |
| 6,501,792 B2 | 12/2002 | Webster | 375/232 |
| 6,539,204 B1 | 3/2003 | Marsh et al. | 455/63 |
| 6,560,257 B1 | 5/2003 | DeSalvo et al. | 372/38.02 |
| 6,650,189 B1 | 11/2003 | Romao | |
| 6,665,348 B1 | 12/2003 | Feher | 375/259 |
| 6,665,500 B2 | 12/2003 | Snawerdt | 398/185 |
| 6,718,138 B1 | 4/2004 | Sugawara | 398/9 |
| 6,751,587 B2 | 6/2004 | Thyssen et al. | 704/228 |
| 6,816,101 B2 | 11/2004 | Hietala et al. | 341/155 |
| 6,819,166 B1 | 11/2004 | Choi et al. | 327/551 |
| 6,819,943 B2 | 11/2004 | Dalal | |
| 6,920,315 B1 | 7/2005 | Wilcox et al. | |
| 6,961,019 B1 | 11/2005 | McConnell et al. | 342/357.1 |
| 7,035,361 B2 | 4/2006 | Kim et al. | 375/350 |
| 7,050,388 B2 | 5/2006 | Kim et al. | 370/201 |
| 7,123,676 B2 | 10/2006 | Gebara et al. | |
| 7,149,256 B2 | 12/2006 | Vrazel et al. | |
| 7,173,551 B2 | 2/2007 | Vrazel et al. | |
| 7,212,580 B2 | 5/2007 | Hietala et al. | |
| 7,215,721 B2 | 5/2007 | Hietala et al. | |
| 7,307,569 B2 | 12/2007 | Vrazel et al. | |
| 8,249,540 B1 * | 8/2012 | Gupta et al. | 455/296 |
| 2001/0024542 A1 | 9/2001 | Aina et al. | 385/24 |
| 2002/0086640 A1 | 7/2002 | Belcher et al. | 455/63.1 |
| 2002/0167693 A1 | 11/2002 | Vrazel et al. | |
| 2002/0196508 A1 | 12/2002 | Wei et al. | 359/183 |
| 2002/0196510 A1 | 12/2002 | Hietala et al. | |
| 2003/0002121 A1 | 1/2003 | Miyamoto et al. | |
| 2003/0007631 A1 | 1/2003 | Bolognesi et al. | |
| 2003/0008628 A1 | 1/2003 | Lindell et al. | 455/180.1 |
| 2003/0030876 A1 | 2/2003 | Takei | 359/187 |
| 2003/0053534 A1 | 3/2003 | Sivadas et al. | 375/229 |
| 2003/0058976 A1 | 3/2003 | Ohta et al. | 375/350 |
| 2003/0063354 A1 | 4/2003 | Davidson | 359/189 |
| 2003/0067990 A1 | 4/2003 | Bryant | 375/259 |
| 2003/0097601 A1 | 5/2003 | Glas et al. | |
| 2004/0012433 A1 | 1/2004 | Kim et al. | |
| 2004/0053578 A1 | 3/2004 | Grabon et al. | |
| 2004/0105462 A1 | 6/2004 | Kim et al. | |
| 2004/0114888 A1 | 6/2004 | Rich et al. | |
| 2004/0196085 A1 | 10/2004 | Shen | |
| 2004/0197103 A1 | 10/2004 | Roberts et al. | 398/159 |
| 2004/0213354 A1 | 10/2004 | Jones et al. | 375/285 |
| 2004/0218756 A1 | 11/2004 | Tang et al. | 379/417 |
| 2005/0030884 A1 | 2/2005 | Kim et al. | |
| 2005/0069063 A1 | 3/2005 | Waltho et al. | 375/346 |
| 2005/0180520 A1 | 8/2005 | Kim et al. | |
| 2006/0146966 A1 | 7/2006 | Golanbari et al. | |
| 2006/0178157 A1 | 8/2006 | Gebara et al. | |
| 2006/0291598 A1 | 12/2006 | Gebara et al. | |
| 2007/0060059 A1 | 3/2007 | Kim et al. | |
| 2007/0064923 A1 | 3/2007 | Schmukler et al. | |
| 2007/0092265 A1 | 4/2007 | Vrazel et al. | |
| 2007/0171998 A1 | 7/2007 | Hietala et al. | |
| 2007/0253495 A1 | 11/2007 | Kim | |

FOREIGN PATENT DOCUMENTS

| | | |
|---|---|---|
| GB | 2 223 369 A | 4/1990 |
| GB | 2 306 066 A | 4/1997 |
| JP | 62082659 | 10/1988 |
| JP | 1990000063162 | 11/1991 |
| JP | 04187738 | 7/1992 |
| JP | 08079186 A | 3/1996 |
| WO | WO 99/45683 A1 | 9/1999 |
| WO | WO 01/41346 A2 | 6/2001 |
| WO | WO 02/067521 A1 | 8/2002 |

(56) References Cited

FOREIGN PATENT DOCUMENTS

| WO | WO 02/082694 A1 | 10/2002 |
|----|-----------------|---------|
| WO | WO 02/091600 A2 | 11/2002 |
| WO | WO 03/071731 A1 | 8/2003 |
| WO | WO 03/077423 A2 | 9/2003 |
| WO | WO 03/092237 A1 | 11/2003 |
| WO | WO 2004/008782 A2 | 1/2004 |
| WO | WO 2004/045078 A2 | 5/2004 |
| WO | WO 2004/088857 A2 | 10/2004 |
| WO | WO 2005/018134 A2 | 2/2005 |
| WO | WO 2005/050896 A2 | 6/2005 |
| WO | WO 2006/065883 A2 | 6/2006 |

OTHER PUBLICATIONS

Borjak et al.; *High-Speed Generalized Distributed-Amplifier-Based Transversal-Filter Topology for Optical Communication Systems*; IEEE Transactions on Microwave Theory and Techniques; vol. 45, No. 8; Aug. 1997; pp. 1453-1457.
Buchali et al.; *Fast Eye Monitor for 10 Gbit/s and its Application for Optical PMD Compensation*; Optical Society of America; (2000); pp. TuP5-1-TuP1-3.
Cartledge et al.; *Performance of Smart Lightwave Receivers With Linear Equalization*; Journal of Lightwave Technology; vol. 10, No. 8; Aug. 1992; pp. 1105-1109.
Chi et al.; *Transmission Performance of All-Optically Labelled Packets Using ASK/DPSK Orthogonal Modulation*; The 15$^{th}$ Annual Meeting of the IEEE Lasers and Electro-Optics Society, 2002; LEOS 2002; Nov. 10-14, 2002; vol. 1:51-52. The whole document.
Chiang et al.; *Implementation of STARTNET: A WDM Computer Communications Network*; IEEE Journal on Selected Areas in Communications; Jun. 1996; vol. 14, No. 5; pp. 824-839.
Choi et al.; *A 0.18-µm CMOS 3.5-Gb/s Continuous-Time Adaptive Cable Equalizer Using Enhanced Low-Frequency Gain Control Method*; IEEE Journal of Solid-State Circuits; Mar. 2004; vol. 39, No. 3; pp. 419-425.
Cimini et al.; *Can Multilevel Signaling Improve the Spectral Efficiency of ASK Optical FDM Systems?*; IEEE Transactions on Communications; vol. 41, No. 7; Jul. 1993; pp. 1084-1090.
Downie et al.; *Performance Monitoring of Optical Networks with Synchronous and Asynchronous Sampling*; Corning Incorporated, Science and Technology; SP-AR-02-1; p. WDD50-1; Abstract.
Enning et al.; *Design and Test of Novel Integrate and Dump Filter (I&D) for Optical Gbit/s System Applications*; Electronics Letters; (Nov. 21, 1991); vol. 27, No. 24; pp. 2286-2288.
Fürst et al.; *Performance Limits of Nonlinear RZ and NRZ Coded Transmission at 10 and 40 Gb/s on Different Fibers*; pp. 302-304.
Garrett, Ian; *Pulse-Position Modulation for Transmission Over Optical Fibers with Direct or Heterodyne Detection*; IEEE Transactions on Communications; vol. COM-31; No. 4; Apr. 1983; pp. 518-527.
Godin et al.; *A InP DHBT Technology for High Bit-rate Optical Communications Circuits*; IEEE; (1997); pp. 219-222.
Haskins et al.; *FET Diode Linearizer Optimization for Amplifier Predistortion in Digital Radios*; IEEE Microwave and Guided Wave Letters; vol. 10, No. 1; Jan. 2000; pp. 21-23.
Hranilovic et al.; *A Multilevel Modulation Scheme for High-Speed Wireless Infrared Communications*; IEEE; (1999); pp. VI-338-VI-341.
Idler et al.; *40 Gbit/s Quaternary Dispersion Supported Transmission Field Trial Over 86 km Standard Singlemode Fibre*; 24$^{th}$ European Conference on Optical Communication; Sep. 1998; pp. 145-147.
Jutzi, Wilhelm; *Microwave Bandwidth Active Transversal Filter Concept with MESFETs*; IEEE Transactions on Microwave Theory and Technique, vol. MTT-19, No. 9; Sep. 1971; pp. 760-767.
Kaess et al.; *New Encoding Scheme for High-Speed Flash ADC's*; IEEE International Symposium on Circuits and Systems; Jun. 9-12, 1997; Hong Kong; pp. 5-8.
Kaiser et al.; *Reduced Complexity Optical Duobinary 10-Gb/s Transmitter Setup Resulting in an Increased Transmission Distance*; IEEE Photonics Technology Letters; Aug. 2001; vol. 13; No. 8; pp. 884-886.

Kannangara et al.; *Adaptive Duplexer for Multiband Transreceiver*; Radio and Wireless Conference; Aug. 10-13, 2003; RAWCON '03; pp. 381-384.
Kannangara et al.; *Adaptive Duplexer for Software Radio*; Approximate Date: Nov. 11-13, 2002.
Kannangara et al.; *An Algorithm to Use in Adaptive Wideband Duplexer for Software Radio*; IEICE Transactions on Communications; Dec. 2003; vol. E86-B, No. 12; pp. 3452-3455.
Kannangara et al.; *Performance Analysis of the Cancellation Unit in an Adaptive Wideband Duplexer for Software Radio*; ATcrc Telecommunications and Networking Conference & Workshop, Melbourne, Australia, Dec. 11-12, 2003.
Lee et al.; *Effects of Decision Ambiguity Level on Optical Receiver Sensitivity*; IEEE Photonics Technology Letters; vol. 7, No. 19; Oct. 1995; pp. 1204-1206.
Marcuse, Dietrich; *Calculation of Bit-Error Probability for a Lightwave System with Optical Amplifiers and Post-Detection Gaussian Noise*; Journal of Lightwave Technology; vol. 9, No. 4; Apr. 1991; pp. 505-513.
Megherbi et al.; *A GaAs-HBT A/D Gray-Code Converter*; IEEE; (1997); pp. 209-212.
Nazarathy et al.; *Progress in Externally Modulated AM CATV Transmission Systems*; Journal of Lightwave Technology; vol. 11, No. 1; Jan. 1993; pp. 82-105.
Oehler et al.;*A 3.6 Gigasample/s 5 bit Analog to Digital Converter Using 0.3 µm AlGaAs-HEMT Technology*; IEEE; (1993); pp. 163-164.
Ohm et al.; *Quaternary Optical ASK-DPSK and Receivers with Direct Detection*; IEEE Photonics Technology Letters; Jan. 2003; vol. 15, No. 1; pp. 159-161.
Ohtsuki et al.; *BER Performance of Turbo-Coded PPM CDMA Systems on Optical Fiber*; Journal of Lightwave Technology; vol. 18; No. 12; Dec. 2000; pp. 1776-1784.
Ota et al.; *High-Speed, Burst-Mode, Packet-Capable Optical Receiver and Instantaneous Clock Recovery for Optical Bus Operation*; Journal of Lightwave Technology; vol. 12, No. 2; Feb. 1994; pp. 325-331.
Paul, et al.; *3 Gbit/s Optically Preamplified Direct Detection DPSK Receiver With 116 photon/bit Sensitivity*; Electronics Letters; vol. 29, No. 7; Apr. 1, 1993; pp. 614-615.
Penninckx et al.; *Optical Differential Phase Shift Keying (DPSK) Direct Detection Considered as a Duobinary Signal*; Proc. 27$^{th}$ Eur. Conf. on Opt. Comm. (ECOC'01—Amsterdam); vol. 3; Sep. 30 to Oct. 4, 2001; pp. 456-457.
Poulton et al.; *An 8-GSa/s 8-bit ADC System*; Symposium on VLSI Circuits Digest of Technical Papers; (1997); pp. 23-24.
Poulton et al.; *A 6-b, 4 GSa/s GaAs HBT ADC*; IEEE Journal of Solid-State Circuits; vol. 30, No. 10.; Oct. 1995; pp. 1109-1118.
Poulton et al.; *A 6-bit, 4 GSa/s ADC Fabricated in a GaAs HBT Process*; IEEE; (1994); pp. 240-243.
Prasetyo et al.; *Application for Amplitude Gain Estimation Techniques for Multilevel Modulation in OFDM Systems*; IEEE; (1998); pp. 821-824.
Rohde et al.; *Robustness of DPSK Direct Detection Transmission Format in Standard Fibre WDM Systems*; Electronics Letters; vol. 36, No. 17; Aug. 17, 2000; pp. 1483-1484.
Runge et al.; *High-Speed Circuits for Lightwave Communications*; 1999; World Scientific, pp. 181-184.
Shirasaki et al.; *Fibre Transmission Properties of Optical Pulses Produced Through Direct Phase Modulation of DFB Laser Diode*; Electronics Letters; vol. 24, No. 8; Apr. 14, 1988; pp. 486-488.
Shtaif et al.; *Limits on the Spectral Efficiency of Intensity Modulated Direct Detection Systems with Optical Amplifiers*; AT&T Labs Research; pp. MM1-1-MM1-3.
Su et al.; *Inherent Transmission Capacity Penalty of Burst-Mode Receiver for Optical Multiaccess Networks*; IEEE Photonics Technology Letters; vol. 6, No. 5; May 1994; pp. 664-667.
Vodhanel et al.; *Performance of Directly Modulated DFB Lasers in 10-Gb/s ASK, FSK, and DPSK Lightwave Systems*; Journal of Lightwave Technology; Sep. 1990; vol. 8, No. 9; pp. 1379-1386.
Vorenkamp et al.; *A 1Gs/s 10b Digital-to-Analog Converter*; ISSCC94/Session 3/Analog Techniques/Paper WP 3.3; pp. 52-53, (1994).

(56) References Cited

OTHER PUBLICATIONS

Wakimoto et al.; *Si Bipolar 2-GHz 6-bit Flash A/D Conversion LSI*; IEEE Journal of Solid-State Circuits; Dec. 1988; vol. 23, No. 6; pp. 1345-1350.
Walkin et al.; *A 10 Gb/s 4-ary ASK Lightwave System*; ECOC; 1997; pp. 255-258.
Walklin et al.; *Multilevel Signaling for Extending the Dispersion-Limited Transmission Distance in High-Speed, Fiber Optic Communication Systems*; IEEE; 1996; pp. 233-236.
Walklin et al.; *Multilevel Signaling for Increasing the Reach of 10 Gb/s Lightwave Systems*; IEEE Journal of Lightwave Technology; vol. 17; No. 11; Nov. 1999; pp. 2235-2248.
Wang et al.; *Multi-Gb/s Silicon Bipolar Clock Recovery IC*; IEEE Journal on Selected Areas in Communications; vol. 9, No. 5; Jun. 1991; pp. 656-663.
Webb, William T.; *Spectrum Efficiency of Multilevel Modulation Schemes in Mobile Radio Communications*; IEEE Transactions on Communications; vol. 43, No. 8; Aug. 1995; pp. 2344-2349.
Wedding et al.; *Multi-Level Dispersion Supported Transmission at 20 Gbit/s Over 46 km Installed Standard Singlemode Fibre*; 22$^{nd}$ European Conference on Optical Communication; 1996; pp. 91-94.
Wedding et al.; *Fast Adaptive Control for Electronic Equalization of PMD*; Optical Society of America; (2000); pp. TuP4-1-TuP4-3.
Weger et al.; *Gilbert Multiplier as an Active Mixer with Conversion Gain Bandwidth of up to 17GHz*; Electronics Letters; Mar. 28, 1991; vol. 27, No. 7; pp. 570-571.
Westphal et al.; *Lightwave Communications*; 1994; Thursday Afternoon/CLEO '94; pp. 337-338.
Williamson et al., *Performance Analysis of Adaptive Wideband Duplexer*; 2003 Australian Telecommunications, Networks and Applications Conference (ATNAC); Dec. 8-10, 2003.
Wilson et al.; *Predistortion of Electroabsorption Modulators for Analog CATV Systems at 1.55 μm*; Journal of Lightwave Technology; vol. 15, No. 9; Sep. 1997; pp. 1654-1662.
Author: Unknown; *Digital Carrier Modulation Schemes*; Title: Unknown; Date: Unknown; pp. 380-442.
Chiang et al.; *Implementation of STARNET: A WDM Computer Communications Network*; IEEE Journal on Selected Areas in Communications; Jun. 1996; vol. 14, No. 5; pp. 824-839.
Oehler et al.; *A 3.6 Gigasample/s 5 bit Analog to Digital Converter Using 0.3 μm AlGaAs-HEMT Technology*; IEEE; (1993); pp. 163-164.
Wilson et al.; *Predistortion of Electroabsorption Modulators or Analog CATV Systems at 1.55 μm*; Journal of Lightwave Technology; vol. 15, No. 9; Sep. 1997; pp. 1654-1662.

\* cited by examiner

METHOD AND SYSTEM FOR SIGNAL EMULATION

CROSS REFERENCE TO RELATED APPLICATIONS

This application is a continuation of and claims priority to U.S. patent application Ser. No. 11/509,112, entitled "Method and System for Signal Emulation" and filed Aug. 23, 2006, the entire contents of which are hereby incorporated herein by reference.

This application is a continuation-in-part of and claims priority to U.S. patent application Ser. No. 11/334,864, entitled "Method and System for Crosstalk Cancellation" and filed Jan. 19, 2006, the entire contents of which are hereby incorporated herein by reference.

U.S. patent application Ser. No. 11/334,864 is a continuation of U.S. patent application Ser. No. 10/911,915, entitled "Method and System for Crosstalk Cancellation," filed Aug. 5, 2004, and granted as U.S. Pat. No. 7,050,388 on May 23, 2006, the entire contents of which are hereby incorporated herein by references.

U.S. patent application Ser. No. 10/911,915 claims the benefit of priority to U.S. Provisional Patent Application No. 60/494,072, entitled "Method for Crosstalk Cancellation in High-Speed Communication Systems" and filed Aug. 7, 2003. The entire contents of U.S. Provisional Patent Application No. 60/494,072 are hereby incorporated herein by reference.

This application also claims the benefit of priority to U.S. Provisional Patent Application No. 60/710,573, entitled "High Speed, Mixed-Signal Adjustable Filter and Emulation Channel" and filed Aug. 23, 2005, the entire contents of which are hereby incorporated herein by references This application is related to U.S. Nonprovisional patent application Ser. No. 10/108,598, entitled "Method and System for Decoding Multilevel Signals," filed on Mar. 28, 2002, and U.S. Nonprovisional patent application Ser. No. 10/620,477, entitled "Adaptive Noise Filtering and Equalization for Optimal High Speed Multilevel Signal Decoding," filed on Jul. 15, 2003. The entire contents of U.S. patent application Ser. No. 10/108,598 and U.S. patent application Ser. No. 10/620,477 are hereby incorporated herein by reference.

FIELD OF THE INVENTION

The present invention relates to the field of communications, and more specifically to modeling, emulating, or simulating signals or signal effects such as crosstalk interference that can occur between two or more high-speed communication channels.

BACKGROUND

Increased consumption of communication services fuels a need for increased data carrying capacity or bandwidth in communication systems. A phenomenon known as crosstalk often occurs in these communication systems and can impair high-speed signal transmission and thus limit communication bandwidth to an undesirably low level.

Crosstalk is a condition that arises in communications systems wherein a signal in one communication channel is corrupted by interference (or bleed-over) from a different signal being communicated over another channel. The interference may arise due to a variety of effects. For example, in electrical systems such as circuit boards, electrical connectors, and twisted pair cable bundles, each electrical path serves as a channel. At high communication speeds, these conductive paths behave like antennae, both radiating and receiving electromagnetic energy. The radiated energy from one channel, referred to herein as the "aggressing channel," is undesirably coupled into or received by another channel, referred to herein as the "victim channel." This undesirable transfer of signal energy, known as "crosstalk," can compromise data integrity on the receiving channel. Crosstalk is typically bidirectional in that a single channel can both radiate energy to one or more other channels and receive energy from one or more other channels.

Crosstalk can occur in several ways, such as capacitively coupled crosstalk, inductively coupled crosstalk, or radiated crosstalk. Crosstalk can be a major problem in a backplane or cable environment. Coupling in multi-pin connectors is often a primary mechanism of crosstalk. When coupling occurs at the transmission end or proximal end of a communication link, it is often referred to as near-end crosstalk or "NEXT." When occurring at the receiving or distal side, the coupling is often referred to as far-end crosstalk or "FEXT." NEXT is generally more severe than FEXT.

In a backplane system, NEXT is usually generated by transmit signals interfering with receive signals. Such transmit signal can originate in a serializer/deserializer ("SERDES") device that may be an integrated circuit. The receive signals are generally attenuated when they arrive at the SERDES device, which usually makes the transmit signals larger than the receive signals. NEXT coming from the transmit signals can severely impair the quality of the receive signals to the point that bit errors occur.

Crosstalk is emerging as a significant barrier to increasing throughput rates of communications systems. When not specifically addressed, crosstalk often manifests itself as noise. In particular, crosstalk degrades signal quality by increasing uncertainty in the received signal value thereby making reliable communications more difficult, i.e. data errors occur with increased probability. In other words, crosstalk typically becomes more problematic at increased data rates. Not only does crosstalk reduce signal integrity, but additionally, the amount of crosstalk often increases with the bandwidth of the aggressing signal, thereby making higher data rate communications more difficult. This is particularly the case in electrical systems employing binary or multi-level signaling, since the conductive paths over which such signals flow usually radiate and receive energy more efficiently at the high frequencies associated with the level transitions in these signals. In other words, each signal in a binary or multi-level communication signal is composed of high-frequency signal components that are more susceptible to crosstalk degradation, as compared to the lower frequency components.

The crosstalk impediment to increasing data throughput rates is further compounded by the tendency of the high-frequency content of the victim signal to attenuate heavily over long signal transmission path lengths (e.g. circuit traces that are several inches in length for multi-gigabit per second data rates). That is, high-frequency components of a communication signal not only receive a relatively high level of crosstalk interference, but also are susceptible to interference because they are often weak due to transmission losses.

While these attenuated high-frequency components can be amplified via a technique known as channel equalization, such channel equalization frequently increases noise and crosstalk as a byproduct of amplifying the high-frequency signals that carry data. The amount of crosstalk present in a communication link often limits the level of equalization that can be utilized to restore signal integrity. For example, at the multi-gigabit per second data rates desired for next-generation backplane systems, the level of crosstalk energy on a communication channel can exceed the level of victim signal energy at the high frequencies that underlie such high-speed communication. In this condition, extraneous or stray signal energy can dominate the energy of the desirable data-carrying signals, thus rendering communicating at these data rates impractical with most conventional system architectures.

The term "noise," as used herein, is distinct from crosstalk and refers to a completely random phenomenon. Crosstalk, in contrast, is a deterministic, but often unknown, parameter. The conventional art includes knowledge that it is theoretically possible to modify a system in order to mitigate crosstalk. In particular, with definitions of: (i) the data communicated over an interfering or aggressing channel; and (ii) the signal transformation that occurs in coupling from the aggressing channel to the victim channel, the crosstalk can be theoretically determined and cancelled. That is, those skilled in the art understand that crosstalk signal degradation can be cancelled if the data carried by a communication signal that is input into a communication channel is known and the signal transformation imposed on the communication signal by crosstalk is also known. However, achieving a level of definition of this signal transformation having sufficient precision and accuracy to support a practical implementation of a system that adequately cancels crosstalk is difficult with conventional technology. Consequently, conventional technology that addresses crosstalk is generally insufficient for high-speed (e.g. multi-gigabit per second) communications systems. Thus, there is a need in the art to cancel crosstalk so as to improve victim signal fidelity and remove the barrier that crosstalk often poses to increasing data throughput rates.

While the physics giving rise to crosstalk (e.g. electromagnetic coupling in electrical systems or four-wave-mixing in optical systems) is generally well understood, understanding alone does not provide direct and simple models for the crosstalk transfer function. One common reason for conventional modeling difficulties is that the relative geometries of the victim and aggressor signal paths heavily influence the transfer function of the crosstalk effect, and these paths can be quite convoluted. In other words, signal path complexity typically checks efforts to model crosstalk using conventional modeling methods based on analyzing signal conduits. Furthermore, it is generally undesirable to design a crosstalk canceller for a predetermined specific crosstalk response since: (i) a system may have many different responses for different victim-aggressor pairs (each requiring a specific design); and (ii) different systems may need different sets of designs. Thus, there is a need in the art for a crosstalk cancellation system and method with sufficient flexibility to: (i) accommodate the variety of crosstalk transfer functions that can stem from ordinary operations of a given system; and (ii) self-calibrate in order to avoid a complex manual task of characterizing and adjusting for each victim-aggressor pair.

Another limitation of conventional technologies for crosstalk cancellation concerns speed, as such technologies are typically not well suited to high-speed environments, such as channels supporting multi-gigabaud rates. That is, crosstalk cancellation devices based on conventional data processing techniques may not operate at a sufficient speed to accommodate data transmission rates exceeding one, two, or ten gigabits per second, for example. More broadly, conventional technologies for emulating signals or signal effects often lack adequate signal processing speed for a wide variety of applications.

To address these representative deficiencies in the art, what is needed is a capability for crosstalk cancellation compatible with high-speed environments but offering low power consumption and reasonable production cost. Another need exists for a high-speed circuit that can emulate or model signals, signal transformations, or signal effects. Yet another need exists for an analog or mixed-signal circuit that can accurately and precisely emulate, model, or simulate signals, signal transformations, or signal effects. Still another need exists for a system that can compensate for crosstalk occurring on data transmission channels that operate at one, two, or ten gigabits per second, or more. Such capabilities would facilitate improved signal processing and/or would support higher data rates and improve bandwidth in diverse communication applications.

SUMMARY

The present invention supports processing a sample of a signal to emulate, simulate, model, or otherwise represent an effect on the signal. The effect can comprise a signal transformation, a signal delay, a synchronization of the signal with some other signal or event, a reshaping or distortion of the signal, a crosstalk effect, another signal, or a transfer of energy from the sampled signal to some other signal, to name a few possibilities.

In one aspect of the present invention, a circuit can produce a representation of a signal transformation by processing the sample of the signal according to one or more signal processing parameters that are characteristic of the signal transformation. Accordingly, the circuit can process a sample of a digital signal to produce a representation of a real-world signal transformation or of a theoretical signal effect. The digital signal may comprise a discrete number of digitized levels, for example two levels for a binary signal. Processing the sample of the digital signal can comprise applying analog signal processing, so that at various stages of processing, the sample retains the same number of digitized levels as the digital signal itself. In other words, processing the sample does not necessarily involve digitizing the sample beyond any digitization already present in the pre-sampled digital signal. Nevertheless, processing can proceed under digital control, for example via feedback from a digital controller that sets one or more processing parameters. Accordingly, the circuit can apply analog signal processing, mixed signal processing, or a combination of analog and digital processing to the signal, for example.

Processing the sample can comprise delaying and/or shaping the sample. For shaping of the sample, a finite impulse filter can process the sample to create a desired waveform shape. The finite impulse filter can comprise an analog implementation of a tapped delay line. The sample can transmit through a series of delay stages, each having a capability to add energy to the sample to mitigate high-frequency attenuation or roll-off. That is, the tapped delay line can comprise active elements.

The circuit can feed components of the sample, or essentially the entire sample, through two signal paths of differing delay. Thus, the two signal paths can output two signals, one leading the other in time. The circuit can apply respective weights, scaling factors, or gains to the two signals. The weights can be complementary or can be reciprocals of one another, so that when one increases, the other decreases. The circuit can combine the two weighted signals via addition, subtraction, summation, or some other form of signal combination.

The circuit can also or alternatively routing the sample through a network of delay elements, wherein one or more switching devices, routing elements, or transistors determines the route and thus the resulting delay. Thus, the circuit can comprise two (or more) delay elements. To impart the sample with a selected amount of delay, the circuit can route the sample through the two delay elements. When less delay is desired, the circuit can route the signal through one of the delay elements while bypassing the other delay element. In this manner, the circuit can provide a configurable level of delay.

The discussion of emulating signal effects presented in this summary is for illustrative purposes only. Various aspects of the present invention may be more clearly understood and appreciated from a review of the following detailed description of the disclosed embodiments and by reference to the drawings and the claims that follow. Moreover, other aspects, systems, methods, features, advantages, and objects of the present invention will become apparent to one with skill in the art upon examination of the following drawings and detailed description. It is intended that all such aspects, systems, methods, features, advantages, and objects are to be included within this description, are to be within the scope of the present invention, and are to be protected by any accompanying claims.

BRIEF DESCRIPTION OF THE DRAWINGS

FIG. 19, are a schematic of a circuit for controllably delaying an input signal according to an exemplary embodiment of the present invention.

Figure 1:
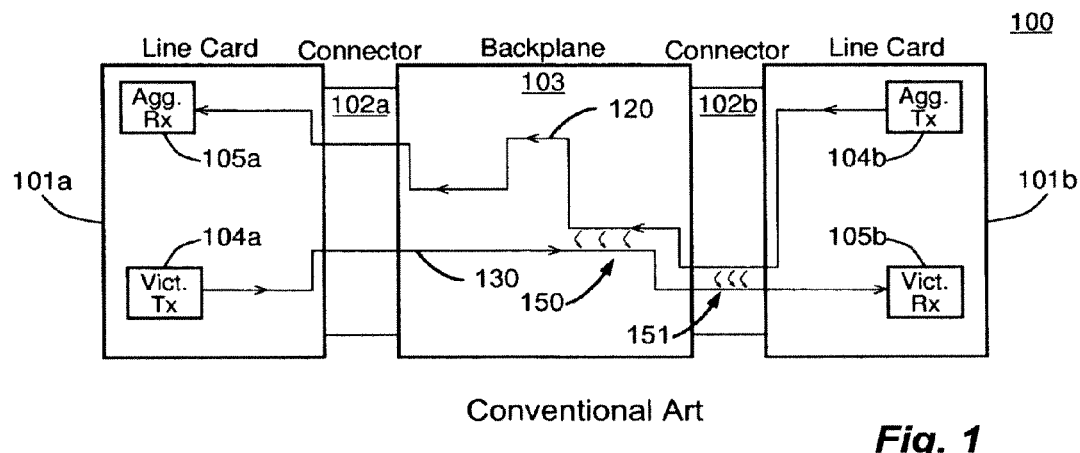
FIG. 1 illustrates a functional block diagram of a communication system having two linecards communicating over a backplane and incurring crosstalk.

Many aspects of the invention can be better understood with reference to the above drawings. The components in the drawings are not necessarily to scale, emphasis instead being placed upon clearly illustrating the principles of exemplary embodiments of the present invention. Moreover, in the drawings, reference numerals designate like or corresponding, but not necessarily identical, elements throughout the several views.

DETAILED DESCRIPTION OF EXEMPLARY EMBODIMENTS

The present invention can support modeling a signal transformation, such as the unwanted coupling of a first signal into the channel of another signal, via applying selectable levels of time delay and frequency-dependent gain to a signal sample.

An exemplary embodiment of the present invention can support canceling crosstalk on one or more communication paths in a communication system, such as a high-speed digital data communication system. That is, an exemplary embodiment of the present invention can support compensating for signal interference, such as crosstalk, occurring between two or more communication channels. Compensating for crosstalk can improve signal quality and enhance communication bandwidth or information carrying capability.

A flexible and adaptable model of the crosstalk effect can output a cancellation signal that accurately represents crosstalk interference. Coupling this cancellation signal onto a signal path that has crosstalk can cancel such crosstalk and thereby negate the impairment that crosstalk can impose on bandwidth.

A communication signal transmitted on one communication channel can couple an unwanted signal, such as crosstalk, into another communication channel and interfere with communication signals transmitting on that channel. In addition to occurring between two channels, this crosstalk effect can couple between and among multiple communication channels with each channel imposing crosstalk on two or more channels and receiving crosstalk from two or more channels. A channel can be a medium, such as an electrical conductor or an optical fiber that provides a signal path. A single optical fiber or wire can provide a transmission medium for two or more channels, each communicating digital or analog information. Alternatively, each channel can have a dedicated transmission medium. For example, a circuit board can have multiple conductors in the form of circuit traces, in which each trace provides a dedicated communication channel.

In one exemplary embodiment of the present invention, a crosstalk cancellation device can input a crosstalk cancellation signal into a channel receiving crosstalk interference to cancel or otherwise compensate for the received crosstalk. The crosstalk cancellation signal can be derived or produced from a signal that is propagating on another channel, generating the crosstalk. The crosstalk cancellation device can be coupled between the channel that generates the crosstalk and the channel that receives the crosstalk. In this configuration, the crosstalk cancellation device can sample or receive a portion of the signal that is causing the crosstalk and can compose the crosstalk cancellation signal for application to the channel that is receiving the unwanted crosstalk. In other words, the crosstalk cancellation device can tap into the channel that is causing the crosstalk, generate a crosstalk cancellation signal, and apply the crosstalk cancellation signal to the channel receiving crosstalk interference to provide crosstalk cancellation or correction.

In one exemplary embodiment of the present invention, the crosstalk cancellation device can generate the crosstalk cancellation signal via a model of the crosstalk effect. The model can generate the crosstalk cancellation signal in the form of a signal that estimates, approximates, emulates, or resembles the crosstalk signal. The crosstalk cancellation signal can have a waveform or shape that matches the actual crosstalk signal. A setting or adjustment that adjusts the model, such as a set of modeling parameters, can define characteristics of this waveform.

The crosstalk cancellation signal can be synchronized with the actual crosstalk signal. That is, the timing of the crosstalk cancellation signal can be adjusted to match the timing of the actual crosstalk signal. A timing delay or other timing parameter can define the relative timing or temporal correspondence between the crosstalk cancellation signal and the actual crosstalk signal.

In one exemplary embodiment of the present invention, the crosstalk cancellation device can implement modeling, delay, timing, and/or signal shaping adjustments so the crosstalk cancellation signal closely matches the actual crosstalk, thereby yielding effective crosstalk cancellation. A controller of the crosstalk cancellation device can monitor and analyze the output of the crosstalk cancellation device. That is, a controller can process the crosstalk-cancelled signal, which is an improved communication signal that results from applying the crosstalk cancellation signal to the channel having crosstalk interference. The controller can vary the modeling parameters and the timing delay, individually or in unison, to minimize any residual crosstalk remaining after crosstalk cancellation. Adjusting the operations of the crosstalk cancellation device can compensate for fluctuating conditions and/or variations in the crosstalk effect.

In one exemplary embodiment of the present invention, a crosstalk cancellation device can undergo a calibration or setup procedure that is initiated internally or externally. The crosstalk cancellation device, or another device executing the calibration procedure, can initiate the transmission of a known or predetermined test signal on a communication channel. A test signal can be transmitted on the channel that causes crosstalk or the channel that receives crosstalk interference. Also, one test signal can be transmitted on a channel generating crosstalk, while a different test signal is transmitted on a channel that receives the generated crosstalk interference. For example, a randomized communication signal can propagate on the crosstalk-generating channel, while the crosstalk-receiving channel can have a uniform voltage or current signal that is representative of essentially no data transmission. The crosstalk cancellation device can utilize these known conditions to define the timing and shape of a crosstalk cancellation signal that effectively compensates for crosstalk interference. In other words, the crosstalk cancellation device can define or refine its model of the crosstalk effect based on operating the crosstalk cancellation device with test signals transmitting on the crosstalk-generating and the crosstalk-receiving communication channels.

Turning now to discuss each of the drawings presented in FIGS. 1-30, in which like numerals indicate like elements throughout the several figures, an exemplary embodiment of the present invention will be described in detail. FIGS. 1-12 generally relate to methods and systems for correcting, canceling, or compensating for communication crosstalk. FIGS. 13-30 generally relate to modeling, simulating, or emulating signals, signal transformations, and signal effects that may occur in connection with crosstalk (or some other phenomenon). Accordingly, FIGS. 13-30 provide an exemplary method and system for processing signals in connection with addressing crosstalk. Thus, a crosstalk cancellation device as described herein with reference to FIGS. 1-12 can comprise technology discussed herein with reference to FIGS. 13-30.

Turning now to FIG. 1, this figure illustrates a functional block diagram of a communication system 100 having two linecards 101a, 101b communicating over backplane signal paths 120, 130 exhibiting crosstalk 150, 151. More specifically, FIG. 1 illustrates an occurrence of backplane crosstalk 150, and connector crosstalk 151 in the exemplary case of a backplane communications system 100.

A linecard 101a, 101b is a module, typically a circuit board that slides in and out of a chassis slot and provides communication capabilities associated with a communication channel. A backplane 103 is a set of signal paths, such as circuit traces, at the rear of such a chassis that transmit signals between each installed linecard 101a, 101b and another communication device, such as another linecard 101a, 101b or a data processing component in a rack-mounted digital communication system.

Each linecard 101a, 101b in the system 100 illustrated in FIG. 1 transmits and receives multiple channels of data, such as the two illustrated channels 120, 130. An exemplary channel 130: (i) starts at a transmitter (Tx) 104a on a linecard 101a; (ii) transmits off the linecard 101a through a connector 102a to the backplane 103; (iii) continues across the backplane 103 to another connector 102b and linecard 101b; and (iv) is received by a receiver (Rx) 105b. FIG. 1 shows two such channels labeled the "victim" or "vict." (from victim transmitter 104a to victim receiver 105b) and the "aggressor" or "agg." (from aggressor transmitter 104b to aggressor receiver 105a).

When the signal paths 120, 130 are in close proximity to one another, signal energy radiates from the aggressor channel 120 and is incorporated into the victim channel 130. That is, in areas of the backplane 103 and connectors 102a, 102b in which a first signal path is located close to a second signal path, a portion of the signal energy propagating in the first signal path can couple into the second signal path and corrupt or impair signals propagating on this second signal path. This crosstalk coupling 150 may occur on a linecard 101a, 101b, in a connector 102a, 102b, on a backplane 103, or any combination thereof, for example.

While not illustrated in FIG. 1, crosstalk can also occur in the reverse direction. Specifically, the "victim" channel 130 often radiates energy which corrupts the "aggressor" channel 120. That is, crosstalk frequently occurs in a bidirectional manner, transferring not only from a first signal path to a second signal path but also from the second signal path to the first signal path. Furthermore, in systems having three or more signal paths coexisting in close proximity to one another (not illustrated), crosstalk can transfer among and between three or more signal paths. That is, a single signal can not only impose crosstalk on two or more other signals, but also receive crosstalk interference from two or more other signals.

Similar to the multi-physical-path case illustrated in FIG. 1 and described above, crosstalk can occur with the aggressor and victim channels propagating on a single transmission medium (e.g. a single cable or trace). In this scenario, each channel can correspond to a particular signal band (e.g. a frequency band in frequency division multiplexing system, a spectral band as in an optical wavelength division multiplexing system, or a temporal window in time-division multiplexing system). In other words, two communication channels, one generating crosstalk, one receiving crosstalk, can coexist in a communication medium such as an optical waveguide or a wire, with each communication channel supporting transmission of a dedicated communication signal.

For clarity of explanation, an exemplary embodiment of the present invention based on crosstalk occurring between two channels, each on a separate physical path, is illustrated in FIG. 1 and described in detail herein. In another exemplary embodiment of the present invention, a method and system cancels crosstalk occurring between channels coexisting on a single communication medium. One skilled in the art should be able to make and use the present invention in an application having two or more channels exhibiting crosstalk on a single communication medium following the detailed description, flow charts, plots, and functional block diagrams included herein.

Figure 2:
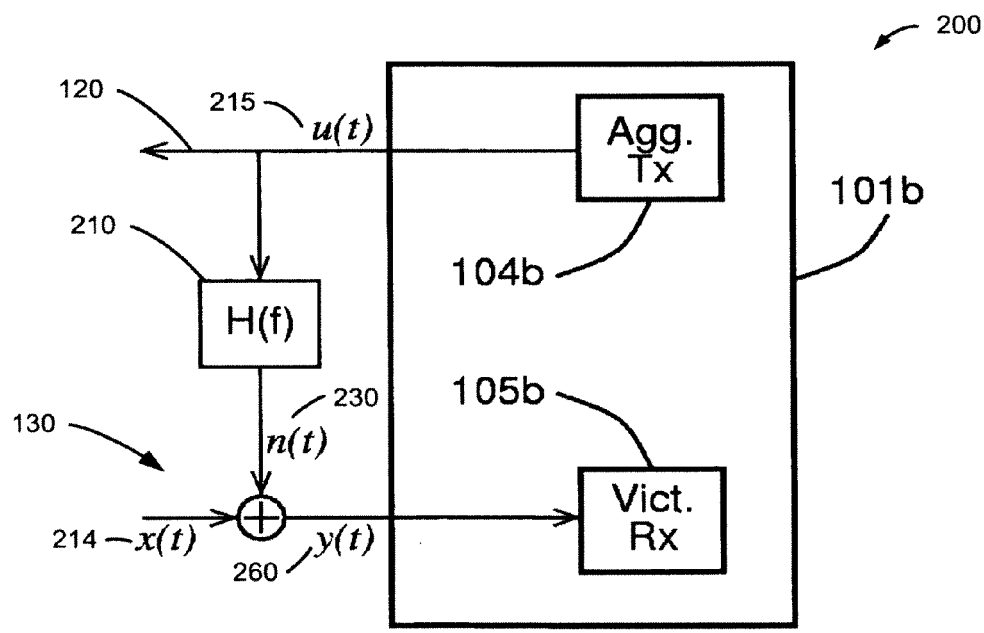
FIG. 2 illustrates a functional block diagram of a crosstalk model for the system illustrated in FIG. 1.

Turning now to FIG. 2, this figure illustrates a functional block diagram 200 of a crosstalk model 210 for the system 100 illustrated in FIG. 1. More specifically, FIG. 2 illustrates a model 210 of the crosstalk effect 151 in the connector 102b based on a single, exemplary transfer function 210.

The aggressor transmitter 104b outputs an aggressor communication signal u(t) 215 on the aggressor channel 120. Energy from this aggressor communication signal u(t) 215 couples into the victim channel 130 via crosstalk 151 in the connector 102b. The aggressor communication signal u(t) 215 is composed of a spread of frequencies. Since crosstalk 151 is a frequency dependent phenomenon, the frequencies of the aggressor communication signal u(t) 215 couple into the victim channel at varying efficiency. The frequency model H(f) 210 of the crosstalk effect 151 expresses the extent to which each of these frequency components couples into the victim channel 130 in the form of a signal n(t) 230. This crosstalk signal n(t) 230 combines with the unadulterated communication signal x(t) 214 propagating on the victim channel 130 from the victim transmitter 104a. The victim channel 130 transmits the resulting combined signal y(t) 260 to the victim receiver 105b.

The crosstalk transfer function 210 can be characterized by the frequency response H(f) 210 (or its time-domain equivalent impulse response h(t)). As depicted in FIG. 2, the response H(f) 210 conveys the transformation that the aggressor data signal u(t) 215 experiences in the connector portion of its route from the aggressing transmitter 104b to the victim receiver 105b. The specifics of this response 210 usually vary among particular victim-aggressor channel pairs. Nevertheless, the general nature of the response is based on geometric constraints and underlying physics. For example, a backplane connector's crosstalk response 151 can depend upon physical system parameters. The backplane crosstalk 150 can also be modeled with a transfer function, and the backplane and connector crosstalks 150, 151 can even be captured with a single (albeit different) transfer function.

An exemplary, non-limiting embodiment of the present invention, in which a crosstalk cancellation device compensates for crosstalk occurring on a linecard-to-backplane connection will be described below with reference to FIGS. 3-12B. The embodiments disclosed herein are provided so that this disclosure will be thorough and complete and will convey the scope of the invention to those having ordinary skill in the art. Those skilled in the art will appreciate that the present invention can be applied to address crosstalk occurring on a backplane or other locations in a communication system and that the present invention can compensate for various forms of crosstalk.

Figure 3:
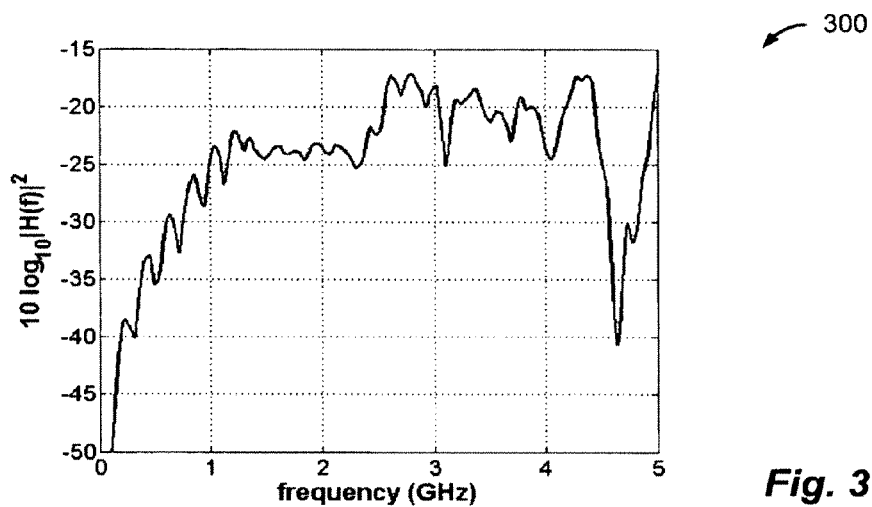
FIG. 3 illustrates a plot of a crosstalk response for a backplane-to-linecard connector according to an exemplary embodiment of the present invention.

Turning now to FIG. 3, this figure illustrates a plot 300 of a crosstalk response 210 for a backplane-to-linecard connector 102b according to an exemplary embodiment of the present invention. This plot 300 illustrates laboratory measurements of the power in the crosstalk signal 151, more specifically the power transferred from the aggressor channel 120 to the victim channel 130 in the connector 102b, as a function of frequency. The horizontal axis is frequency measured in units of gigahertz (GHz). The vertical axis describes signal power in decibels ("dB"), more specifically ten times the base-ten logarithm of the crosstalk frequency response 210 squared. Thus, this plot 300 illustrates the level of crosstalk power transferred from one channel 120 to another channel 130 for each frequency component of the aggressor signal u(t) 215.

In connectors 102a, 102b, the dominant mechanism for crosstalk 151 is typically capacitive coupling between the connector's pins. This mechanism is clearly evident in FIG. 3 as the general high-pass nature of the response of the plot 300.

In other words, the plot 300 shows a trend of higher signal frequencies, above about 1 GHz, transferring energy via crosstalk mechanisms 151 more readily than lower frequencies, below 1 GHz. The left side of the plot 300, less than approximately 1 GHz, exhibits an attenuated crosstalk signal having a power less than approximately −25 dB. Thus, this plot 300 shows that the frequency components less than approximately 1 GHz of a communication signal u(t) 215 transfer a relatively small portion of their carried power to a victim channel 130 via connector crosstalk 151. The magnitude of crosstalk 151 increases between approximately 0.25 GHz and 1 GHz. Thus, based on this plot 300, the components of a victim communication signal x(t) 214 that have frequencies between approximately 1 GHz and 4.25 GHz are particularly prone to crosstalk effects 151 from an aggressor communication signal u(t) 215 with similar signal frequencies.

Furthermore, the fluctuations in the frequency response plot 300 at frequencies above 2 GHz illustrate that the crosstalk effect 151 is heavily influenced by other effects than simple capacitive coupling between a pair of pins. In other words, above 2 GHz, the plot 300 deviates from a classical capacitive coupling response, which typically asymptotically (and monotonically) increases with increased frequency. In contrast, the illustrated plot 300 exhibits a pattern of peaks and valleys at higher frequencies, such as a local minimum at approximately 4.6 GHz.

As described above, adequate crosstalk cancellation depends heavily on accurately modeling a system's crosstalk response. Crosstalk cancellation performance is particularly dependent upon model accuracy for frequencies in which the crosstalk effect is strong, namely for frequencies above approximately 1 GHz.

The higher order effects of the aforementioned peaks and valleys in the plot 300 are highly dependent on specific relative geometric relations between the victim signal path 130 and aggressor signal path 120 which are not known a priori, in general. In other words, deriving an accurate and sufficient crosstalk model based on geometric or physical analysis of communication paths can be problematic without empirical data or test measurements regarding actual crosstalk impact on a signal.

Stated another way, the plot 300 of FIG. 3 illustrates that the higher frequency components of a communication signal 214, 215 are particularly prone to crosstalk 151 and that modeling the crosstalk response 210 for these higher frequency components involves addressing the inherently erratic nature of this high frequency response. Since an accurate model of a system's crosstalk response 210 can provide the basis for adequate crosstalk cancellation, such a model needs to accurately represent these higher-order, erratic response characteristics. While passive circuit analysis does not readily derive a model with requisite accuracy, actual signal responses can serve as a basis for constructing an appropriate model.

In one exemplary embodiment of the present invention, a crosstalk model in a crosstalk cancellation device can be defined based on crosstalk measurement data such as the measurement data presented in the plot 300 illustrated in FIG. 3. As an alternative to acquiring such measurement data in the laboratory, the data can be acquired during field operations, for example by switching a crosstalk cancellation device into a calibration mode as will be discussed below in reference to FIG. 9 and FIG. 11.

Figure 4:
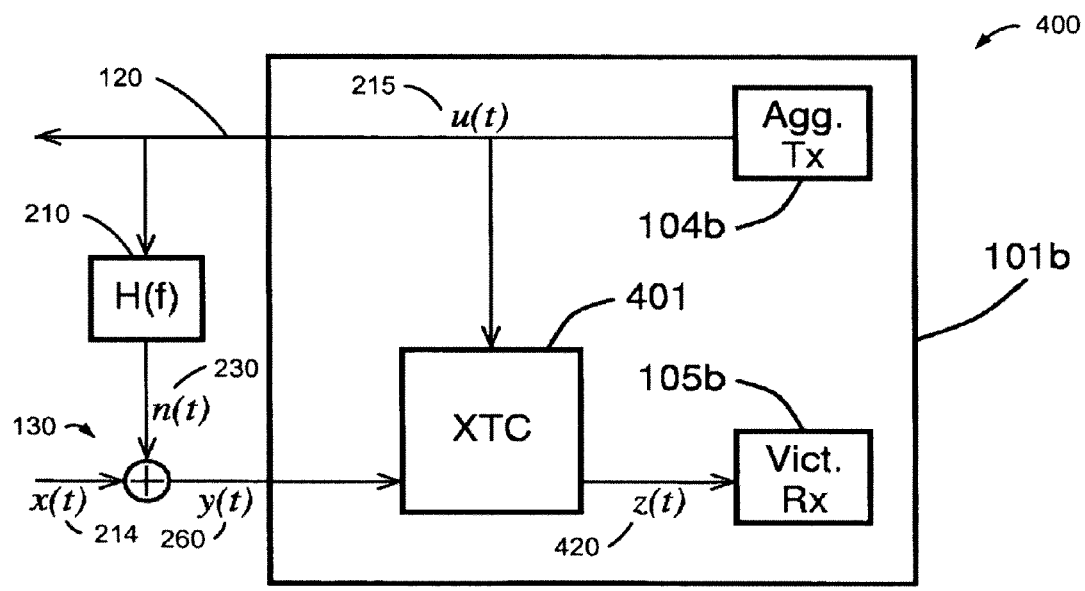
FIG. 4 illustrates a functional block diagram of a crosstalk cancellation system according to an exemplary embodiment of the present invention.

Turning now to FIG. 4, this figure illustrates a functional block diagram of a crosstalk cancellation system 400 according to an exemplary embodiment of the present invention. As described above, the present invention can provide crosstalk cancellation in high-speed digital communication systems, such as the communication system 100 illustrated in FIGS. 1 and 2 and discussed above. More specifically, FIG. 4 illustrates a crosstalk cancellation device or crosstalk canceller ("XTC") 401 arranged to cancel crosstalk 151 occurring in a backplane-to-line card connector 101b as discussed above with reference to FIGS. 1, 2, 3, and 4.

Digital data x(t) 214 propagates in the victim channel 130 for reception by the victim receiver 105b. The victim channel 130 also carries the unwanted crosstalk signal n(t) 230 that is derived from digital data u(t) 215 output by the aggressor transmitter 104b and that is not intended for reception at the victim receiver 105b. The intended data stream signal x(t) 214 and the crosstalk signal n(t) 230 additively form the composite signal y(t) 260. The crosstalk canceller 401 receives the composite signal y(t) 260, corrects the crosstalk interference n(t) 230 from this signal 260 via cancellation and outputs a corrected signal, z(t) 420 for receipt by the victim receiver 105b. That is, the crosstalk canceller 401 applies an estimate of the actual crosstalk 230 to the signals 260 propagating in the victim channel 130 to effectively cancel the crosstalk signal elements 230 while leaving the desired data signal 214 essentially intact.

The steps that the crosstalk canceller 401 performs include:
(i) accepting as separate inputs y(t) 260 (the victim signal corrupted by crosstalk 151) and a representative portion of u(t) 215 (the aggressor signal propagating on the aggressor channel 120 giving rise to the crosstalk signal 230);
(ii) transforming the transmitted aggressor signal u(t) 215 into crosstalk estimates that emulate the signal transformation 210 that actual occurs in the system 200 via the crosstalk effect 151;
(iii) subtracting the modeled crosstalk from the victim y(t) 260 to cancel its crosstalk signal n(t) 230 component; and
(iv) outputting the compensated signal z(t) 420 to the victim receiver 105b, which can be a conventional receiver without specific technology for crosstalk compensation.

Figure 5:
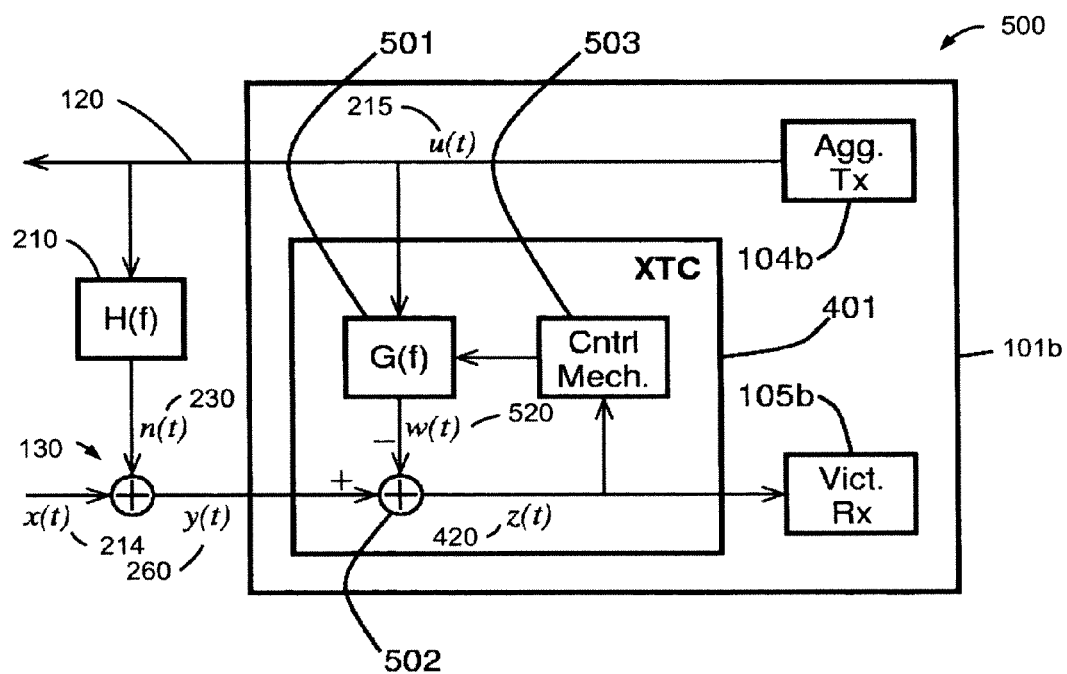
FIG. 5 illustrates a functional block diagram of a crosstalk cancellation system including functional blocks of a crosstalk cancellation device according to an exemplary embodiment of the present invention.

Turning now to FIG. 5, this figure illustrates a functional block diagram of a crosstalk cancellation system 500 according to an exemplary embodiment of the present invention. More specifically, FIG. 5 illustrates an architectural overview of an exemplary crosstalk canceller 401 that has three functional elements 501, 502, 503, a crosstalk model 501, a summation node 502, and a 503 controller, electronic control "mechanism", or control module. The model 501 generates a crosstalk estimate signal w(t) 520, while the summation node 502 applies this crosstalk estimate 520 to the victim channel 130. The controller 503 adjusts parameters in the model 501 based on the output z(t) 420 of the summation node 502.

The model 501 emulates the aggressor transfer function H(f) 210 in the form of an adjustable frequency response function G(f) 501. That is, the model 501 generates an artificial crosstalk signal w(t) 520 that can be a model, simulation, estimate, or emulation of the actual, interfering crosstalk signal n(t) 230 caused by electromagnetic coupling in the connector 102b between the aggressor channel 120 and the victim channel 130. The model frequency response G(f) 501 effectively filters the aggressor data signal u(t) 215 in a manner that applies a frequency dependent response similar to the plot 300 illustrated in FIG. 3 and discussed above.

Because the same aggressor data stream u(t) 215 drives both the actual crosstalk response H(f) 210 and the crosstalk canceller' model 501, the output w(t) 520 of the model 510 is, in the ideal case, equal to the aggressor signal component n(t) 230. That is, G(f) 501 equals H(f) 210 in a theoretical or ideal case in which the environment is noise-free and all system parameters are known and modeled perfectly. Furthermore, in this ideal scenario, the respective output signals n(t) 230 and w(t) 520 of H(f) 210 and G(f) 501 would also be equal to one another. In a real-world situation having numerous unknown influences and indeterminate factors, G(f) 501 approximates H(f) 210 with sufficient precision and accuracy to support essentially error-free communications of high-speed data rates.

The difference node 502 subtracts the emulated aggressor signal w(t) 520, or emulation signal 520, from the composite signal y(t) 260, thus removing or reducing crosstalk interference from the received victim signal y(t) 260. In a physical implementation functioning in a real-world operating environment, the model G(f) 501 does not exactly match the true response H(f) 210. The controller 503 adjusts the model 501 to minimize this error related to inaccuracies between the actual crosstalk effect HO 210 and the emulated or modeled crosstalk effect G(f) 501.

Implementation of the summation node 502 is usually straightforward to those skilled in the art. However, special attention should be paid to maintain high sensitivity to the two inputs. It is not uncommon for the incurred, and thus the modeled, crosstalk signals 230, 520 to be small in amplitude, especially at high frequencies. While seemingly negligible at first glance, these high frequencies are often amplified via equalization devices (not illustrated). Thus, while the neglected high-frequency crosstalk may be small before equalization, it can be very significant after equalization. The summation node should be implemented to accommodate such high-frequency response.

A portion of the compensated signal z(t) 420 (i.e. the output of the difference node 502) is tapped off and fed to the controller 503, providing the controller 503 with essentially the same signal 420 that the victim receiver 105*b* receives. The controller adjusts the parameters of the modeling filter 501, characterized by the response G(f) 501, to maximize the goodness-of-fit to the actual response H(f) 210. In particular, the controller 503 takes as input the crosstalk compensated signal z(t) 420 and processes, monitors, or analyzes that signal 420 to determine signal fidelity. In other words, the controller 503 evaluates the model's performance by analyzing the extent to which the model's output 520 has cancelled the crosstalk signal 230. The controller 503 also adjusts the model 501 to enhance crosstalk cancellation and to provide dynamic response to changing conditions.

Because the output of the controller 503 includes parameters of the modeling filter 501, the controller can adjust the modeled response G(f) 420. Consequently, the controller 503 can manipulate the modeling filter 501 to maximize the fidelity of the compensated signal 420, i.e. the match between G(f) 420 and H(f) 210, by minimizing crosstalk on z(t) 420. Stated another way, the controller 503 monitors the corrected, crosstalk-cancelled signal z(t) 420 and dynamically adjusts the crosstalk model G(f) 420 to improve the crosstalk cancellation and enhance signal quality. Thus, in one exemplary embodiment of the present invention, a crosstalk cancellation device 401 can include a feedback loop that adapts, self-corrects, or self configures crosstalk cancellation to compensate for modeling errors, fluctuating dynamic conditions, and other effects.

The system illustrated in FIG. 5 can be implemented primarily using analog integrated circuitry to provide a relatively low degree of complexity, power consumption, and cost. In one embodiment, the model 501 and difference node 502 are entirely analog. In another embodiment, certain aspects of the model 501 are implemented digitally to exploit the digital nature of the aggressor data source 104*b*.

The controller 503 typically includes both analog and digital circuitry. Due to particular aspects of the analog pre-processing in the controller 503, this digital circuitry can operate at a low speed relative to the communication data rate and thus can facilitate practical implementation. In particular, the digital circuitry can operate at speeds that are orders of magnitude less than the channel baud rate. In one exemplary embodiment of the present invention, a digital circuit in the controller 503 operates at least one order of magnitude below the channel baud rate. In one exemplary embodiment of the present invention, a digital circuit in the controller 503 operates at least two orders of magnitude below the channel baud rate. In one exemplary embodiment of the present invention, a digital circuit in the controller 503 operates at least three orders of magnitude below the channel baud rate. Further details exemplary embodiments of the controller 503 and the model 501 that together yield a low-power and low-cost crosstalk cancellation solution are discussed in more detail below.

Figure 6:
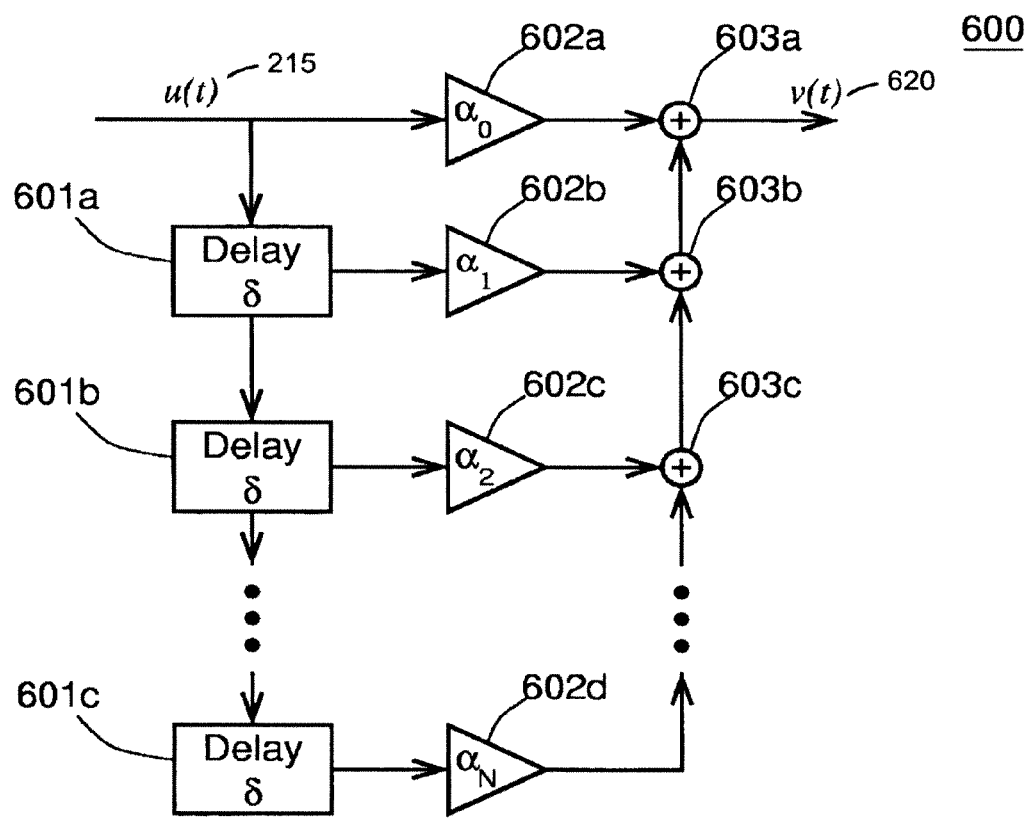
FIG. 6 is a functional block diagram of a tapped delay line filter according to an exemplary embodiment of the present invention.

Turning now to FIG. 6, this figure is a functional block diagram of a tapped delay line filter 600 according to an exemplary embodiment of the present invention. A tapped delay line filter 600 is a device that generates an output signal 620 from an input signal 215 by delaying the input signal 215 through a series of delay stages 601*a*, 601*b*, 601*c*; scaling the output of each delay stage 601*a*, 601*b*, 601*c*, typically with an amplifier 602*a*, 602*b*, 602*c*, 602*d*; and adding or otherwise combining these scaled outputs. The tapped delay line filter 600 can be an analog component of the model 501 that generates a signal v(t) 620 having a shape or waveform approximating that of the imposed crosstalk signal n(t) 230. That is, the tapped delay line filter 600 can be an exemplary waveform shaper that is implemented via analog components.

As described above, accurately modeling the actual crosstalk response 210 facilitates adequate removal of crosstalk interference 230 via crosstalk cancellation. If a crosstalk cancellation device (not illustrated) were based on an inaccurate crosstalk model (not illustrated) such a device might degrade, rather than improve, signal quality. For example, as a result of an erroneous model, a "correction" signal intended to cancel crosstalk might add interference to a received victim signal while leaving the crosstalk signal that is targeted for cancellation essentially intact. Thus, a crosstalk model, for example based on a filtering mechanism, should have sufficient flexibility to support modeling a variety of crosstalk transfer functions that may be encountered in an application. That is, a flexible crosstalk model is desirable over a rigid model that cannot readily adapt to various applications, operating conditions, and environments, for example.

In one exemplary embodiment of the present invention, as illustrated in FIG. 6, an analog tapped delay line filter 600 (also known as transversal filter) with electrically controllable gain coefficients 602*a*, 602*b*, 602*c*, 602*d*; models the aggressor crosstalk transfer function 210. This filter 600 can provide a desirable level of flexibility and adaptability that supports a wide range of operating conditions and situations. More specifically, the tapped delay line filter 600 can generate a waveform approximating the waveform of the crosstalk signal 230 imposed on the victim channel 130.

The illustrated filter 600 is an exemplary tapped delay line filter with N delay elements 601*a*, 601*b*, 601*c* (each providing time delay δ (delta)) and corresponding variable coefficient amplifiers 602a, 602b, 602c, 602d with coefficients $\alpha_n$ (alpha$_n$) for n=0, ..., N. The output v(t) 620 of the tapped delay filter 600 can be written as $$v(t)=\alpha_0 u(t)+\alpha_1 u(t-\delta)+\ldots+\alpha_N u(t-N\delta).$$

Changing the values of the gain coefficients $\alpha_0, \alpha_1, \alpha_2 \ldots \alpha_n$ (alpha$_0$, alpha$_1$, alpha$_2$ ... alpha$_n$) can cause a corresponding change in the response of the filter 600. The tapped delay line filter 600 can model the aggressor's impulse response for up to N$\delta$ (N times delta), that is, up to the temporal span of the filter 600. Additionally, the frequency content of the aggressor response 210 (as illustrated in FIG. 3 and discussed above) can be modeled up to a frequency of $f=1/(2\delta)$ (frequency equals the reciprocal of two times delta). Thus, $\delta$ (delta) should be chosen such that the highest signal frequency of interest in the victim signal x(t) 214 is less than $f=1/(2\delta)$ (frequency equals the reciprocal of two times delta). Furthermore, N should be chosen so that the majority of the aggressor impulse response is contained within a temporal span of N$\delta$ (N times delta). Equivalently, the aggessor frequency response 210 should not exhibit large fluctuations below frequencies of $f=1/(N\delta)$ (frequency equals the reciprocal of N times delta). These conditions for selecting N and $\delta$ (delta) contrast with the aggressor signal's conditions. It is not critical if aggressor noise remains above the specified frequency, because a well designed receiver can readily suppress these higher frequencies without degrading victim signal quality.

While a tapped delay line filter 600 can emulate, estimate, or mimic pulse shaping caused by the aggressor response 210, this filter 600 typically cannot adequately address highly variable temporal delay without an unwieldy number of taps or delay stages. Temporal delay is directly associated with the length of the signal path that spans between (i) the circuit tap that directs a portion of the aggressor data signal u(t) 215 to the crosstalk canceller 401 and (ii) the summation node 502 in the crosstalk canceller 401, as illustrated in FIG. 5 and discussed above. More specifically, the modeled temporal delay should closely approximate the temporal delay of the actual crosstalk signal n(t) 230 so that the modeled and actual signals 230, 520 are properly synchronized or timed with respect to one another for effective mutual cancellation. While the output 620 of the tapped delay line filter 600 can be directly used as the output w(t) 520 of the model 501, synchronizing the tapped delay line filter's output 620 with the crosstalk signal 230 on the victim channel 130 can enhance crosstalk cancellation, provide heightened signal fidelity to the victim receiver 105b, and improve overall modeling flexibility.

Because the locations of the coupling points of both the actual crosstalk signal 230 and its modeled counterpart 520 can be significantly variable among victim-aggressor pairs, their respective delays can be ill-defined or subject to uncertainty. Even in the relatively simple case of dominant coupling via the backplane-linecard connector 102b, the signal path length on the linecard 101b is often variable. Thus, the temporal delay can be difficult to predict without specific knowledge and analysis of linecard layout. To address this uncertainty in temporal delay, an adjustable delay 701 can be incorporated into the cross talk modeling filter 501 as illustrated in FIG. 7.

Figure 7:
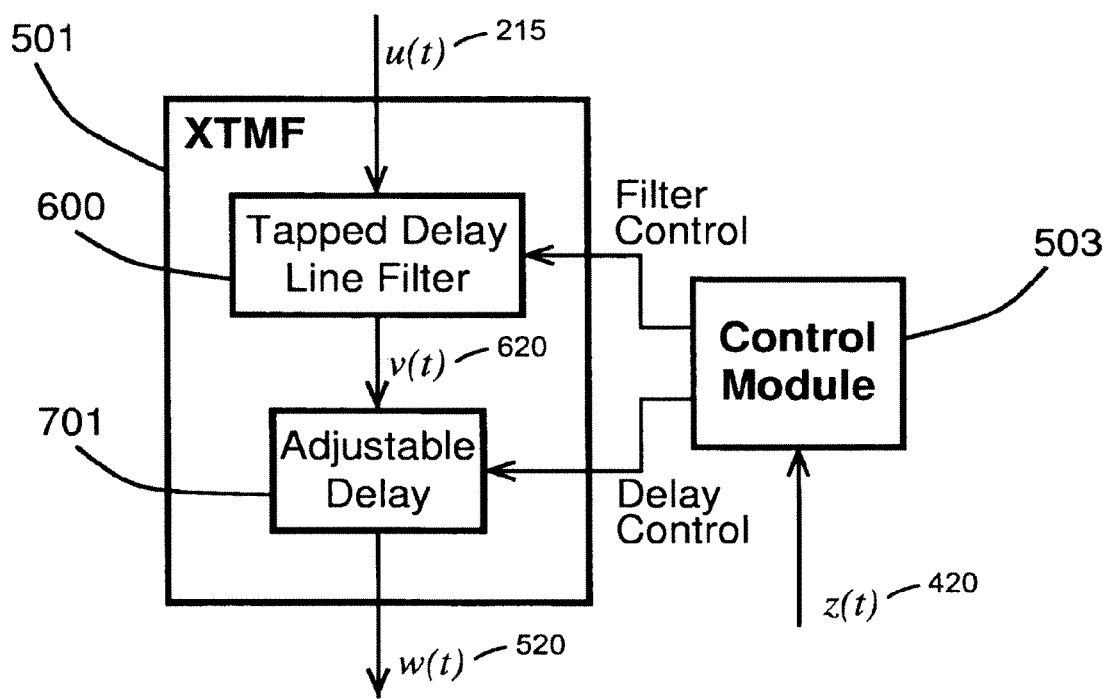
FIG. 7 is a functional block diagram of a crosstalk modeling filter of a crosstalk cancellation device with an adjustable delay according to an exemplary embodiment of the present invention.

Turning now to FIG. 7, this figure is a functional block diagram of a crosstalk modeling filter ("XTMF") 501 of a crosstalk cancellation device 401 with an adjustable delay 701 according to an exemplary embodiment of the present invention. The adjustable delay 701 can either precede or succeed (as shown in FIG. 7) the tapped delay line filter 600. In one exemplary embodiment of the present invention, placing the adjustable delay 701 on the input side of the analog tapped delay line filter 600, rather than the output side as illustrated, can simplify the implementation. This simplification can result from the discrete nature of the digital signal u(t) 215 wherein signal linearity can be readily maintained by quantizing or hard-limiting the output of the delay device 701. Alternatively, if the adjustable delay 701 follows the tapped delay line filter 600, in accord with the illustrated configuration, the signal v(t) 620 is analog at the input to the adjustable delay 701. Inputting an analog signal into the adjustable delay 701 can impose a need for a linear response over a broad range of signal values and frequencies, which can be difficult to achieve for large delay values.

While the tapped delay line filter 600 outputs a correction signal w(t) 520 that approximates the crosstalk signal n(t) 230 undesirably propagating on the victim channel 130 alongside the intended data signal x(t) 214, the adjustable delay 701 synchronizes the waveform of the correction signal 520 with the waveform of the undesirable crosstalk signal 230. That is, the adjustable delay 701 times or coordinates the correction signal 520 so it temporally matches and is synchronized with the actual crosstalk interference 230.

Based on the functions of the tapped delay line filter 600 and the adjustable delay 701, the crosstalk modeling filter 501 outputs a cancellation signal w(t) 520 having form and timing accurately matching the actual crosstalk signal n(t) 230. When inserted into or applied to the victim channel 130 via the subtraction node 502, as illustrated in FIG. 5 and discussed above, the cancellation signal w(t) 520 negates the actual crosstalk signal 230 and thereby enhances the quality of the communication signal z(t) 420 delivered to the victim receiver 105b.

As discussed in further detail above with reference to FIG. 5 and below with reference to FIG. 8, the controller 503 adjusts the tapped delay line filter 600 and the adjustable delay 701 to fine tune their respective performances and to enhance the fidelity of the corrected signal 420 delivered to the victim receiver 105b.

In one exemplary embodiment of the present invention, the circuit 1510 shown in FIG. 15 and discussed below is substituted for the crosstalk modeling filter 501. Thus, the adjustable delay 701 and the tapped delay line filter 600 shown on FIG. 7 can respectively comprise the temporal alignment module 1535 and the FIR filter 1560 of FIG. 15 as discussed below.

Figure 8:
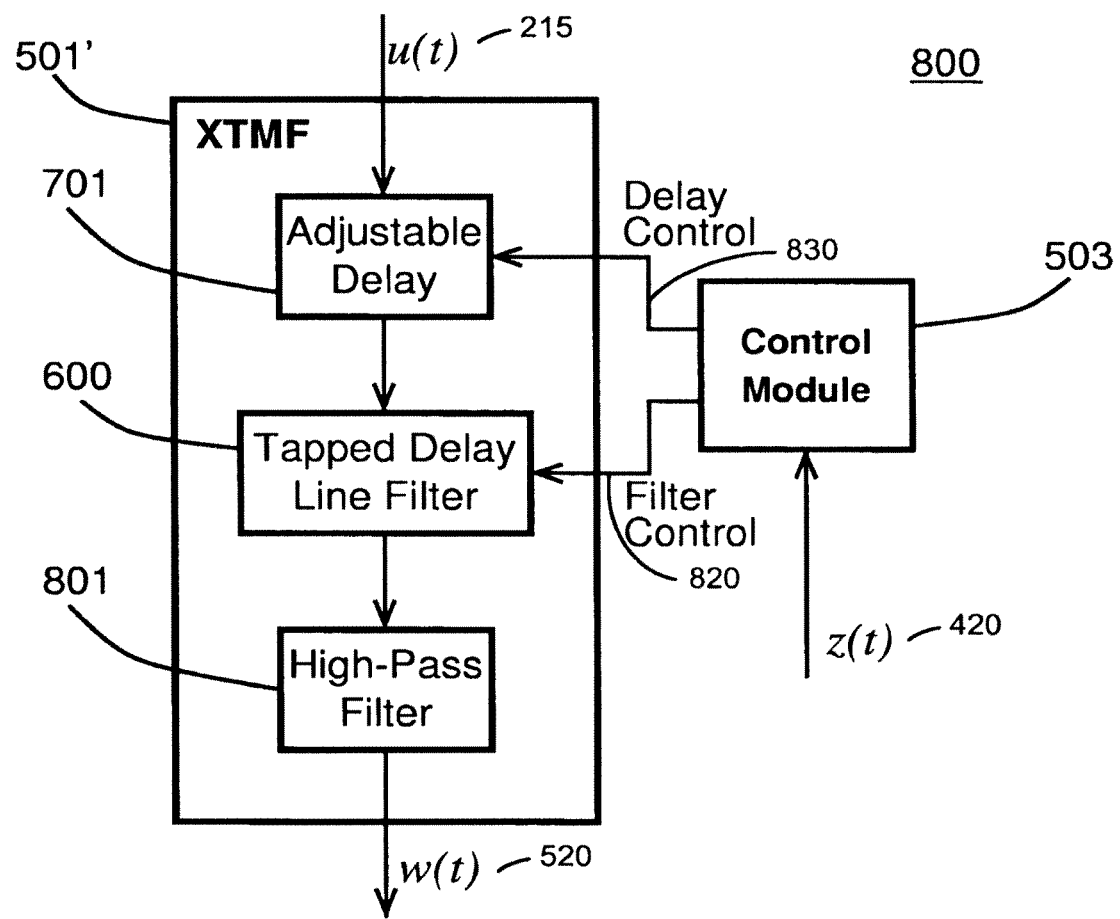
FIG. 8 is a functional block diagram of a crosstalk modeling filter of a crosstalk cancellation device with a high-pass filter according to an exemplary embodiment of the present invention.

Turning now to FIG. 8, this figure is a functional block diagram of a crosstalk modeling filter 501' of a crosstalk cancellation device 800 with a high-pass filter 801 according to an exemplary embodiment of the present invention. The high-pass filter 801 is typically a fixed or non-adjustable filter. In the configuration of the exemplary embodiment of the illustrated in FIG. 8, the adjustable delay 701 feeds the tapped delay line filter 600, thus offering advantages, as discussed above in reference to FIG. 7, for certain applications.

Including the optional high-pass filter 801 in the exemplary crosstalk modeling filter 501', as illustrated in FIG. 7, can enhance performance in some applications or operating environments. A high-pass filter 801 is a device that receives a signal having a range of frequency components, attenuates frequency components below a frequency threshold, and transmits frequency components above the frequency threshold.

While tapped delay line filters 600 have a flexible modeling response over the frequency range $$1/(N\delta)<f<1/(2\delta),$$

they are often less flexible at lower frequencies such as $f<1/(N\delta)$ (frequencies less than the reciprocal of two times delta).

Thus, accurately modeling low-frequencies characteristics of the crosstalk response 210 may require a large number N of filter taps that increase filter complexity or may require a longer delay increment δ (delta) that reduces high-frequency flexibility. In many applications, it is preferable to avoid such trade-offs. As discussed above with reference to FIG. 3, for electrical systems, low-frequency crosstalk characteristics are usually dominated by capacitive coupling effects and can consequently be accurately modeled with a high-pass filter such as a simple first-order resistor-capacitor ("RC") high-pass filter. That is, inserting the high-pass filter 801 into the crosstalk modeling filter 801 can provide a high level of performance without requiring a cumbersome or expensive number of tap filters in the tapped delay line filter 600.

Similar to the exemplary embodiment of the crosstalk modeling filter 501 depicted in FIG. 7, the ordering of the tapped delay line filter 600, the adjustable delay 701, and high-pass filter 801 can be permuted to support various arrangements. That is, the present invention supports arranging physical components corresponding to each of the functional blocks 701, 600, 801 illustrated in FIG. 8 in any parallel or series configuration that provides acceptable performance for an intended application. Nevertheless, certain configurations or ordering may provide certain advantages or tradeoffs for select application situations as compared to other configurations.

The exemplary inline configuration illustrated in FIG. 8 places the adjustable delay 701 on the input side of the tapped delay line filter 600 and the high-pass filter 801 on the output side of the tapped delay line filter 600. With this ordering, the implementation of the adjustable delay 701 can be simplified by exploiting the discrete-amplitude nature of both its input and output signal. The tapped delay line filter 600 can also exploit, via digital delay elements, the discrete-amplitude input provided from the adjustable delay 701. In its RC implementation, the high-pass filter 801 is an analog device that does not receive benefit from providing it with a discrete amplitude input. Thus, there is typically no drawback to placing the high-pass filter 801 at the output side of the crosstalk modeling filter 501' or in another position.

As discussed above with reference to FIG. 5, the control module 503 takes as input the crosstalk compensated signal z(t) 420 and outputs control signals 820, 830 to adjust the crosstalk response model 501. The control module's outputs 820, 830 to the crosstalk modeling filter 501 comprises: (i) a "delay control" signal 830 to control the time delay implemented by the adjustable delay component 701; and (ii) a set of "filter control" signals 820 to control the gains on the variable coefficient amplifiers 602a-d in the tapped delay line filter 600. That is, the controller 503 outputs modeling parameters to the tapped delay line filter 600 and timing parameters to the adjustable delay 701.

These output control values are determined based on observation, processing, and/or analysis of the compensated signal z(t) 420. U.S. Nonprovisional patent application Ser. No. 10/108,598, entitled "Method and System for Decoding Multilevel Signals" and filed on Mar. 28, 2002, discloses a viable exemplary system and method for assessing signal fidelity. Commonly owned U.S. Nonprovisional patent application Ser. No. 10/620,477, entitled "Adaptive Noise Filtering and Equalization for Optimal High Speed Multilevel Signal Decoding" and filed on Jul. 15, 2003, discloses a viable exemplary system and method for controlling device parameters of the crosstalk modeling filter 501. The disclosures of U.S. patent application Ser. No. 10/108,598 and U.S. patent application Ser. No. 10/620,477 are hereby fully incorporated by reference. One or more of the crosstalk model 501, the tapped delay line filter 600, and the adjustable delay 701 can each be controlled and/or adjusted using a method and/or system disclosed in U.S. patent application Ser. Number 10/108,598 or U.S. patent application Ser. No. 10/620,477. The temporal delay adjustment of the adjustable delay 701 can be determined by treating the delay control as a variable that is swept through its entire range of potential values following the disclosure of these patent applications, for example.

Figure 9:
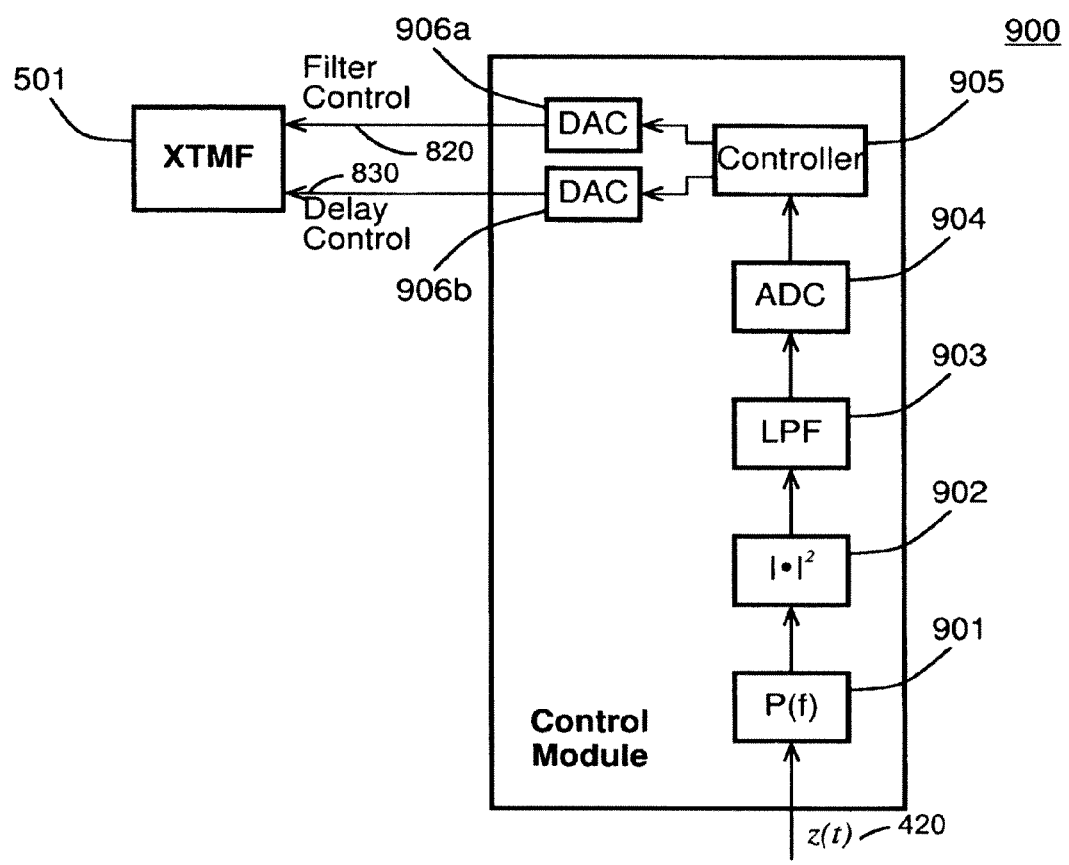
FIG. 9 is a functional block diagram of a control module of a crosstalk cancellation device according to an exemplary embodiment of the present invention.

Turning now to FIG. 9, this figure illustrates an exemplary system 900 for controlling a crosstalk model 501 such as the exemplary crosstalk modeling filter 501' illustrated in FIG. 8 or the exemplary crosstalk modeling filter 501 illustrated in FIG. 7 and their associated adjustable delays 701. More specifically, FIG. 9 is a functional block diagram of a control module 900 of a crosstalk cancellation device 401 according to an exemplary embodiment of the present invention. The exemplary controller 900 illustrated in FIG. 9 facilitates relatively simple theoretical analysis and implementation and, in that regard, can offer benefit to certain application over the control methods and systems disclosed in U.S. patent application Ser. No. 10/620,477 and U.S. patent application Ser. No. 10/108,598 that are discussed above.

The controller 900 of FIG. 9 includes a filter 901, having a frequency transfer response P(f), that receives the crosstalk-cancelled signal z(t) 420 destined for reception by the victim receiver 105b. Filter 901 can be a spectral weighting filter based on this frequency transfer response. The output of this filter 901 couples to a power detecting or signal squaring device 902, which provides an output to a low-pass filter 903. A low-pass filter 903 is a device that receives a signal having a range of frequency components, attenuates frequency components above a frequency threshold, and transmits frequency components below the frequency threshold.

An analog-to-digital converter ("ADC") receives the low-pass filter's output and generates a corresponding digital signal which feeds into the digital controller 905. The digital controller 905 in turn generates digital control signals for each of the adjustable delay 701 and the tapped delay line filter 600. Respective digital-to-analog converters ("DACs") 906a, 906b convert these signals into the analog domain for respective transmission over a delay control line 830 and a filter control line 820. The analog delay control signal adjusts the adjustable delay 701, while the analog filter control signal adjusts the tapped delay line filter 600.

It will be useful to discuss a simple operational example in which crosstalk is imposed on a channel that is in a temporary condition of not carrying data. More specifically, consider a case in which the victim transmitter 104a does not transmit any data while the aggressing transmitter 104b is sending data with a broad spectral content or range of signal frequencies, such as pseudo-random or coded pseudo-random data. That is, referring briefly back to FIG. 5, the signal x(t) 214 is essentially zero, while u(t) 215 is a digital data signal having broad analog spectral content resulting from randomly varying digital data patterns. In this case, the signal y(t) 260 is simply the incurred aggressor n(t) 230, and the signal w(t) 520 is the modeled aggressor. Thus, the signal z(t) 420 is actually the modeling error of the cancellation device. In the theoretical and ideal situation of perfect crosstalk cancellation, z(t) 420 is zero.

In other words, transmitting an essentially uniform voltage on the victim channel 130 while transmitting signals having a broad range of frequencies on the aggressor channel 120 provides essentially pure crosstalk on the victim channel 130 and n(t) 230 equals y(t) 260. If the crosstalk canceller 401 outputs a cancellation signal w(t) 520 also equaling the pure crosstalk signal n(t) 230, z(t) 420 will have essentially no signal energy. Thus, in this state, signal energy in z(t) 420 is indicative of modeling or delay inaccuracies in the crosstalk modeling filter 501.

The control module 900 can implement this state of transmitting a defined signal on the aggressor channel 120 and transmitting a constant voltage or essentially no data signal on the victim channel 130. The control module 900 can then adjust the adjustable parameters of the crosstalk modeling filter 501' to minimize the signal z(t) 420 received by the victim receiver 105b, thereby providing a crosstalk cancellation signal w(t) 520 that matches the actual crosstalk signal n(t) 230 and further providing a modeled crosstalk response G(f) 501 that effectively matches the actual crosstalk response H(f) 210. More generally, the control module 900 cause transmission of defined or known signal patterns on the aggressor channel 120, the victim channel 130, or both the aggressor channel 120 and the victim channel 130 to characterize the crosstalk effect 151 and to control, optimize, or adjust crosstalk cancellation or another form of crosstalk compensation. Further, the control module 900 can have a learning or adaptive mode in the form of a setup mode or a self-configuration procedure and can implement automatic or self calibration.

Referring to FIG. 9 and generalizing beyond the example of imposing crosstalk on a channel void of data, this error signal z(t) 420 can be spectrally weighted with an optional filter 901, whose response is denoted as P(f), to emphasize any higher importance of certain frequencies over others. For example, it may be desired to high-pass filter the error signal z(t) 420 to emulate the effect of equalization in the victim receiver 105b. The (potentially spectral weighted) error signal z(t) 420 is then squared or power-detected, i.e. the output of the squaring device 902 is the signal power. The power signal is then passed through a low-pass filter 903 (or integrator) with a relatively low cutoff-frequency to obtain the integrated power, i.e. energy, of the error signal z(t) 420. Thus, the signal at this point corresponds to an analog estimate of the statistical variance (i.e. the square of the standard deviation) of the error signal z(t) 420.

As familiar to those skilled in the art, the error variance is a useful metric for gauging fidelity. Because the cutoff frequency of the low-pass filter 903 is at a very low frequency (typical orders of magnitude below the symbol transmission rate), the variance signal is nearly a constant after the transient effects of any modeling filter changes decay away. Thus, the analog variance signal can be sampled with a simple low-speed high-resolution analog-to-digital converter 904. The digitized signal output by the analog-to-digital converter 904 provides the error variance information to a simple microprocessor, state machine, finite state machine, digital controller, or similar device (referred to herein as a "digital controller") 905. After recording the error-variance for the current set of response modeling parameters, the digital controller 905 may then specify a new filter configuration by digitally outputting the new parameters to a set of DACs 906 which provide the corresponding analog signal to the aggressor emulation module 501.

As the digital controller 905 is able to both (i) set the parameters of the crosstalk modeling filter 501 and (ii) directly observe the effect of the current parameters on the modeling error variance, the digital controller 905 can find a parameter set that maximizes the fit of the aggressor response model 501 to the actual response 210. Because trial-and-error processing is not overly complicated, all combinations of model parameters can be tested in many instances. However, other empirical search/optimization methodologies known to those skilled in the art may be alternatively employed. In one exemplary embodiment of the present invention, a coordinate-descent approach, as described in U.S. patent application Ser. No. 10/620,477, discussed above, provides search and optimization to identify acceptable model parameters.

As discussed above, the control module 900 can comprise a combination of analog and digital circuitry to provide a practical control implementation. Filter 901 and power detecting device 902 collectively input and output a high-speed analog signal. The low-pass filter 903 takes as input a high-speed analog signal and outputs a low-speed analog signal. Filter 901, power detecting device 902, and low-pass filter 903 collectively take a projection of a high-speed signal onto a low-speed signal by extracting the relevant statistical information from the high-speed signal and presenting it in a more concise form. The ADC 904 takes this low-speed analog signal as an input and outputs a corresponding digitized approximation. Consequently, the controller 905 receives and processes this low-speed digital signal. Because the digital signal is low-speed, the associated processing circuitry is less complex than would be required if the signal was high-speed. The digital controller 905 outputs low-speed digital control signals to the digital-to-analog converters 906a, 906b which in turn output low-speed analog signals. As a result of tandem simple high-speed analog preprocessing and low-speed digital processing, the control module 900 provides signal analysis based on a powerful statistical characterization and implements a robust control methodology with relatively little circuit complexity, which are factors that can facilitate practical crosstalk cancellation in high-speed communications systems.

While the illustration in FIG. 9 employs a power-detecting (or signal squaring) device 902 to generate the error-variance, a full-wave-rectifier (which takes the absolute value of the signal) may be used as an alternative. For an implementation based on a full-wave-rectifier, the output of the low-pass filter 903 will now no longer correspond to error variance, but will nevertheless represent a valid fidelity criterion. In particular, it is the 1-norm of the error signal 420, and thus the fidelity metric still has suitable mathematical properties. Those skilled in the art appreciate that determining the "1-norm" of a signal typically comprises integrating the absolute value of the control signal. This substitution may be advantageous for certain applications because: (i) the 1-norm signal may have a reduced dynamic range (thus relaxing resolution constraints on the analog-to-digital converter 904); and (ii) full-wave-rectifiers may be easier to implement than power-detectors. Such modifications are considered within the scope of the present invention.

Similarly, the power detector 902 may also be replaced with a half-wave-rectifier or any like device that is used to assess signal magnitude. It will also be appreciated by those skilled in the art that the division of the crosstalk canceller 401 into functional blocks, modules, and respective sub-modules as illustrated in FIGS. 5 through 9 are conceptual and do not necessarily indicate hard boundaries of functionality or physical groupings of components. Rather, representation of the exemplary embodiments as illustrations based on functional block diagrams facilitates describing an exemplary embodiment of the present invention. In practice, these modules may be combined, divided, and otherwise repartitioned into other modules without deviating from the scope of the present invention.

In one exemplary embodiment of the present invention, a crosstalk cancellation system is a single integrated circuit ("IC"), such as a monolithic IC. Each of a crosstalk cancellation device, a control module, and a crosstalk modeling filter can also be single ICs. Such ICs can be complementary metal oxide semiconductor ("CMOS") ICs and can be fabricated in a 0.18 micron process, for example.

A process for canceling crosstalk and a process for calibrating a crosstalk canceller will now be described with respective reference to FIG. 10 and FIG. 11. Certain steps in the processes described herein must naturally precede others for the present invention to function as described. However, the present invention is not limited to the order of the steps described if such order or sequence does not alter the functionality of the present invention. That is, it is recognized that some steps may be performed before or after other steps or in parallel with other steps without departing from the scope and spirit of the present invention.

Figure 10:
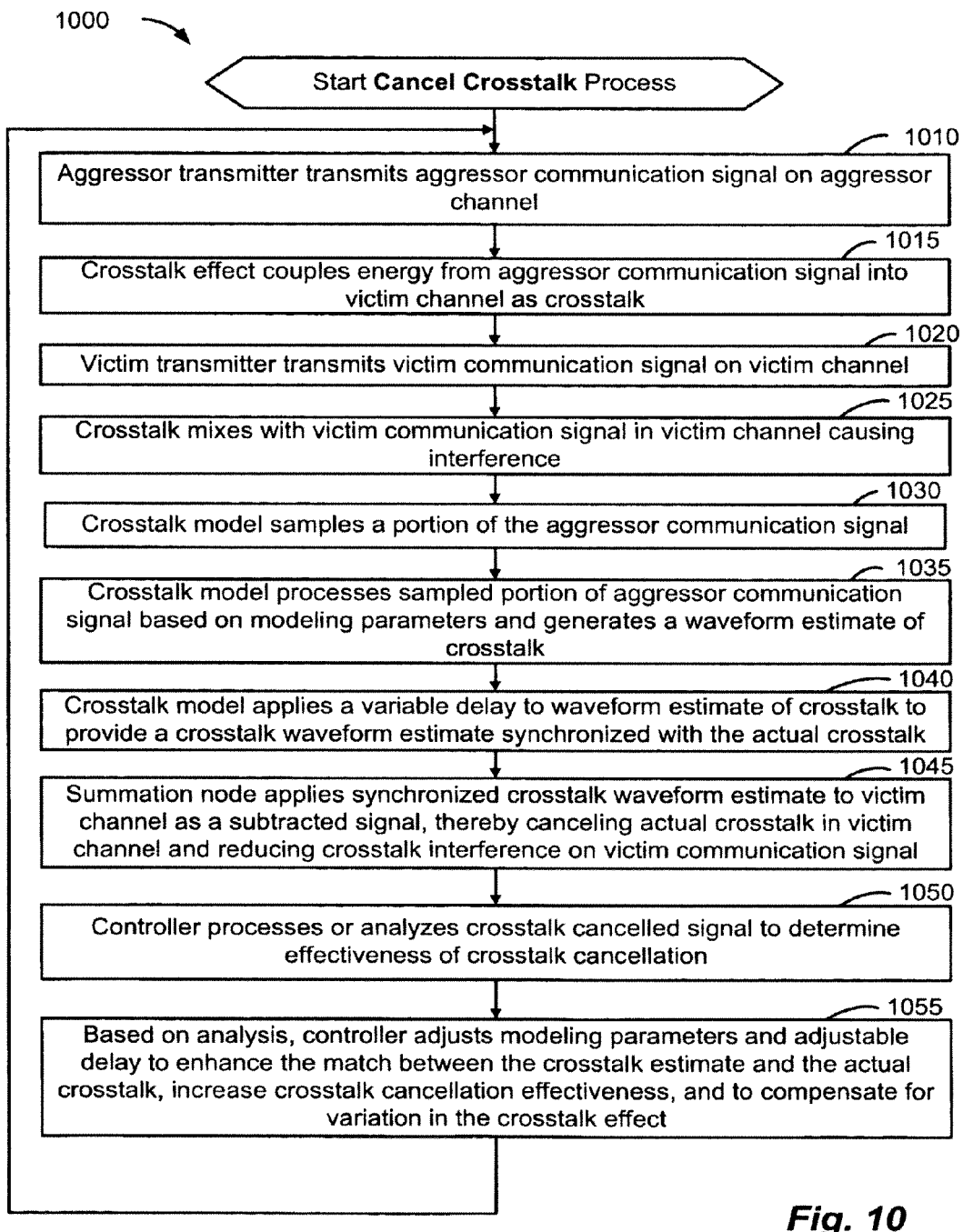
FIG. 10 is a flow chart illustrating a process for canceling crosstalk according to an exemplary embodiment of the present invention.

Turning now to FIG. 10, this figure is a flow chart illustrating Process 1000, entitled Cancel Crosstalk, for canceling crosstalk 151 according to an exemplary embodiment of the present invention. At Step 1010, the first step in Process 1000, the aggressor transmitter 104b transmits an aggressor communication signal u(t) 215 on the aggressor channel 120. This communication signal 215 can be an analog or a digital signal carrying data.

At Step 1015, the crosstalk effect 151 couples energy from the aggressor communication signal u(t) 215 into the victim channel 130 as crosstalk n(t) 230. The coupling mechanism can be electromagnetic coupling, as in the exemplary case of electrical data signals propagating on a backplane 103, or another optical or electrical crosstalk mechanism. The energy transfer of the crosstalk effect 151 generates the crosstalk signal n(t) 215 in the victim channel 130 in a manner that results in signal propagation towards the victim receiver 105b.

At Step 1020, the victim transmitter 104a transmits the victim communication signal x(t) 214 on the victim channel 130. The victim communication signal 214 can be either an analog or a digital signal. At Step 1025, the crosstalk signal n(t) 230 coexists or mixes with the victim communication signal x(t) 214 in the victim channel 130. The composite signal y(t) 260 results from the combination of these signals 214, 230.

At Step 1030, the crosstalk model 501 acquires a sample of the aggressor communication signal u(t) 215. In other words, a tap or other node directs a representative portion of the aggressor communication signal 215 to the crosstalk canceller 401 for reception and processing by the crosstalk model 501.

At Step 1035, the crosstalk model 501 processes the sampled portion of the aggressor communication signal u(t) 215 via the tapped delay line filter 600. Modeling parameters, such as the gain or scaling constants of the tapped delay line filter 600, provide the basis for generating a waveform estimate v(t) 620 of the crosstalk signal n(t) 215. More specifically, the coefficients $\alpha_0, \alpha_1, \alpha_2 \ldots \alpha_n$ (alpha$_0$, alpha$_1$, alpha$_2 \ldots$ alpha$_n$) of the variable coefficient amplifiers 602a, 602b, 602c, 602d in the tapped delay line filter define a waveform v(t) 620 approximating the crosstalk signal 215.

In one exemplary embodiment, the finite impulse response ("FIR") filter 1560 illustrated in FIG. 15 and discussed below generates the waveform estimate of the crosstalk at Step 1035. Thus, the system 1510 can perform or be involved with one or more of the steps of Process 1000.

At Step 1040, the adjustable delay 701 in the crosstalk model 501 applies a time delay to the waveform estimate v(t) 620 to synchronize this waveform 620 with the interfering crosstalk signal n(t) 230 propagating in the victim channel 130. At Step 1045, the summation node 502 of the crosstalk canceller 401 applies the resulting crosstalk cancellation signal w(t) 520 to the victim channel 130 and the combined crosstalk and communication signal y(t) 260 propagating therein. The crosstalk cancellation signal w(t) 520 cancels at least a portion of the crosstalk signal component w(t) 520 propagating in the victim channel 130. Reducing this crosstalk interference 520 improves signal fidelity in the communication signal z(t) 420 that is output by the crosstalk canceller 410 for delivery to the victim receiver 105b.

Figure 15:
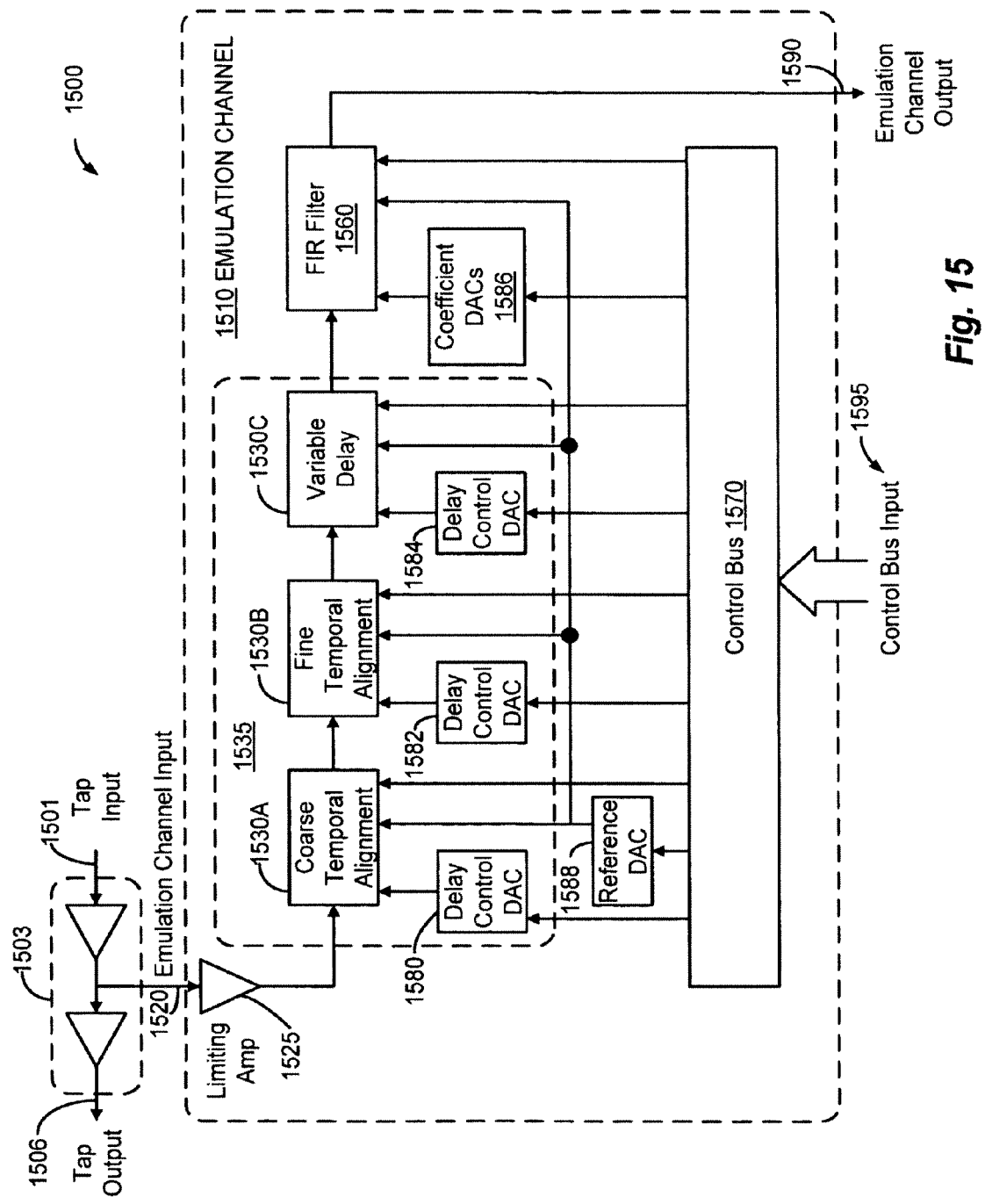
FIG. 15 is a functional block diagram of a circuit for emulating, simulating, or modeling signals, signal effects, or signal transformations according to an exemplary embodiment of the present invention.

In one exemplary embodiment, the temporal alignment module 1535 illustrated in FIG. 15 applies the variable delay of Step 1040. Thus, in one exemplary embodiment of Process 1000, the system 1510 provides a crosstalk estimate for crosstalk cancellation.

At Step 1050, the controller 503 processes or analyzes the crosstalk compensated signal z(t) 420 to determine effectiveness of crosstalk cancellation. In other words, the controller 503 assesses signal fidelity to determine if the crosstalk canceller is applying a crosstalk cancellation signal w(t) 520 that accurately matches the actual crosstalk n(t) 230, both in waveform and in timing.

At Step 1055, the controller 503 adjusts the modeling parameters, specifically the coefficients of the variable coefficient amplifiers 602a, 602b, 602c, 602d in the tapped delay line filter 600, to optimize the waveform match between the crosstalk cancellation signal w(t) 520 and the actual crosstalk signal n(t) 230. The controller 503 further adjust the variable or adjustable time delay of the adjustable delay 701 to synchronize the crosstalk cancellation signal w(t) 520 with the actual crosstalk signal n(t) 230. That is, the controller 503 adjusts the operation of the crosstalk canceller 401 by implementing parameter adjustments to the crosstalk modeling filter 501 to enhance the fidelity of the net communication signal z(t) 420 delivered to the victim receiver 105b.

Following Step 1055, Process 1000 iterates Steps 1010-1055. The crosstalk canceller 401 continues canceling crosstalk 230 and implementing adaptive responses to dynamic conditions, thereby providing an ongoing high level of communication signal fidelity.

Figure 11:
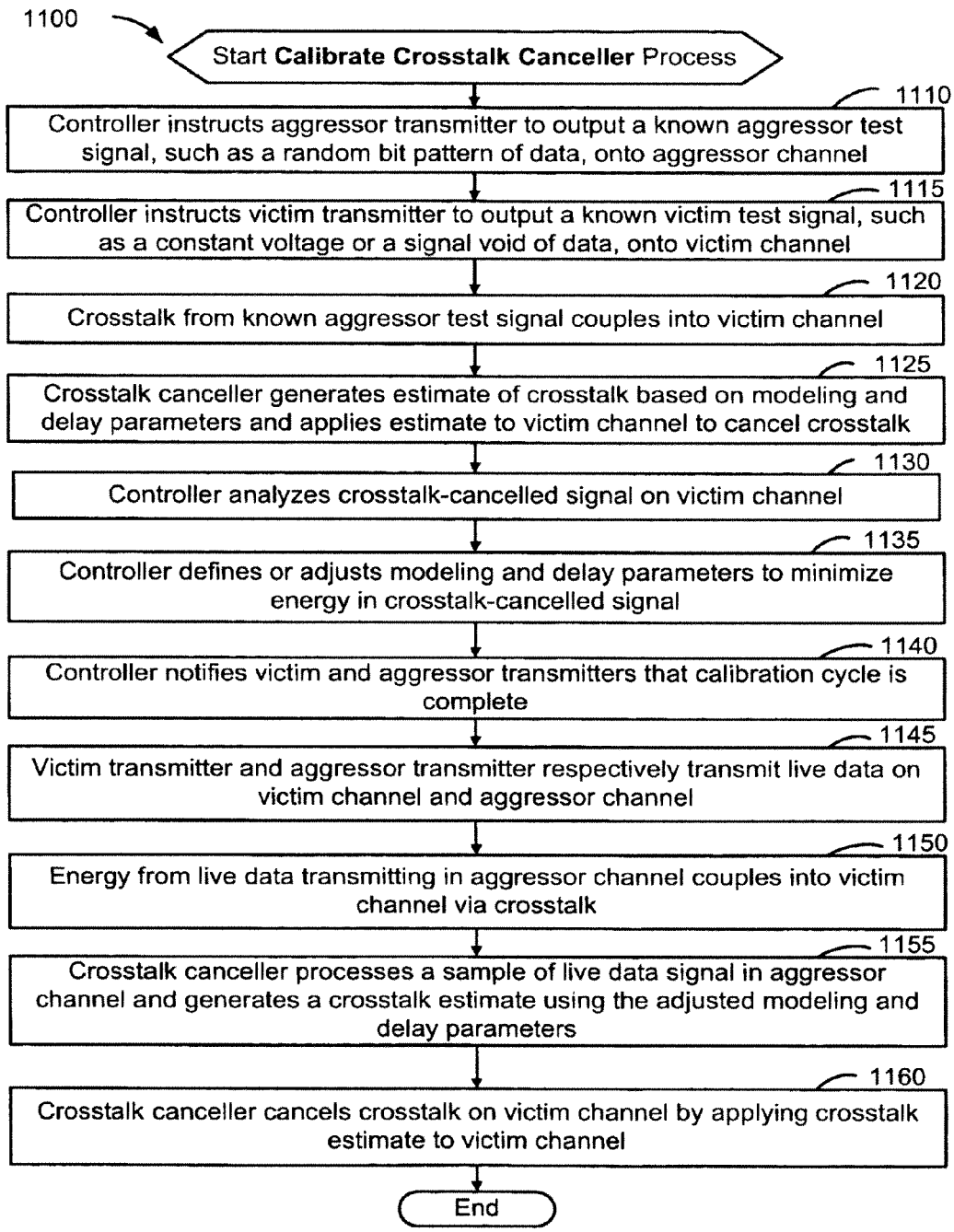
FIG. 11 is a flow chart illustrating a process for calibrating a crosstalk cancellation device according to an exemplary embodiment of the present invention.

Turning now to FIG. 11, this figure is a flow chart illustrating Process 1100, entitled Calibrate Crosstalk Canceller, for calibrating a crosstalk cancellation device 401 according to an exemplary embodiment of the present invention. At Step 1110, the first step in Process 1100, the controller 503 initiates a calibration sequence. The controller 900 instructs the aggressor transmitter 104b to output a signal having a known or defined test pattern, for example a random or pseudo random bit pattern of data, onto the aggressor channel 120. This test or calibration signal can have the format of an aggressor communication signal u(t) 215 or can be uniquely formatted for characterizing the crosstalk response H(f) 210. That is, the controller 900 can control transmission of signals having predetermined voltage patterns on the aggressor channel 120.

At Step 1115, the controller 900 instructs the victim transmitter 104b to output a known victim test or reference signal onto the victim channel 130. The test signal can be a predetermined communication signal or simply a constant voltage, null of data. Sending a known test signal on the victim channel 130 facilitates isolating the crosstalk response H(f) 210 from other effects that may generate signal distortion on the victim channel 130. That is, the controller 900 can control transmission of signals having predetermined voltage patterns on the victim channel 130.

At Step 1120, crosstalk n(t) 230 from the known aggressor signal u(t) 215 couples into the victim channel 130. With the victim channel 130 carrying a constant voltage as the victim signal x(t) 214, the composite communication and crosstalk signal y(t) 260 on the victim channel 130 is essentially the crosstalk signal n(t) 230.

At Step 1125, the crosstalk canceller 401 generates an estimate w(t) 520 of the crosstalk signal n(t) 230 for crosstalk cancellation. The crosstalk canceller 401 generates this estimate 520 using modeling and delay parameters that result in a waveform and timing match between the crosstalk signal n(t) 230 and the crosstalk cancellation signal w(t) 520. The crosstalk compensator 401 applies the crosstalk estimate 520 to the victim channel 130 and cancels at least a portion of the crosstalk 230 propagating thereon. The resulting crosstalk-cancelled signal z(t) 420 propagates to the victim receiver 105*b*.

At Step 1130, the controller 503 processes and analyzes the crosstalk-cancelled signal z(t) 420 output by the crosstalk canceller 401. Based on the analysis, the controller 503 adjusts the modeling and delay parameters to minimize the energy in the crosstalk cancelled signal z(t) 420. That is, the controller 503 varies the operational parameters of the crosstalk canceller 401 towards reducing the residual crosstalk. This control action matches the crosstalk compensation signal w(t) 520 with the actual crosstalk n(t) 230 imposed on the victim channel 130.

At Step 1140, the controller 503 completes the calibration cycle and provides notification to the aggressor and victim transmitters 104*a*, 104*b* that the crosstalk canceller 401 is set to process live data. In response to this notification, at Step 1145 the victim transmitter 104*a* and the aggressor transmitter 104*b* each transmit live data on their respective channels 130, 120.

At Step 1150, crosstalk 230 from live data 215 transmitting on the aggressor channel 120 couples into the victim channel 130. At Step 1155, the crosstalk canceller 401 processes a sample of the live data 215 transmitting in the aggressor channel 120 and generates an emulation or estimate 520 of the crosstalk 230 using the modeling and delay parameters defined or updated during calibration.

At Step 1160, the crosstalk canceller 401 applies the crosstalk estimate 520 to the victim channel 130 for crosstalk cancellation and presents the victim receiver 105 with a high-fidelity signal. Process 1100 ends following Step 1160. The controller 503 can repeat the calibration procedure at defined or regular time intervals or when the controller's monitoring capability determines that signal fidelity is impaired or as fallen below a threshold.

Figure 12A:
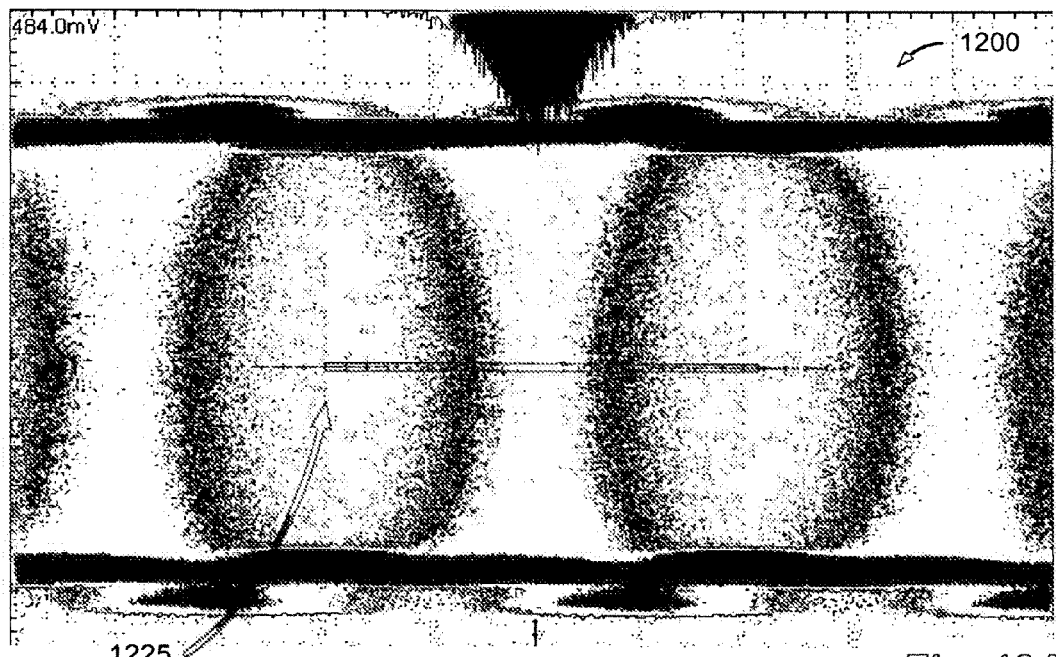
FIGS. 12A and 12B, collectively FIG. 12, respectively illustrate testing data of a communication system before and after implementing crosstalk cancellation according to an exemplary embodiment of the present invention.
Figure 12B:

Turning now to FIGS. 12A and 12B, these figures respectively illustrate testing data of a communication system before and after implementing crosstalk cancellation according to an exemplary embodiment of the present invention. These figures present eye diagrams 1200, 1250 of measured data captured under laboratory conditions. As is well known to those skilled in the art, eye diagrams 1200, 1250 provide a visual indication of signal quality. The level of openness of an "eye" 1225, 1275 in an eye diagram 1200, 1250 correlates with the level of signal quality. That is, a noisy, distorted, or closed eye in an eye diagram typically indicates signal impairment.

FIG. 12A is an eye diagram 1200 from a 5 Gigabits per second binary communication system operating under laboratory conditions believed to be representative of field conditions. The victim signal 130 has an amplitude of 800 millivolts, while the aggressor signal 120 has an amplitude of 1,200 millivolts. FIG. 12A illustrates the eye diagram 1200 of the received signal 260 after equalization and limiting amplification but without crosstalk compensation. FIG. 12B illustrates the eye diagram 1250 of the received signal 420 after application of crosstalk cancellation in accordance with an exemplary embodiment of the present invention followed by equalization and limiting amplification. As with the eye diagram of FIG. 12A, the victim signal 130 has an amplitude of 800 millivolts, while the aggressor signal 120 has an amplitude of 1,200 millivolts.

Because the signal path includes a limiting amplifier in both the crosstalk-corrected eye diagram 1250 and the eye diagram 1200 without crosstalk compensation, the thicknesses of the horizontal "eye-lids" at the top and bottom of each eye diagram 1200, 1250 do not provide a useful gauge of signal quality. Rather the signal performance enhancement provided by crosstalk cancellation is evident from the wide open eye 1275 in the crosstalk-corrected eye diagram 1250 relative to the narrow, noisy eye 1225 of the eye diagram 1225 without crosstalk correction.

To further characterize communication performance improvement achieved by crosstalk cancellation in accordance with an exemplary embodiment of the present invention, bit error rate measurements were acquired from this test system under the same test conditions, before and after crosstalk cancellation. Without crosstalk cancellation, the communication system exhibited an average of one bit error for every 100,000 bits transmitted. With crosstalk cancellation, the communication system exhibited an average of one bit error for every 100,000,000,000,000 bits transmitted.

In summary, an exemplary crosstalk cancellation system as been described with reference to FIGS. 1-12. The crosstalk cancellation system can sample an aggressor signal and can emulate the delay and response of the crosstalk coupling, which often occurs at connectors. This emulated aggressor response can be subtracted from the receive victim signal to produce the corrected victim signal, thereby reducing the level of crosstalk interference and achieving improved jitter and lower bit error rates. In order to provide robust results, the model of the crosstalk effect (the emulated channel response) can be electronically programmable and adaptable to match, and thus remove or cancel, the crosstalk.

The creation of a programmable emulation/modeling channel response at multi-gigabit rates can be less than optimal using standard digital signal processing ("DSP") techniques. Traditional DSP techniques may lack sufficient speed or consume considerable power. Accordingly, a crosstalk cancellation system can comprise a programmable emulation channel or a model that offers performance advantages over conventional DSP processing, for example via analog signal processing, mixed signal processing, or a hybrid approach. Such a high-speed programmable emulation channel can process signals in the analog domain, via analog signal processing, and/or at processing rates that support multi-gigabit data transmission rates, for example.

In other words, analog signal processing (or a hybrid combination of analog and digital signal processing) can provide performance benefits over crosstalk cancellation implemented in an entirely digital environment. As discussed above, in a digital implementation, the accessible aggressing data signals and received victim signals may be digitized (beyond any inherent digitization of the aggressor signal), and a microprocessor can implement the cancellation processes. The analog-to-digital converters and microprocessors typically associated with digital crosstalk cancellation in a high-speed environment can have drawbacks relevant to some applications, such as complexity, cost, or power consumption.

Beyond supporting crosstalk cancellation, a high-speed device that can model, simulate, estimate, or emulate signals, signal transformation, and signal effects can have a wide range of applications. To name a few applications, such a device can be used for generating arbitrary waveforms, for equalization, or as a broad-use FIR filter. Thus, a compact or integrated circuit that emulates signals or signal effects can be used as a high-speed arbitrary waveform generator (for example in test equipment or in a communication device), as a pulse-shaping filter, as an equalizer, etc.

An exemplary high-speed emulation circuit or channel will be described in further detail below with reference to FIGS. 13-30 in the context of a crosstalk cancellation application. However, that crosstalk application is but one example of many potential applications, is provided for illustrative purposes rather, and is not intended to be restrictive. Accordingly, an emulation circuit or channel according to the disclosure set forth herein can have numerous communication or signal processing applications and uses.

For example, a capability to pulse-shape and/or filter a multi-gigabit signal could be beneficially used in test equipment, to create a very high-speed function generator, or for testing integrated circuits or other communications hardware. As another example, emulating the pre-emphasis, de-emphasis, or equalizer response of a transmitted signal could support accurately characterizing receiver performance. Likewise, an emulation circuit or channel could emulate potential interferers to ascertain receiver performance in the presence of interferers.

The term "emulation circuit" or "emulation channel," as used herein, generally refers to a system that models, simulates, estimates, emulates, represents, describes, or reproduces a signal, a signal transformation, or an effect on a signal. An emulation circuit or an emulation channel can create a simulated crosstalk signal via processing a signal that causes crosstalk. An emulation circuit or channel might receive a signal of short duration, such as a pulse, and transform that received signal into a waveform having a shape or duration that is specified or that is selected.

Turning now to discuss FIGS. 13-28, FIG. 13 illustrates a functional block diagram of an exemplary signal delay device 1300 based on a tapped delay line filter 600 in accordance with an embodiment of the present invention. As discussed above with reference to FIG. 6, a tapped delay line filter 600 can process an input signal to produce an output signal 1305 having a desired shape. As illustrated, the tapped delay line filter 600 operates on a digitized version of the input signal 1310 via DSP.

Figure 13:
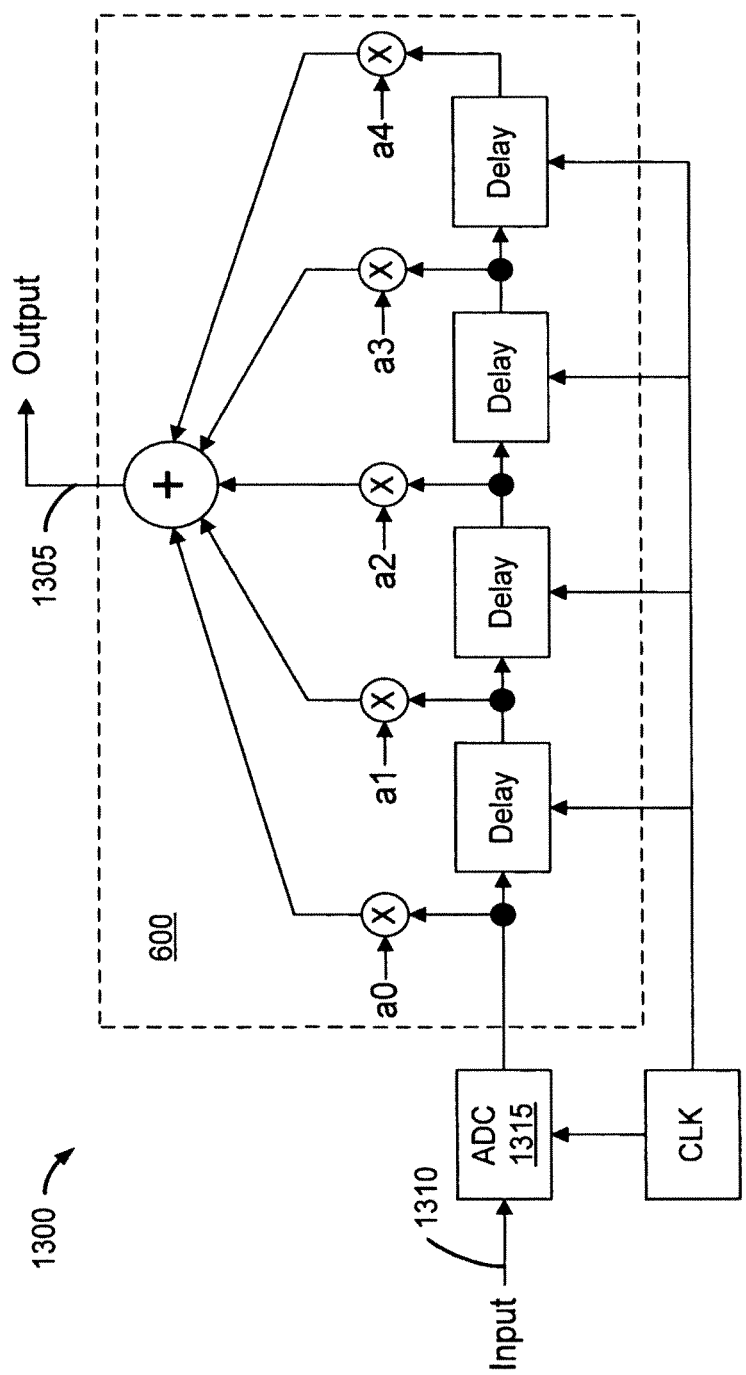
FIG. 13 is a functional block diagram of a signal delay device based on a tapped delay line filter according to an exemplary embodiment of the present invention.

Accordingly, the system 1300 of FIG. 13 can represent a DSP implementation of an FIR filter. In such a DSP implementation, the input signal is quantized using an analog-to-digital converter (ADC) 1315, and is delayed using clocked registers. Mathematical processing performs the multiplication and addition functions associated with implementing the FIR filter 600 from the delayed samples. If the input signal is a digital communication signal, the ADC 1315 digitizes that input signal to a greater number of digital levels than were originally present for conveying information digitally.

While adequate in many situations, the system 1300 may provide a level of speed that is slower than may be desirable for other situations involving multigigabit signal processing. If the input signal 1310 is modulated to convey a high data rate, the ADC 1315 typically should sample faster than the data rate and should have sufficient resolution to provide meaningful data. Such sampling rates and resolutions may be challenging when the data rate of the input 1310 is in the multigigabit range. In addition, the mathematical operations of the tapped delay line filter 600 may lack practicability for multigigabit signals.

As will be discussed in further detail below, for very high speed signals, an implementation based on analog signal processing can often outperform the DSP-based implementation of FIG. 13 with regard to speed and power consumption. That is, while the system 1300 can be a component of an emulation circuit or a crosstalk cancellation system, other embodiments that offer generally improved performance for many applications will be discussed below.

Figure 14:
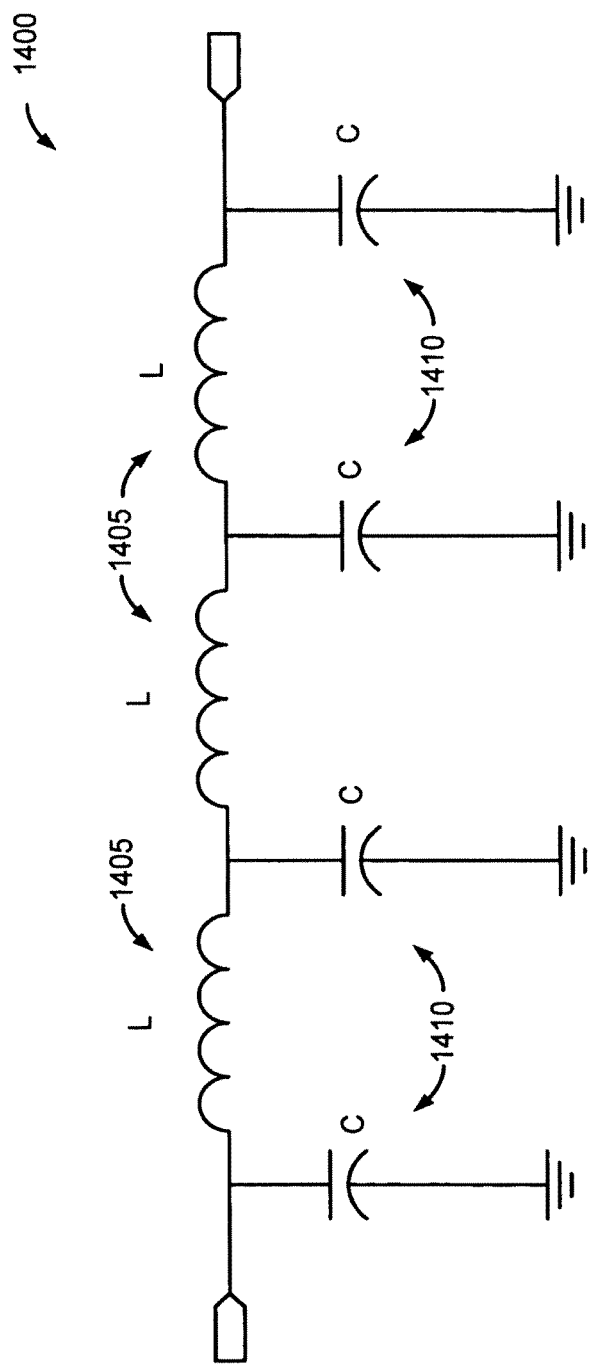
FIG. 14 is a schematic of a passive circuit that simulates a transmission line according to an exemplary embodiment of the present invention.

Turning now to FIG. 14, this figure illustrates a schematic of an exemplary passive circuit 1400 that simulates a transmission line in accordance with an embodiment of the present invention. More specifically, FIG. 14 shows a section 1400 of synthetic transmission line. A purely analog FIR filter can be implemented using a transmission line and/or such a synthetic transmission line 1400 as a delay element. In a synthetic transmission line 1400, lumped inductors 1405 and capacitors 1410 emulate an ordinary transmission line with characteristic impedance Zo. The following equation describes the characteristic impedance:

$$Zo=(L/C)^{1/2}$$

The synthetic transmission line 1400 may occupy less space than an ordinary transmission line. However, as illustrated, the delays are fixed and lack adjustability. The high-frequency losses of integrated transmission lines and synthetic transmission lines 1400 can be substantial at high frequencies, thereby resulting in signal degradation, i.e. an undesired transformation of the signal, thus reducing signal quality. Another issue with this implantation is the relatively large amount of physical space that the delay and filter may occupy.

Accordingly, while the system 1400 can be a component of an emulation circuit or a crosstalk cancellation system, embodiments that offer generally improved performance for many applications will be discussed below.

Turning now to FIG. 15, this figure illustrates a functional block diagram of an exemplary circuit 1500/1510 for emulating, simulating, or modeling signals, signal effects, or signal transformations in accordance with an embodiment of the present invention. The illustrated system 1510, which can be characterized as an emulation channel or an emulation circuit, can be an exemplary embodiment of a crosstalk model 501 or a crosstalk modeling filter 501 as discussed above with reference to FIGS. 1-12. In other words, one exemplary application of the system 1500 and or the system 1510 of FIG. 15 is to model crosstalk in connection with canceling crosstalk occurring in a communication system.

Referring now to FIG. 15, the system 1500 comprises a tap interface 1503, an emulation channel 1510, a control bus 1595, and an emulation output 1590. The input to the emulation channel 1510 is a digital signal from the tap 1503. The tap 1503 intercepts or samples a digital communication signal, typically transmitting over a physical communication medium, and sends a representative thereof to the emulation channel input 1520. The tap 1503 also sends a representative signal to the tap output 1506. Accordingly, the tap input 1501, the tap output 1506, and the emulation channel input 1520 all transmit replicas of the same digital signal.

In other words, the tap 1503 is a device that extracts a sample of a signal that flows through a path or a channel, such as a backplane of a rack-mounted communication system, or some other conductor. As discussed above, the signal that the tap 1503 samples could be an aggressor communication signal that causes crosstalk on a victim communication signal. Alternatively, the sampled signal could be some other communication signal, or even a signal that is useful for some purpose other than communicating information. While typically digital, the aggressor signal in some embodiments might alternatively comprise an analog communication signal or even a single pulse.

The emulation channel 1510 delays and filters the emulation channel input 1520, which carries the sample signal, based on control commands from the control bus input 1595. As discussed above with reference to FIGS. 5, 8 and 9, among other places, a controller or a control module 503, 900, 905 can send control signals over the control bus 1570 to the emulation channel 1510. In other words, the control bus 1570 can comprise the signal connections or paths between the emulation channel 1510 and one of the devices 503, 900, 905 discussed above (or some other system) that generates control signals.

As discussed in further detail below, control signals flowing over the control bus 1570 define signal processing parameters of the emulation channel 1510. Those signal processing parameters specify the transform that the input signal undergoes between the emulation channel input 1520 and the emulation channel output 1590. More specifically, the control signals specify delay and amplitude parameters of the FIR filter 1560 and the temporal alignment module 1535.

A limiting amplifier 1525 buffers the emulation channel input 1520 from the communication channel and allows the channel input amplitude to vary without affecting the operation of the emulation channel 1510. In other words, the limiting amplifier 1525 helps provide isolation between the sampled communication channel and the emulation channel 1510.

The limiting amplifier 1525 feeds a temporal alignment module 1535 that provides a variable level of time delay. The applied delay can time or synchronize the output of the emulation channel 1510 according to a specification. For example, the temporal alignment module 1535 can delay a simulated crosstalk signal so that the simulated crosstalk is temporally aligned with actual crosstalk. So aligned, the simulated crosstalk can cancel the actual crosstalk when one is subtracted from the other, as discussed in more detail above.

The temporal alignment module 1535 comprises a coarse temporal alignment module 1530A, a fine temporal alignment module 1530B, and a variable temporal alignment module 1530C. As discussed in further detail below, the coarse, fine, and variable temporal alignment modules 1530A, 1530B, 1530C can be portions, branches, or sections of an integrated circuit, such as an IC chip. While illustrated as comprising three modules 1530A, 1530B, 1530C, other embodiments may have fewer or more timing components.

The coarse temporal alignment module 1530A provides selectable delay to within a unit interval. The fine temporal alignment module 1530B provides selectable delay below a unit interval, further subdividing the overall adjustable delay. The variable delay module 1530C provides virtually continuous delay adjustment subject to the resolution of the DAC 1584 that controls the variable delay module 1530C. The variable delay module 1530C typically provides a level of delay adjustment that is at least greater than that of the fine delay module 1530B.

The term "unit interval," as used herein, generally refers to a span of time between condition changes of a data transmission signal. Thus, a unit interval could be a minimum time interval between two signal conditions or the period of time that a single bit occupies in the bit stream. For example, a serial line with a baud rate of 2.5 gigabits per second could have a unit interval of 0.4 nanoseconds (1/(2.5 Gb/s)).

The temporal alignment module 1535 feeds the FIR filter 1560 a signal that has been delayed or shifted in time as specified by the control signals transmitting over the control bus 1595. The FIR filter 1560 filters and pulse-shapes the received signal.

In broad terms, an FIR filter is a signal processing device whose response to an impulse signal ultimately settles to zero. Accordingly, FIR filters are typically stable devices that can operate without feedback. An FIR filter can be viewed as a device that produces an output signal based on a weighted average of delayed versions of an input signal.

The signal processing of the FIR filter 1560 may provide a frequency-dependent signal amplitude so that various frequency components of a signal may have different magnitudes. Output signals thus assume a waveform shape based on frequency-dependent gain. That is, the FIR filter 1560 transforms or shapes an input signal into an output signal based on adjustable signal processing parameters, as discussed in further detail below.

The output of the FIR filter 1560 is the desired emulation channel output 1590. The control bus 1570 receives digital signals and controls the temporal alignment module 1535 and the FIR filter 1560 through switches and the DACs 1580, 1582, 1584, 1586, and 1588. As discussed in further detail below with reference to FIG. 22, the DAC module 1586 comprises multiple DACs, one for each FIR tap (or signal processing leg) in the FIR filter 1586.

The temporal alignment module 1535 and the FIR filter 1560 each comprises delay elements that delay the transmitted signal by a prescribed an amount of time. The temporal alignment module 1535 typically comprises very small, electronically-controllable delays, with step sizes on the order of 0.05 unit intervals. Thus, the temporal alignment module 1535 provides delay with a fine level of time resolution.

The fine time resolution of the temporal alignment module 1535 facilitates precisely aligning the emulated crosstalk signal to the actual crosstalk. As discussed above, such precise alignment helps a crosstalk cancellation system achieve a beneficial level of crosstalk compensation. In contrast, improper temporal alignment might inadvertently add noise, instead of desirably decreasing the noise.

The exemplary embodiment of FIG. 15 incorporates differential, adjustable, mixed-signal delays in the temporal alignment module 1535 and the FIR filter 1560, thereby providing high-speed operation, signal fidelity, good performance, and compact size.

The exemplary system 1500 can offer advantages over a DSP-based approach in that quantization of the signals and subsequent processing with mathematical operations can be avoided. As compared to the system 1500, emulating a signal or a signal transformation via digital signal processing may provide slower speed and higher power consumption. In other words, analog signal processing, as provided by the system 1500 and specifically the system 1510 can perform mathematical operations essentially equivalent to the digital counterparts, but using less power and operating at higher speeds.

Moreover, the illustrated embodiment of FIG. 15 offers advantages over a transmission line approach in that the delay modules 1530A, 1530B, 1530C are asynchronous, mixed-signal delays, and accordingly can be constructed without transmission lines or synthetic transmission lines. Whereas fixed transmission line delays typically lack adjustability, the asynchronous, mixed-signal delays of the system 1500 are electronically adjustable.

Further, the asynchronous, mixed-signal delays of the system 1500 can regenerate or actively boost the signal as it propagates through the temporal alignment module 1535 and the FIR filter 1560, between the input port 1520 and the output port 1590. That is, the emulation channel 1510 comprises active delays that can add energy to the processed signal so that the signal remains strong with a robust frequency content.

In contrast, a transmission line approach, as discussed above with reference to FIG. 14, may subject signals to cascaded losses, which may eventually render the signal unusable. At longer delays, losses over a real or a simulated transmission line 1400 can accumulate to an unacceptable level. In addition, losses can be more severe at higher frequencies than at lower frequencies. And, in most crosstalk cancellation circumstances, the high frequency signal components best emulate the crosstalk.

In summary, the system 1510 can be viewed as combining the benefits of an analog implementation with certain advantages of a digital signal processing approach. As such, time delay and the FIR filter response can be controlled via electronic means and can be integrated in a compact form. The exemplary system 1510 further provides benefits related to a transmission-line approach in that the system 1510 can operate at fast speed without consuming an excessive level of power.

Figure 16:
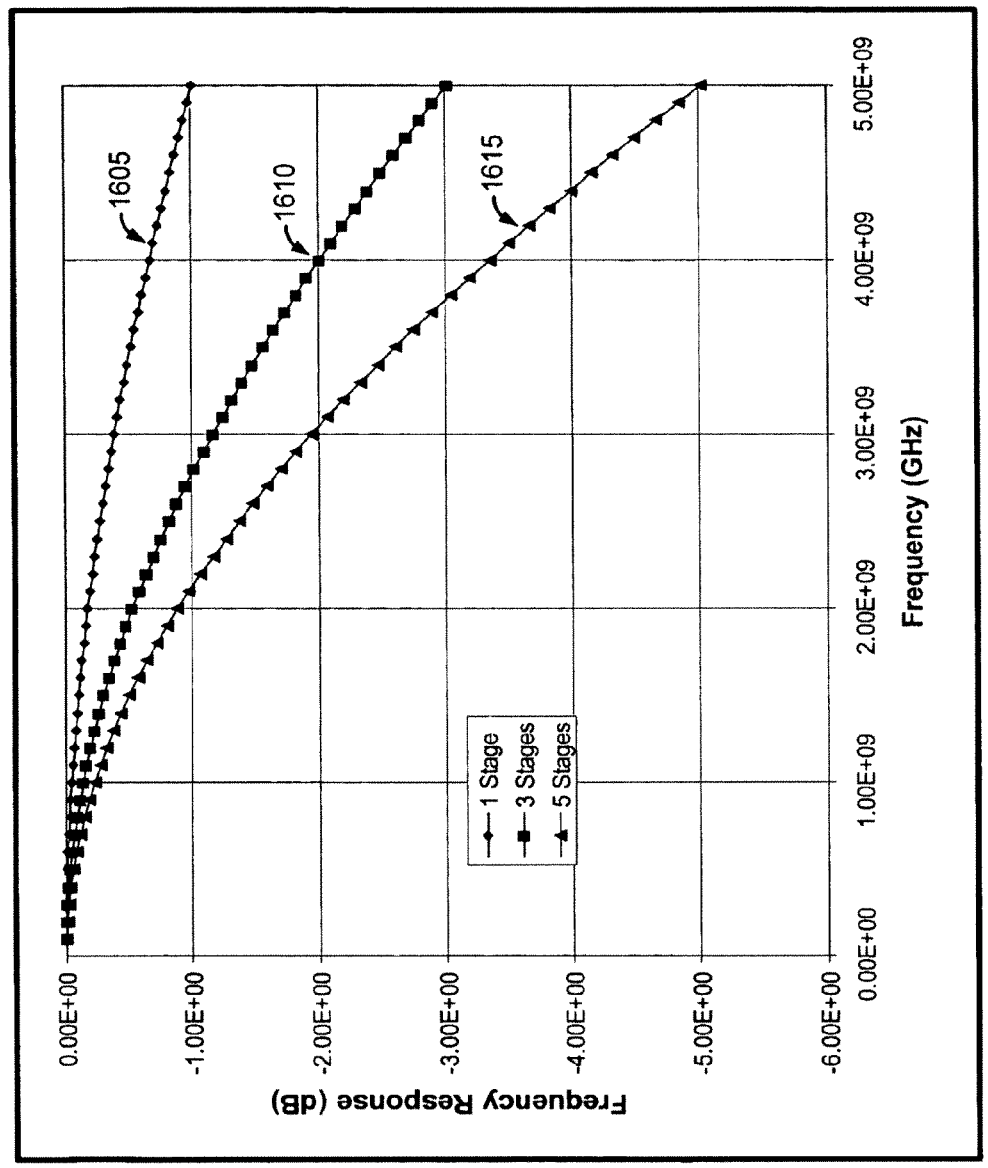
FIG. 16 is a plot of attenuation as a function of frequency for a linear circuit of passive filtering stages that are cascaded together according to an exemplary embodiment of the present invention.

In preparation for discussing the emulation channel 1510 and its components in further detail, it will be useful to briefly review frequency-dependent signal attenuation in signal processing devices. Turning now to FIG. 16, this figure illustrates an exemplary plot 1600 of attenuation as a function of frequency for a linear circuit of passive filtering stages that are cascaded together in accordance with an embodiment of the present invention.

In a linear system losses cascade or accumulate. In a passive filtering or delay circuit, each pole created by an RC time-constant will cascade, thereby reducing the usable bandwidth of the signals transmitting through the circuit. The magnitude of the frequency response for a cascade of N circuits, each with a first-order pole having a time constant RC, is given by the following equation:

$$H(\omega)=((1+(\omega RC)^2))^{-N/2}$$

The frequency response curves 1605, 1610, 1615 of FIG. 16 show how roll-off or high-frequency signal degradation worsens as the number of delay stages increases. The term "roll-off," as used herein, refers to the loss of high-frequency energy in a signal.

That is, a signal passing through a circuit typically comprises multiple frequency components that loose energy or decrease in amplitude as they pass through the filtering circuit. As the sophistication of the filtering or delay circuit (as represented by the number of "poles" or delaying stages) increases, the high-frequency signal components loose energy more rapidly than the low-frequency signal components. Thus, the frequency response plot 1605 of the single-stage circuit is relatively flat, indicating that the high-frequency signal components retain a relatively high level of energy. As indicated by the plot 1610, the three-stage circuit suppresses a significant amount of high-frequency energy from the signal. Finally, the plot 1615 shows that a five-stage circuit looses an even greater amount of high-frequency signal strength. At 5 GHz, one stage has 1 dB of loss, 3 stages have 3 dB of loss, and 5 stages have 5 dB of loss.

More generally, the roll-off in dB, RdB, at a given frequency increases linearly with the number of stages N according to the following equation:

$$Rdb=-20\log(H(\omega))=N\log(((+(\omega RC)^2))^{1/2})$$

In a delay line, the number of stages N corresponds to the amount of delay. As discussed above, roll-off increases with the addition of delay. As a result, the useful frequency of a linear delay line is inversely proportional to the amount of delay desired. In other words, increasing the sophistication of a passive delay line via adding time delay can result in undesirably attenuating the high-frequency signal components. That high-frequency attenuation can limit the circuit's capabilities for processing high-speed signals or for emulating signal effects, such as crosstalk, that involve high-frequency signal components.

The above-described high-frequency degradation can present problems in integrated circuits where transmission lines and synthetic transmission lines are very lossy. As a result, such transmission lines may not be well suited to providing significant delays, for example on the order of 1 nanosecond ("ns") for a 5 Gigabits per second ("Gbs") signal.

However, active circuit technology can overcome this roll-off problem. As will be discussed in further detail below, the emulation channel 1510 can beneficially comprise active circuit technology to boost high-frequency signal strength.

Figure 17:
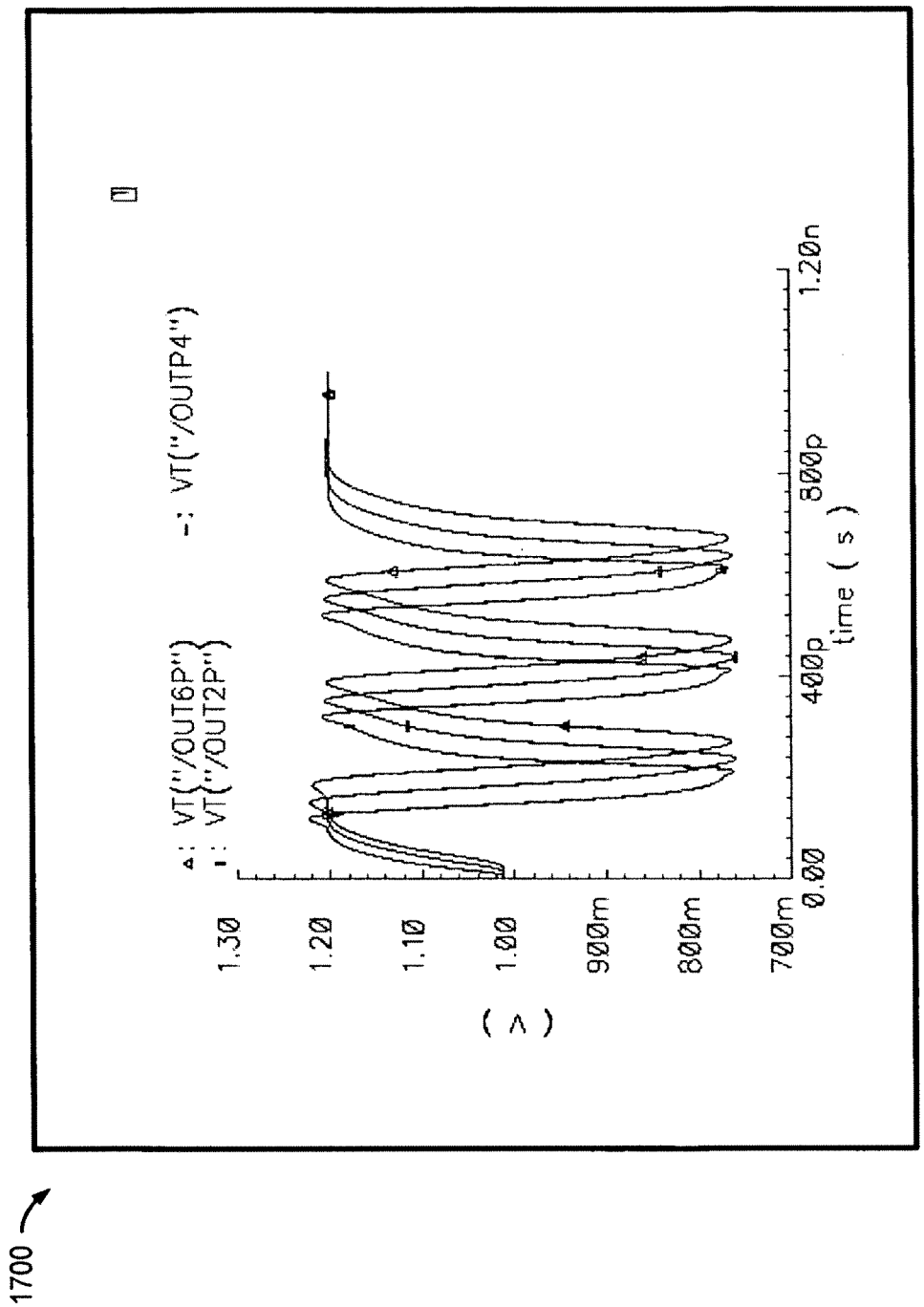
FIG. 17 is a plot of signal amplitude as a function of time for a circuit based on active stages that are connected in series according to an exemplary embodiment of the present invention.

Turning now to FIG. 17, this figure illustrates an exemplary plot 1700 of signal amplitude as a function of time for a circuit based on active stages that are connected in series in accordance with an embodiment of the present invention. FIG. 17 shows how active circuits that operate in a limiting fashion can overcome the frequency roll-off issue discussed above with reference to FIG. 16. More specifically, those active circuits can regenerate a signal without significant loss of high-frequency amplitude or degradation of frequency bandwidth.

Referring to FIG. 17, the plots 1700 show the propagation of a signal through a series of limiting amplifiers. At each stage, the signal decays from about 1.2 volts to about 0.75 volts and then is amplified back to about 1.2 volts. Consequently, the signal amplitude at the output of the sixth amplifier is essentially the same as the signal amplitude output from the second amplifier. Provided that the input amplitude is sufficient to limit the output response, the signal essentially regenerates as it propagates through the series of amplifiers.

In an exemplary embodiment, the temporal alignment module 1535 and the FIR filter 1560 of the emulation channel 1510 each comprises differential mixed-signal delays that are electronically adjustable and that comprise active delay lines. This principle is effective when the input signal is a pulse that causes the mixed-signal delays to limit.

The emulation channel 1510 applies analog processing that comprises linear circuits in the later stages of signal processing, towards the output 1590. Specifically, the elements that can exhibit roll-off are the tap-weighting amplifiers 2210A-E and the summation node 2240 of the FIR filter 1560, which are discussed in further detail below with reference to FIG. 22. By using limiting, mixed-signal delays in the front end (towards the input 1520) and the linear analog signal processing at the backend (towards the output 1590), the high-speed, adjustable delays 1530A, 1530B, 1530C and the FIR filter 1560 can have a compact integrated-circuit form. Moreover, the emulation channel 1510 can exhibit desirable frequency response and can deliver high-fidelity signals.

Figure 18:
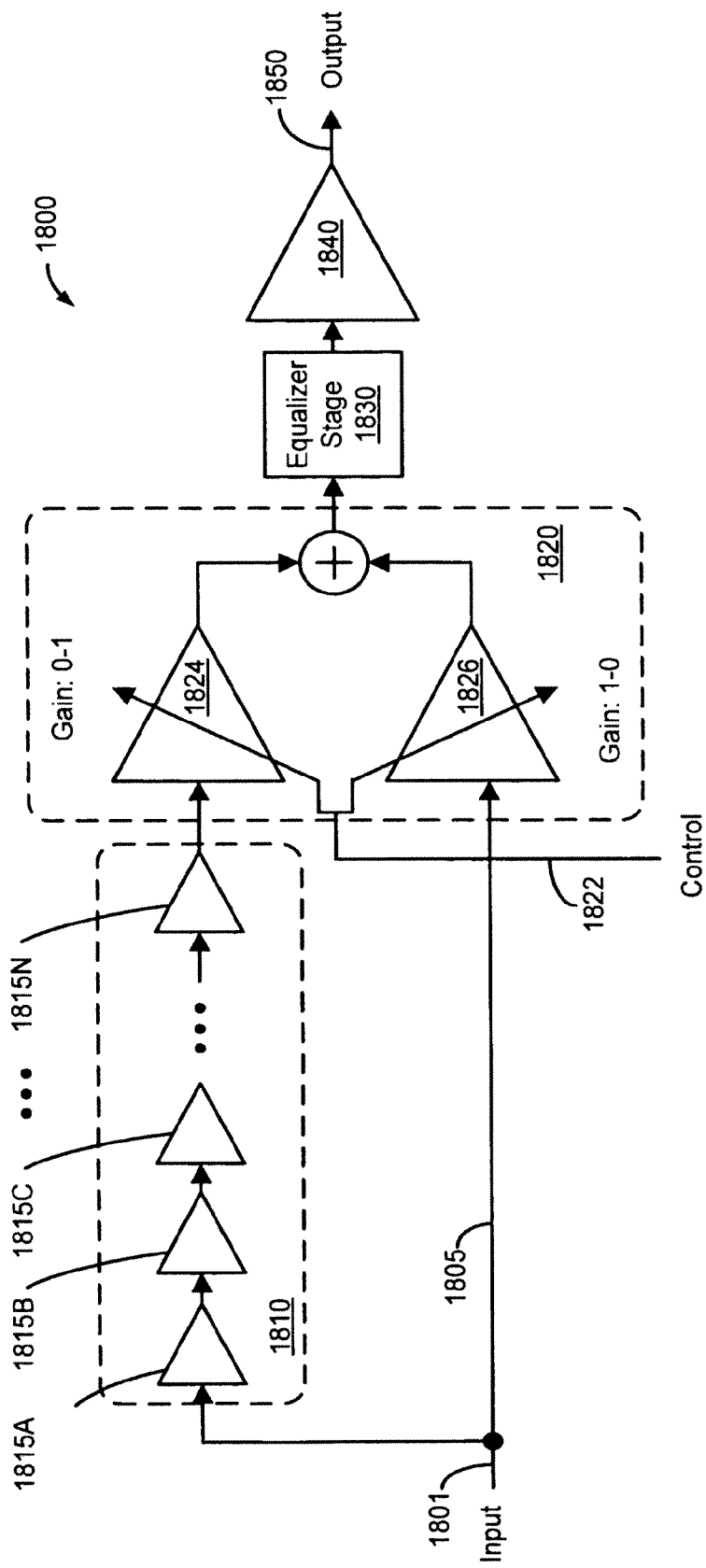
FIG. 18 is a functional block diagram of a circuit for controllably delaying an input signal according to an exemplary embodiment of the present invention.

Turning now to FIG. 18, this figure illustrates a functional block diagram of an exemplary circuit 1800 for controllably delaying an input signal in accordance with an embodiment of the present invention. That is, a block diagram of an electronically adjustable, mixed-signal delay is shown in FIG. 18. In an exemplary embodiment, the temporal alignment modules 1530A, 1530B, 1530C of FIG. 15, discussed above, each comprises at least one of the circuits 1800. When each temporal alignment module 1530A, 1530B, 1530C comprises two or more of the circuits 1800, those circuits 1800 are typically coupled to one another in a serial arrangement so that delay is additive.

Figure 30:
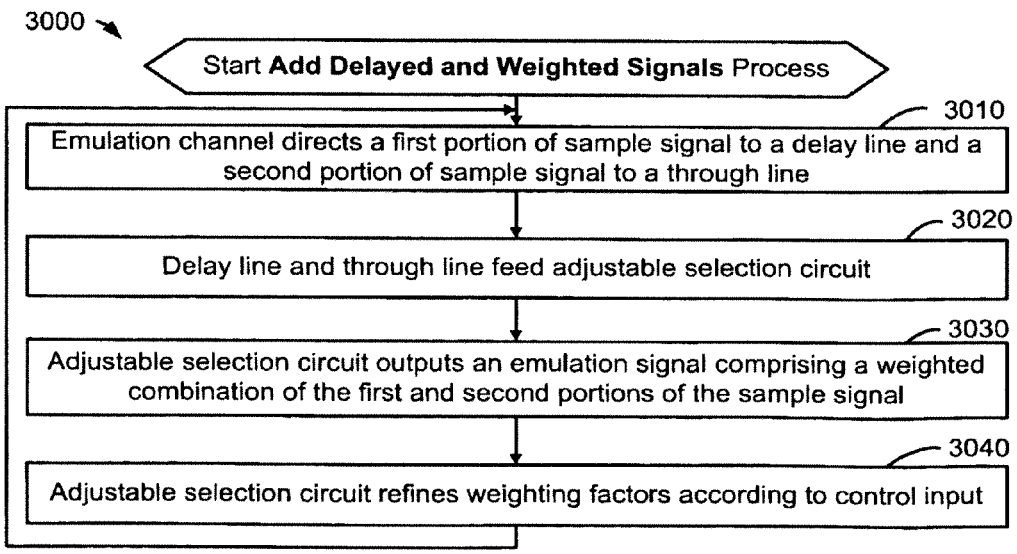
FIG. 30 is a flowchart of a process for combining delayed signals in connection with emulating a signal transformation according to an exemplary embodiment of the present invention.

In one exemplary embodiment, the circuit 1800 provides a capability for signal shaping as discussed below. The circuit 1800 may function in association with a signal processing method, for example via Process 3000 as illustrated in FIG. 30 and discussed below.

The input signal 1801 splits into two branches, one corresponds to a thru path 1805 and the other corresponds to a maximum delay path 1810. The adjustable selection circuit 1820 adds the signal from the thru path 1805 to the delayed signal from the maximum delay path 1810. The adjustable selection circuit 1820 performs this addition via a complementary weighting derived from a control signal on the control line 1822.

The control signal 1822 can increase weighting of the maximum delay path 1810, while simultaneously decreasing weighting of the thru path 1805, and vice versa. Alternatively, the adjustable selection circuit 1820, under the control of the control signal 1822, can decrease the contribution of the maximum delay path 1810 while increasing the contribution of the thru path 1805. That is, the adjustable selection circuit 1820 varies the gains of the amplifiers 1824, 1826 in a coordinated manner, decreasing one gain if the other increases, and vice versa. Thus, the system 1800 uses differential amplifiers 1824, 1826 and current steering to implement a weighted addition of two signals, one delayed in comparison to the other.

Adding the appropriately-scaled delayed and thru signals creates an output signal that has a delay between the thru delay and the maximum delay. In other words, the signal that the adjustable selection circuit 1820 outputs has a delay that is greater than or equal to the delay of the thru path 1805 and that is less than or equal to the delay of the delay path 1810.

The resulting additive signal can go through an optional equalizer section 1830 to compensate for roll-off incurred during propagation through the maximum delay path 1810. As discussed above with reference to FIG. 17, compensating for roll-off avoids accumulating high-frequency losses through multiple delay stages.

A driver stage 1840 provides limiting action that squares the signal and preserves the rise time. That stage 1840 comprises an amplifier that produces an output level sufficient to drive the next stage into a limiting condition. In other words, the equalizer stage 1830 and the driver stage 1840 can prepare the output signal of the coarse temporal alignment module 1530A for subsequent processing by the downstream fine temporal alignment module 1530B.

The delays of the coarse temporal alignment 1530A, fine temporal alignment 1530B, and variable delay 1530C can each be based on the block diagram of FIG. 18. The differences are the number of delay stages 1815A, 1815B, 1815C . . . 1815N used to determine the delay of the maximum delay path 1810. In other words, the coarse temporal alignment module 1530A would typically have more delay stages 1815A, 1815B, 1815C . . . 1815N than the fine temporal alignment module 1530B.

Turning now to FIG. 19, this figure illustrates a schematic of an exemplary circuit 1800 for controllably delaying an input signal in accordance with an embodiment of the present invention. More specifically, FIG. 19 illustrates an exemplary, transistor-level implementation of the circuit 1800 that FIG. 18 depicts in block diagram format, as discussed above.

Figure 19A:
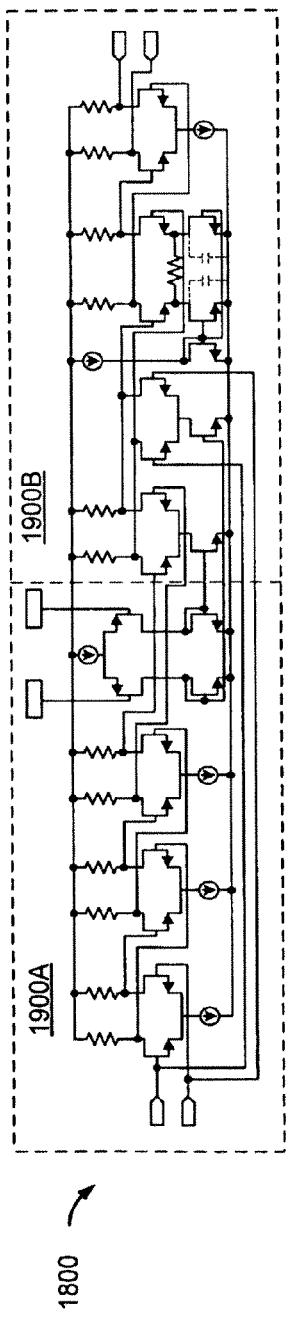
FIGS. 19A, 19B, and 19C, collectively
Figure 19B:
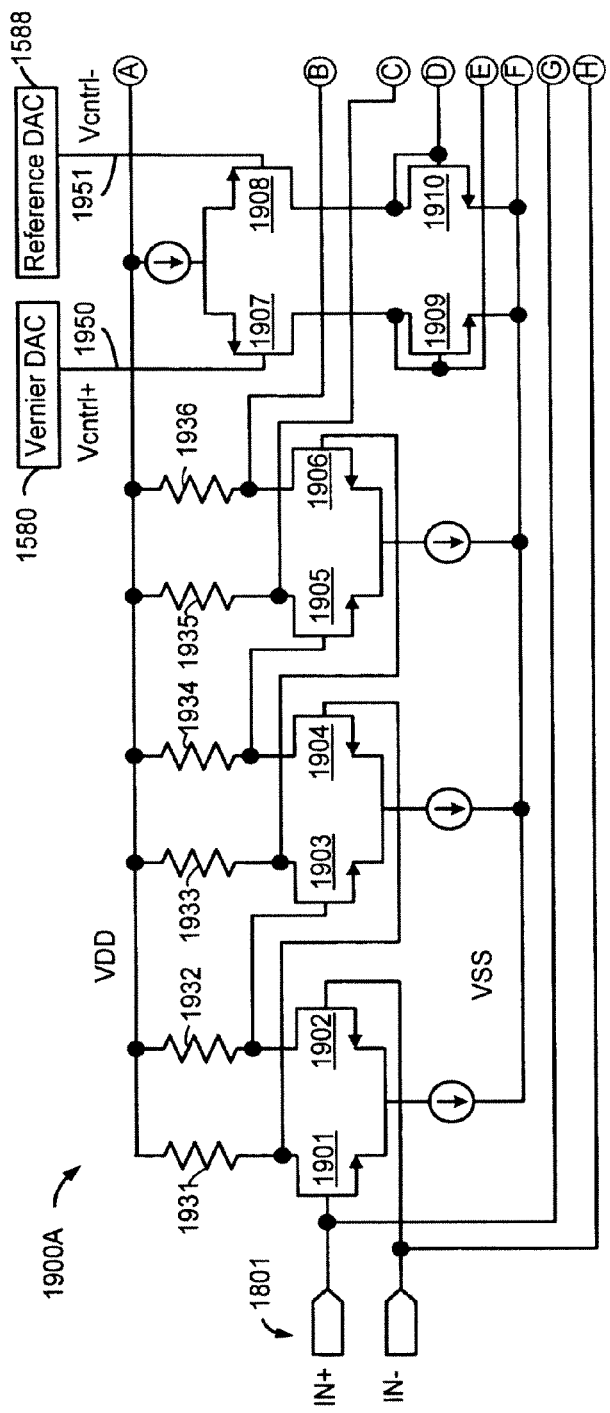
Figure 19C:
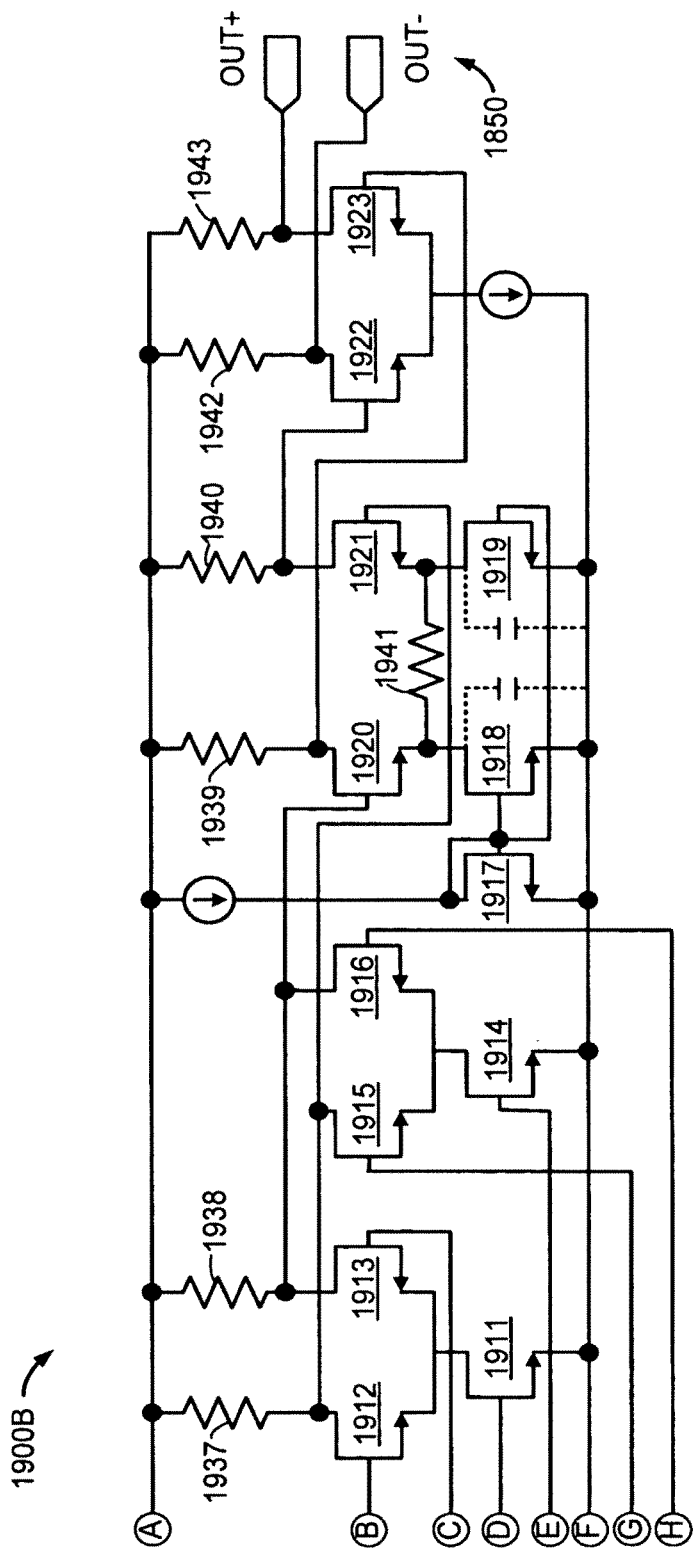

FIG. 19A provides a high-level view of the circuit 1800. The circuit schematic has been cut into two arbitrary sections 1900A, 1900B solely for the purposes of illustration. FIGS. 19B and 19C respectively illustrate those two viewing sections 1900A, 1900B.

The differential inputs 1801 are labeled "IN+" and "IN−". The differential amplifiers 1815A, 1815B, 1815C have been created using transistors 1901, 1902, 1903, 1904, 1905, and 1906 to provide the maximum delay path 1810. For the purposes of illustration, FIG. 19 shows three amplifiers that respectively function as the elements 1815A, 1815B, 1815C, illustrated in FIG. 18 and discussed above. However as discussed above, the number of amplifiers is variable and could range from one to five, eight, ten, fifteen, twenty, or more. More specifically, the delay element 1815A of FIG. 18 comprises the transistor 1901 and the transistor 1902. Meanwhile, the delay element 1815B comprises the transistor 1903 and the transistor 1904.

Optional capacitors can be added in the loads of each delay amplifier to increase delay. At high speeds, the natural parasitic capacitance is generally sufficient, and advantages may be realized from an area perspective by omitting such supplemental capacitors.

Transistors 1911, 1912, 1913, 1914, 1915, and 1916 form the adjustable selection circuit 1820 with outputs at the resistor 1937 and the resistor 1938. That is, in an exemplary embodiment, the element 1820 of FIG. 18 comprises the transistors 1911, 1912, 1913, 1914, 1915, and 1916 of FIG. 19.

The current steering device (of the adjustable selection circuit 1820) that provides the adjustable selection is a differential amplifier that comprises the transistors 1907, 1908, 1909, and 1910. That is, the transistors 1907, 1908, 1909, and 1910 partition the complementary gains between the amplifier 1824 and the amplifier 1826.

The control lines 1950 and 1951, respectively labeled "Vcntrl+" and "Vcntrl−", connect to two DACs, a reference DAC 1588 and the vernier DAC 1580. In an exemplary embodiment, the reference DAC 1588 and the vernier DAC 1580 are essentially identically copies of one another. The labeling of the vernier DAC as "1580" assumes that the circuit 1530 of FIG. 19 is an implementation of a portion of the coarse temporal alignment module 1530A discussed above. Interfaced to the fine temporal alignment module 1530B in an exemplary embodiment, the vernier DAC label could be "1582."

The optional equalizer section 1830 is a differential amplifier comprised of the transistors 1917, 1918, 1919, 1920, and 1921; the resistance 1941; and the load resistors 1939 and 1940. The element 1941 can be considered a degeneration resistor and as a part of the frequency response shaping that creates an equalizing function.

The equalizer section 1830 provides a boosting function with a zero as set forth by the following equation (in which "Cz" is the parasitic capacitance associated with the transistors 1918 and 1919 and "Rz" is the resistance 1941):

$$\omega = 2/(Rz*Cz).$$

As illustrated in the schematic of FIG. 19C via dotted lines, more shunt capacitance can be added across the transistors 1918 and 1919 if desired. At high speeds, the parasitic capacitance is typically sufficient and the added capacitance can usually be eliminated from the circuit.

In an exemplary embodiment, the output driver 1840 comprises the transistors 1922 and 1923. As discussed above, the output driver 1840 and the equalizer 1830 help assure the output signal has sufficient amplitude and acceptable rise time. The output driver 1840 and the equalizer 1830 can be eliminated from the circuit 1800 if the amplitude and rise time out of the adjustable selection circuit 1820 are sufficient.

The exemplary circuit embodiment 1800 of FIG. 19 typically employs MOS/CMOS transistors. However, bipolar transistors can used in an alternate embodiment. While the illustrated embodiment comprises loading resistors, other exemplary circuit embodiments can comprise active loads or a parallel combination of active and passive loads.

As discussed above, the adjustable selection circuit 1820, which can be characterized as a current steering device, is controlled by the two DACs, 1580 and 1588, that are connected to the same reference voltages. Using a common reference voltage provides a high degree of noise immunity and process tolerance to the control circuitry.

The large common-mode rejection of the current steering device 1820, coupled with the differential DAC topology, rejects the common-mode noise that might be present on the voltage supply lines or the reference lines. Circuit simulations can verify or help analyze such noise rejection. The differential DAC topology also provides an electronically programmable vernier for the delays.

The same reference DAC 1588 can provide input to the coarse temporal alignment module 1530A, the fine temporal alignment module 1530B, the variable delay module 1530C, and the delays of the FIR filter 1560. Meanwhile, each set of these delay devices 1530A, 1530B, 1530C, 1560 can have a dedicated vernier DAC 1580, 1582, 1584, 1586 to electronically trim the delay for optimal performance for different applications or to compensate for process, voltage, or temperature variation. In other words, the vernier DACs 1580, 1582, 1584, 1586 make dynamic timing adjustments in response to changing conditions, such as noise variations. The FIR delay vernier 1586 is particularly useful in accommodating different data rates, since FIR delay is typically tuned to an integer fraction (e.g. 1 or ½) of a unit interval in a crosstalk cancellation system.

Figure 20:
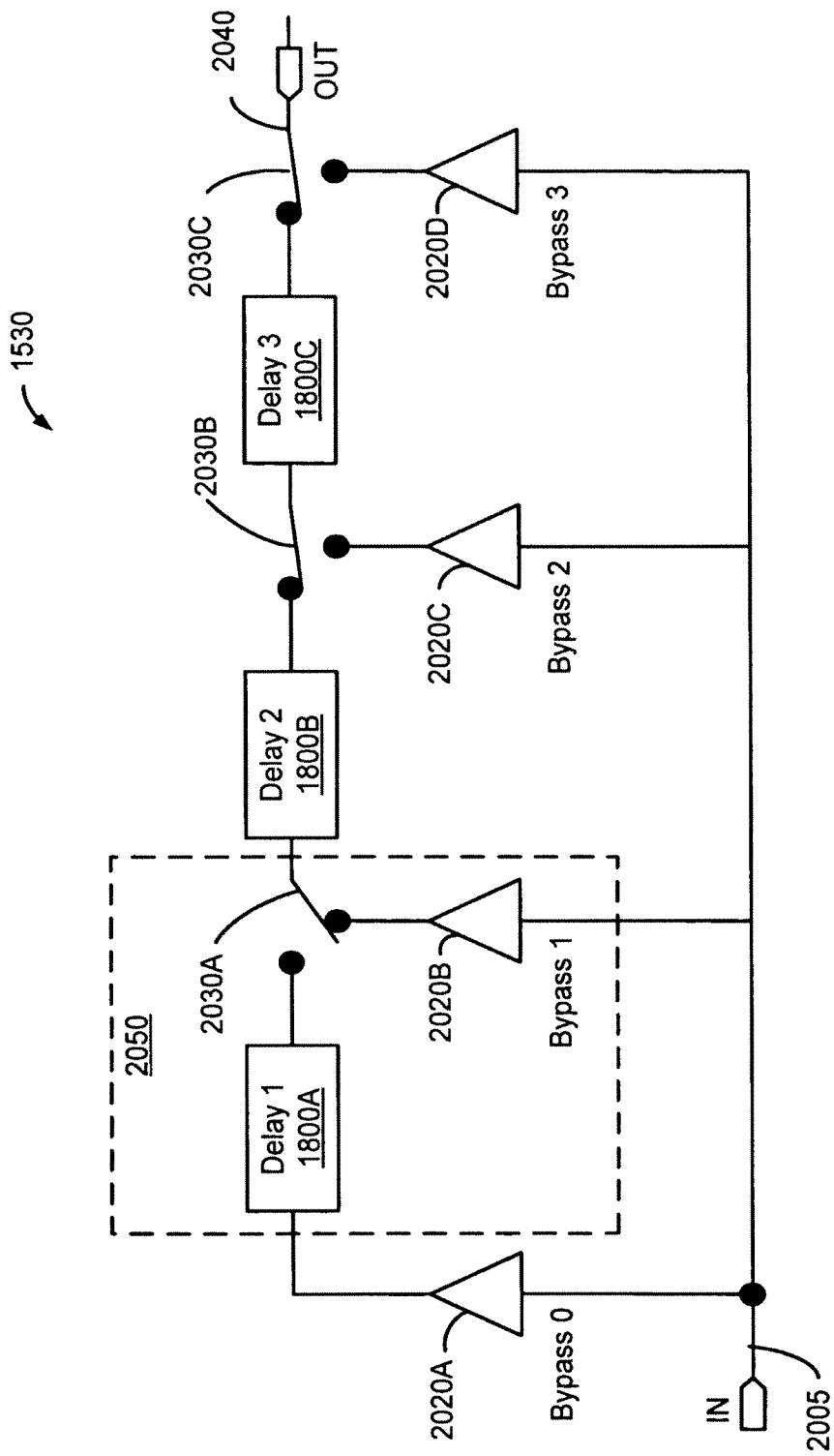
FIG. 20 is a functional block diagram of a circuit for controlling signal delay according to an exemplary embodiment of the present invention.

Turning now to FIG. 20, this figure illustrates a functional block diagram of an exemplary circuit 1530 for controlling signal delay in accordance with an embodiment of the present invention. In an exemplary implementation, the coarse temporal alignment module 1530A, the fine temporal alignment module 1530B, and the variable delay module 1530C of FIG. 15 can each comprise the circuit 1530 that FIG. 20 illustrates in block diagram form.

As discussed in further detail below, the circuit 1530 selects the number of operational delay elements 1800A, 1800B, 1800C that are providing signal delay at any given time in the coarse and fine temporal alignment modules 1530A, 1530B. While FIG. 20 illustrates three active delay elements 1800A, 1800B, 1800C, the actual number can be as few as two or might be some larger number such as five, ten, fifteen, etc. FIGS. 18 and 19 illustrate, as a block diagram and as a circuit schematic, an exemplary embodiment of each of the three active delay elements 1800A, 1800B, 1800C shown in FIG. 20.

Thus, in an exemplary embodiment, the block diagram of FIG. 20 could describe the fine temporal alignment module 1530B of FIG. 15. Meanwhile, the block diagram 1800 of FIG. 18 describes an exemplary embodiment of one of the three delays 1800A, 1800B, 1800C of FIG. 20.

Moreover, the block diagram of FIG. 20 can be viewed as describing a delay operation or a timing capability of the emulation channel 1510. A process 2900 associated with the system 1530 of FIG. 20 will be discussed in further detail below with reference to FIG. 29.

The input signal 2005 feeds the bypass amplifiers 2020A, 2020B, 2020C, 2020D in parallel. The switches 2030A, 2030B determine whether the delay elements 1800B, 1800C will receive input from a preceding delay element 1800A, 1800B or from an associated bypass amplifier 2020B, 2020C.

For example, switch 2030B selects the output of bypass amplifier 2020B or the output of the delay element 1800A. In an exemplary embodiment, exactly one of the bypass amplifiers 2020A, 2020B, 2020C, 2020D is enabled at any one time. Thus, the amplifiers 2020A, 2020B, 2020C, 2020D and the associated switching devices 2030A, 2030B, 2030C, which are typically solid state transistor elements, can be viewed as a bank or a set of signal routing elements.

The emulation channel turns off, deactivates, or removes power from any delay element 1800A, 1800B, 1800C that is not actively in a state of delaying the input signal. Turning off the delay elements 1800A, 1800B, 1800C in such conditions not only reduces power consumption, but also helps create the switches 2030A, 2030B, 2030C, 2030D.

The following table provides an exemplary scheme for selecting and controlling the level of time delay. More specifically, this table depicts which delay elements 1800A, 1800B, 1800C are enabled for specific bypass amplifier and delay settings.

| Bypass Status | | Delay 1 | Delay 2 | Delay 3 |
| --- | --- | --- | --- | --- |
| ON | Off | | | |
| 0 | 1, 2, 3 | ON | ON | ON |
| 1 | 0, 2, 3 | OFF | ON | ON |
| 2 | 0, 1, 3 | OFF | OFF | ON |
| 3 | 0, 1, 2 | OFF | OFF | OFF |

For maximum delay, all the delay elements 1800A, 1800B, 1800C are active and the bypass amplifiers 2020B, 2020C, and 2020D are not active, while the amplifier 2020A feeds delay 2010A. In this scenario, the signal propagates in series through each of the delay elements 1800A, 1800B, 1800C.

For minimum delay, bypass amplifier 3 2020D is selected, and all the delay elements 1800A, 1800B, 1800C are turned off. In this scenario, the signal bypasses or flows around all three delay elements 1800A, 1800B, 1800C.

In one exemplary embodiment, the bypass amplifier 2020A between the input 2005 and the first delay element 2010 can be eliminated. However, such elimination will result in the incremental signal delays having unequal time delays. The incremental signal delay is typically the composite delay of the bypass amplifier and its associated delay element.

Figure 21:
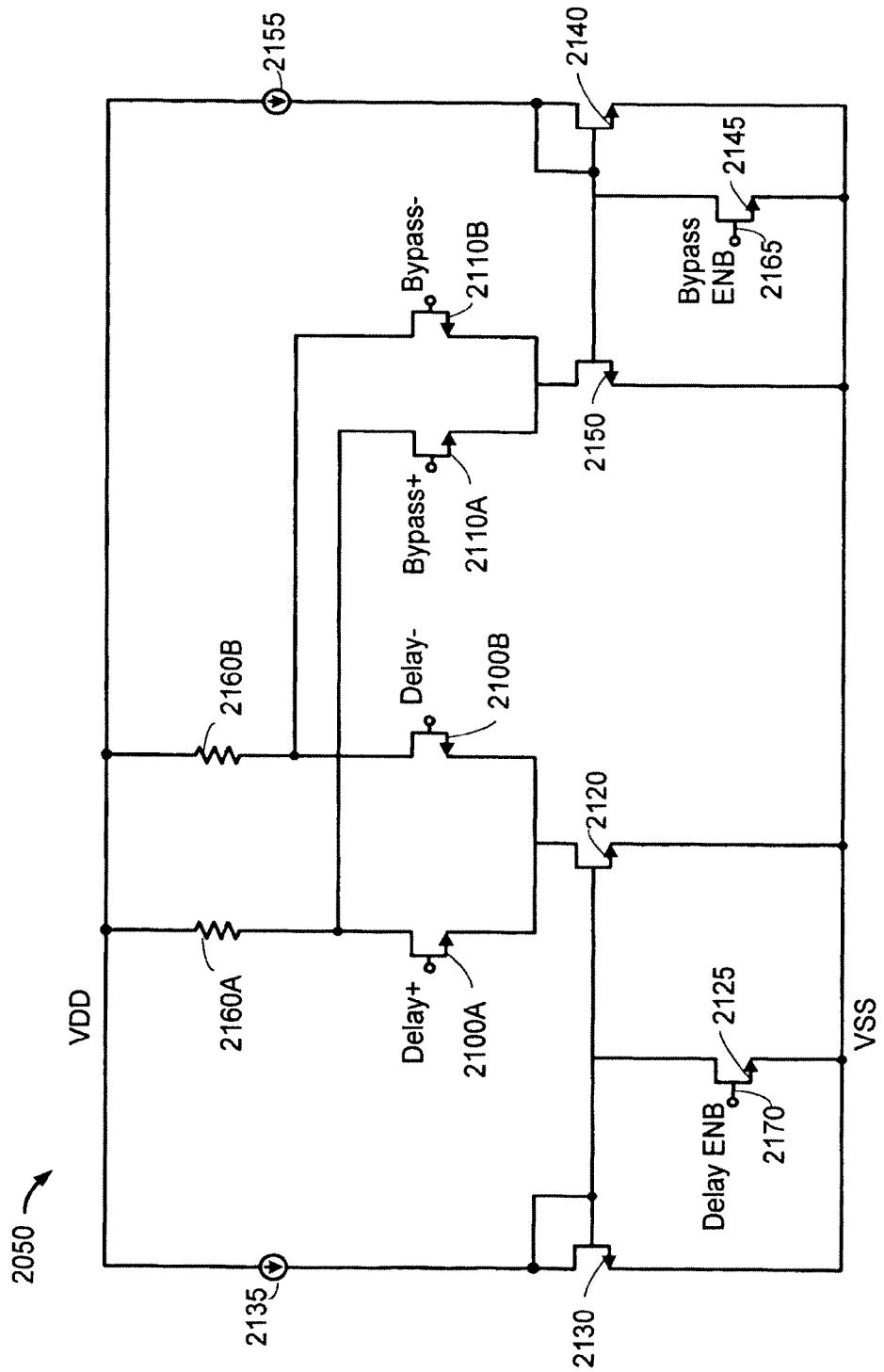
FIG. 21 is a schematic of a circuit for controlling signal delay according to an exemplary embodiment of the present invention.

Turning now to FIG. 21, this figure illustrates a schematic of an exemplary circuit 2050 for controlling signal delay in accordance with an embodiment of the present invention. More specifically, FIG. 21 shows an exemplary transistor-level implementation of the switching capability discussed above with reference to FIG. 20 for one of the delay elements 1800A, 1800B, 1800C and an associated one of the bypass amplifiers 2020A, 2020B, 2020C, 2020D.

For discussion purposes, the circuit 2050 will be discussed with reference to the delay-1 element 1800A and the associated bypass-1 amplifier 2020B. The bypass amplifier 2020B works in conjunction with the delay element 1800A to select or to bypass the delay element 1800A.

The circuit ports 2100A and 2100B provide an interface to the delay element 1800A. The circuit ports 2110A and 2110B provide an interface to the bypass amplifier 2020B. Meanwhile, the ports 2165 and 2175 receive enable signals, respectively for the delay element 1800A and the bypass amplifier 2020B.

Common loads 2160A and 2160B are shared between the delay element 1800A and the corresponding bypass amplifier 2020B. Transistors 2100A and 2100B represent the differential output of the delay element 1800A.

The transistors 2120 and 2130 form the current mirror for current source 2135. The transistors 2110A and 2110B represent or provide the function of the differential bypass amplifier 2020B. The transistors 2140 and 2150 are the current mirror for the current source 2155.

To enable the delay 1800A and disable the bypass amplifier 2020B, the transistor 2125 should be turned off by a low voltage on the port 2170, and transistor 2145 should be turned on with a high voltage on the port 2165. Turning off the low voltage on the port 2170 results in current flowing through the transistors 2100A and 2100B. Applying a high voltage on the port 2165 pulls down the current mirror voltage to the transistor 2140, which will turn off the transistors 2110A and 2110B.

To enable the bypass amplifier 2020B and disable the delay element 1800A, a high voltage is applied to the port 2170 and a low voltage is applied to the port 2165. This method of using current-mode switching to select the delay path generally offers superior performance and bandwidth as compared to using MOS switches as the bypass elements.

Figure 22A:
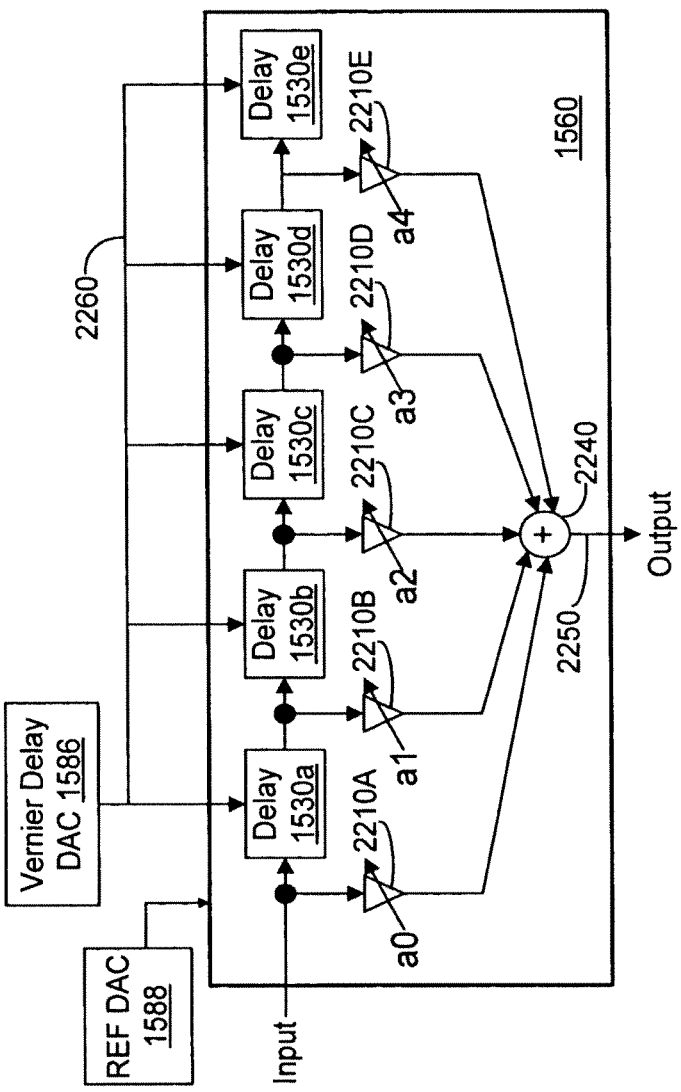
FIG. 22 is a schematic of a finite impulse response (FIR) filter according to an exemplary embodiment of the present invention.
Figure 22B:
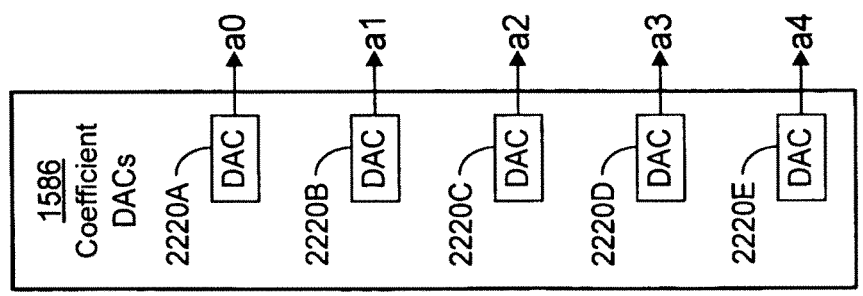

Turning now to FIG. 22, this figure illustrates a schematic of an exemplary finite impulse response (FIR) filter 1560 according to an exemplary embodiment of the present invention. More specifically, FIG. 22 provides an exemplary embodiment of the FIR filter 1560, discussed above, based on mixed-signal delays, also discussed above.

While a 5-tap FIR filter 1560 is shown, the number of taps can be varied according to application parameters. The mixed-signal delay elements 1530$a$, 1530$b$, 1530$c$, 1530$d$, 1530$e$ connect to the five tap coefficient amplifiers 2210A, 2210B, 2210C, 2210D, and 2210E.

A delay element 1530$e$ is placed at the end to preserve the uniformity of the tap delays, and is not strictly required. The tap-weight amplifiers 2210 are differential variable gain amplifiers that operate by current steering. In an exemplary embodiment, the tap-weight amplifiers 2210 can be viewed as variations of a Gilbert cell.

The tap coefficients 2210A, 2210B, 2210C, 2210D, and 2210E are each controlled by an individual DAC 2220 and a common reference DAC 1588. Each tap coefficient 2210A, 2210B, 2210C, 2210D, and 2210E is a function of the differential voltage of the corresponding tap coefficient DAC 2220A-E and the reference DAC 1588. The tap coefficients can be positive or negative.

The coefficient DACs 2220A-E and the reference DAC 1588 can be essentially identical copies of the same circuit and can have essentially identical reference voltages. Sharing a common architecture helps provide immunity to common mode noise and power supply noise.

The reference DAC 2230 can be shared with the delay elements 1530$a$, 1530$b$, 1530$c$, 1530$d$, 1530$e$, if desired. The outputs of all the tap coefficient amplifiers are combined in a summing node 2240. The summation process occurs by summing the output currents of the tap coefficient amplifiers 2210A-E in a differential load that is commonly shared by all the tap coefficient amplifiers 2210A-E. The output 2250 of the FIR filter 1560 from the summation node 2240 provides the output of the emulation channel 1510.

While FIGS. 15-22 generally illustrate CMOS implementations, other circuit and/or fabrication technologies can be used. For example, bipolar transistors can substitute for CMOS transistors. Loads shown as resistors can alternatively be active loads or a parallel combination of passive and active loads. Further, one or more of the illustrated DACs 1580, 1582, 1584, 1586 can be replaced with analog voltage control.

In one exemplary embodiment, a crosstalk cancellation device may contain more or fewer temporal alignment devices than the coarse, fine, and variable temporal alignment blocks 1530A, 1530B, 1530C discussed above and illustrated in FIG. 15. Further, the order of the temporal alignment blocks 1530A, 1530B, 1530C can be changed. For example, in an exemplary embodiment, the variable delay 1530C might feed the fine temporal alignment 1530B, which might in turn feed the coarse temporal alignment 1530A.

In another variation, the number of taps in the FIR filter 1560 could be less or more than exemplary numbers discussed above. In yet another variation, an optional variable gain amplifier can be placed after the FIR summation node 2240. Such an amplifier can facilitate controlling the emulation channel output amplitude without changing the tap coefficients 2210A, 2210B, 2210C, 2210D, and 2210E. However, the addition of a variable gain amplifier after the summation node 2240 may generally lower available bandwidth.

Embodiments of the system 1510 of FIG. 15 have been fabricated using 0.18-micron ("µm") and 0.13-µm CMOS technology. As fabricated and tested, the 0.18-µm integrated circuits comprised three coarse selectable delays of approximately 155 picoseconds ("ps") each; three fine selectable delays of approximately 45 ps each; and a five-tap FIR filter with delays of approximately 80 ps, generally corresponding to the illustrated elements 1530A, 1530B, 1530C, and 1560 discussed above. FIGS. 23-28 present results of laboratory tests of such fabricated devices.

Figure 23:
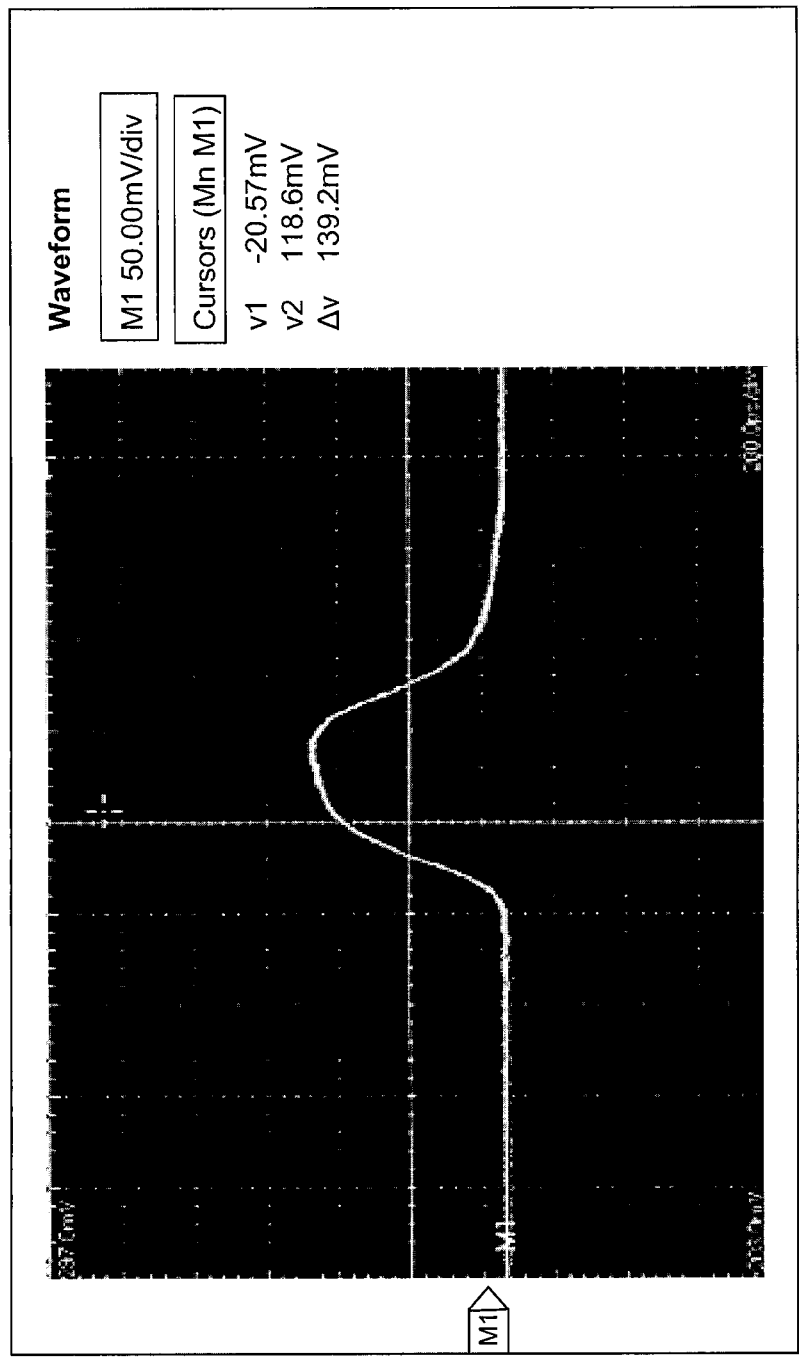
FIG. 23 is a plot of voltage as a function of time for an output pulse from an emulation circuit according to an exemplary embodiment of the present invention.

FIG. 23 illustrates an exemplary plot 2300 of voltage as a function of time for an output pulse from an emulation channel circuit 1510 in accordance with an embodiment of the present invention. More specifically, the plot 2300 shows an output pulse at 5 Gbs for a single input pulse through an embodiment of the emulation channel circuit 1510 based on 0.18-µm CMOS. For the test, the FIR filter coefficients 2220A, 2220B, 2220C, 2220D, 2220E were respectively set to a normalized (1 0 0 0 0) in order to pass the signal without pulse shaping.

Figure 24:
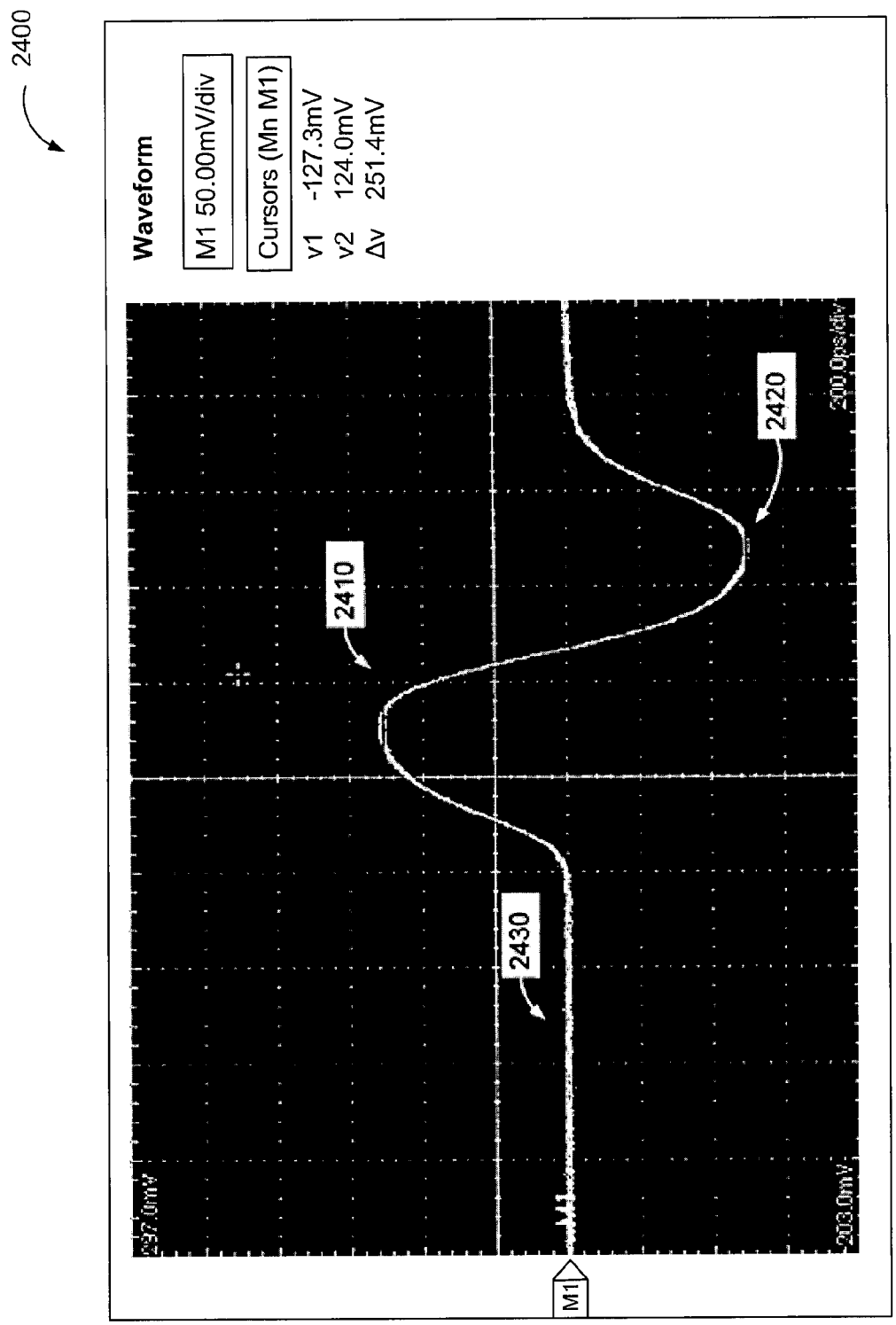
FIG. 24 is a plot of voltage as a function of time for an output pulse from an emulation circuit according to an exemplary embodiment of the present invention.

FIG. 24 illustrates an exemplary plot 2400 of voltage as a function of time for an output pulse from an emulation channel circuit 1510 in accordance with an embodiment of the present invention. More specifically, FIG. 24 provides a demonstration of the ability of the FIR filter 1560 to pulse shape. For the demonstration, an embodiment of the emulation channel circuit 1510 has been fabricated using 0.18 µm CMOS.

The FIR filter coefficients 2220A, 2220B, 2220C, 2220D, 2220E have been respectively set to a normalized (1 0 0 0 −1). With these values, the circuit 1510 processes a single 5 Gbs input pulse to create two output pulses. The two output pulses include a first pulse 2410 and an inverted second pulse 2420, respectively rising above and falling below a baseline 2430 as shown in FIG. 24.

In this scenario, the FIR filter 1560 effectively functions as a high-pass filter. More generally, the variable tap coefficients 2220A, 2220B, 2220C, 2220D, 2220E can be set so that the FIR filter 1560 may provide a wide range of different filter responses, thereby providing flexibility and supporting a range of applications.

In one exemplary embodiment, the circuit 1530 of FIG. 18 can output a signal similar to the waveform 2400.

An embodiment of the emulation circuit 1510 has also been fabricated as an integrated circuit in 0.13-μm CMOS. That version had six coarse selectable delays of approximately 160 ps, two fine selectable delays of approximately 85 ps, and a five-tap FIR filter with delays of approximately 95 ps, respectively and generally corresponding to the elements 1530A, 1530B, 1530C, and 1560 as illustrated in FIG. 15 and discussed above. The variable delay section 1530C is designed to cover approximately 2 fine delays, in order to ensure coverage through an entire unit interval over process, voltage, and temperature. The 0.13-μm CMOS implementation has delay verniers that are programmable through DAC settings.

Figure 25:
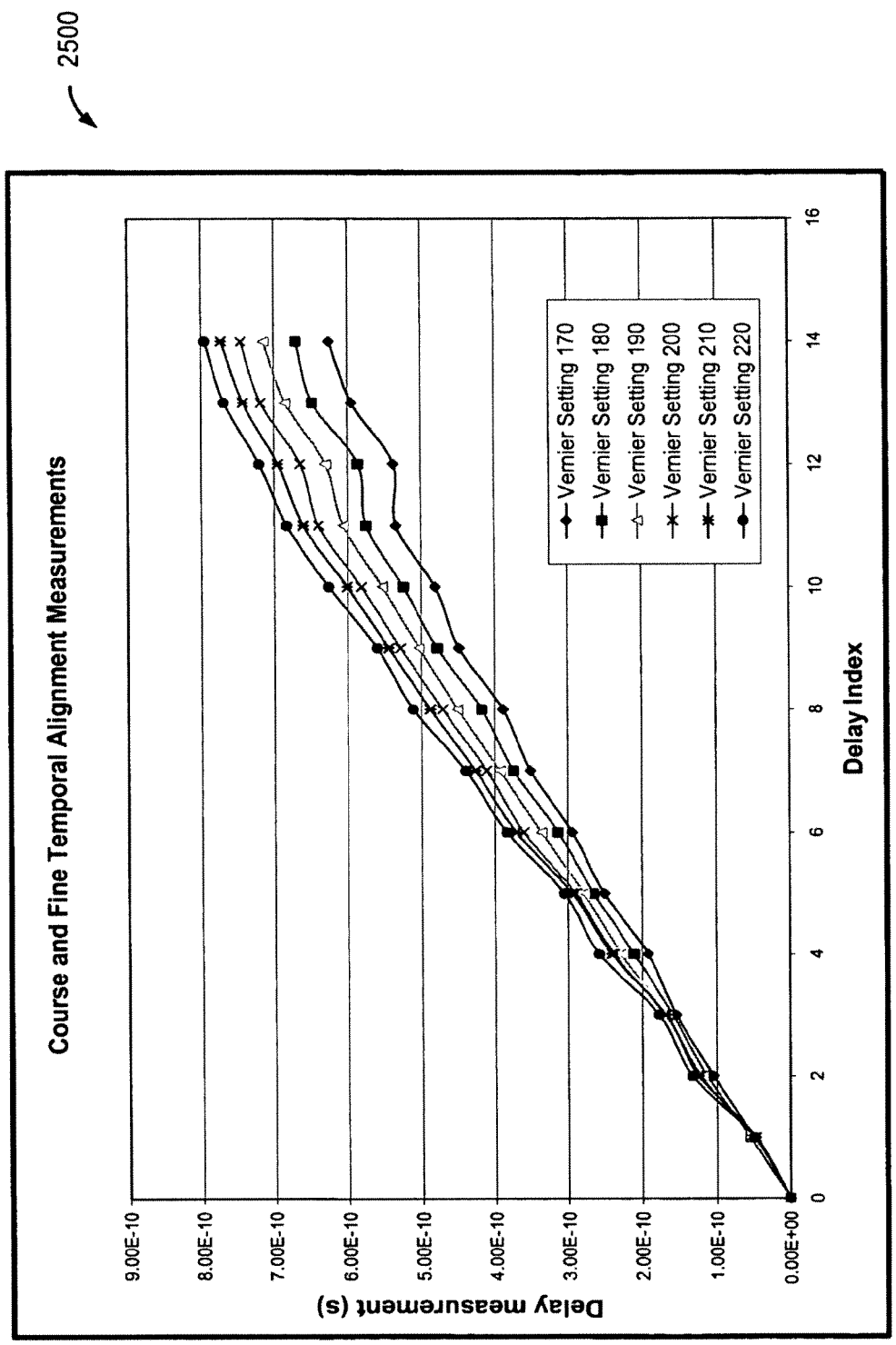
FIG. 25 is graph of a family of delay plots for an emulation circuit according to an exemplary embodiment of the present invention.

FIG. 25 illustrates an exemplary graph 2500 of a family of delay plots for an emulation channel circuit 1510 in accordance with an embodiment of the present invention. More specifically, FIG. 25 shows the relative delay measured through the emulation channel circuit 1510 as a function of coarse and fine delay settings as indicated by the delay index on the x-axis at a data rate of 5 Gbs. The illustrated data was collected via laboratory testing of fabricated devices. The relative delay is also shown for various delay vernier settings, demonstrating the ability of the verniers to trim the delay elements, thereby providing selectable levels of signal delay.

Figure 26:
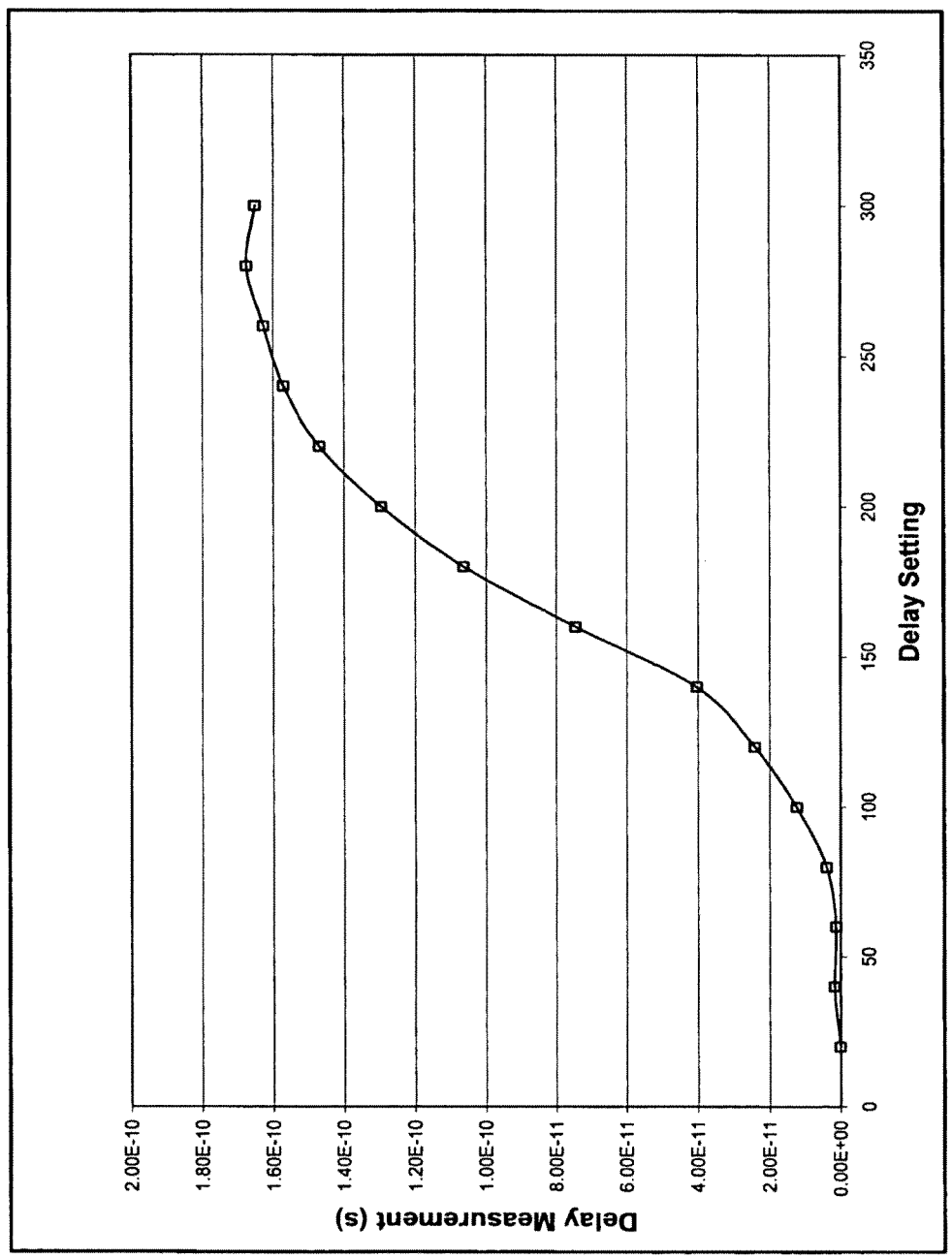
FIG. 26 is a plot of measured delay as a function of delay setting for an emulation circuit according to an exemplary embodiment of the present invention.

FIG. 26 illustrates an exemplary plot 2600 of measured delay as a function of delay setting for an emulation channel circuit 1510 in accordance with an embodiment of the present invention. The data was collected in laboratory testing of devices constructed in keeping with the above discussion. The variable delay is characterized as a function of the hexadecimal DAC setting at 5 Gbs. The plot 2600 shows that a combination of the coarse delays, fine delays, and variable delays provide thorough coverage of delay over several unit intervals. Moreover, the data shown that the actual delay can be set over broad range and that delay is essentially linear over a significant portion of that range.

Figure 27:
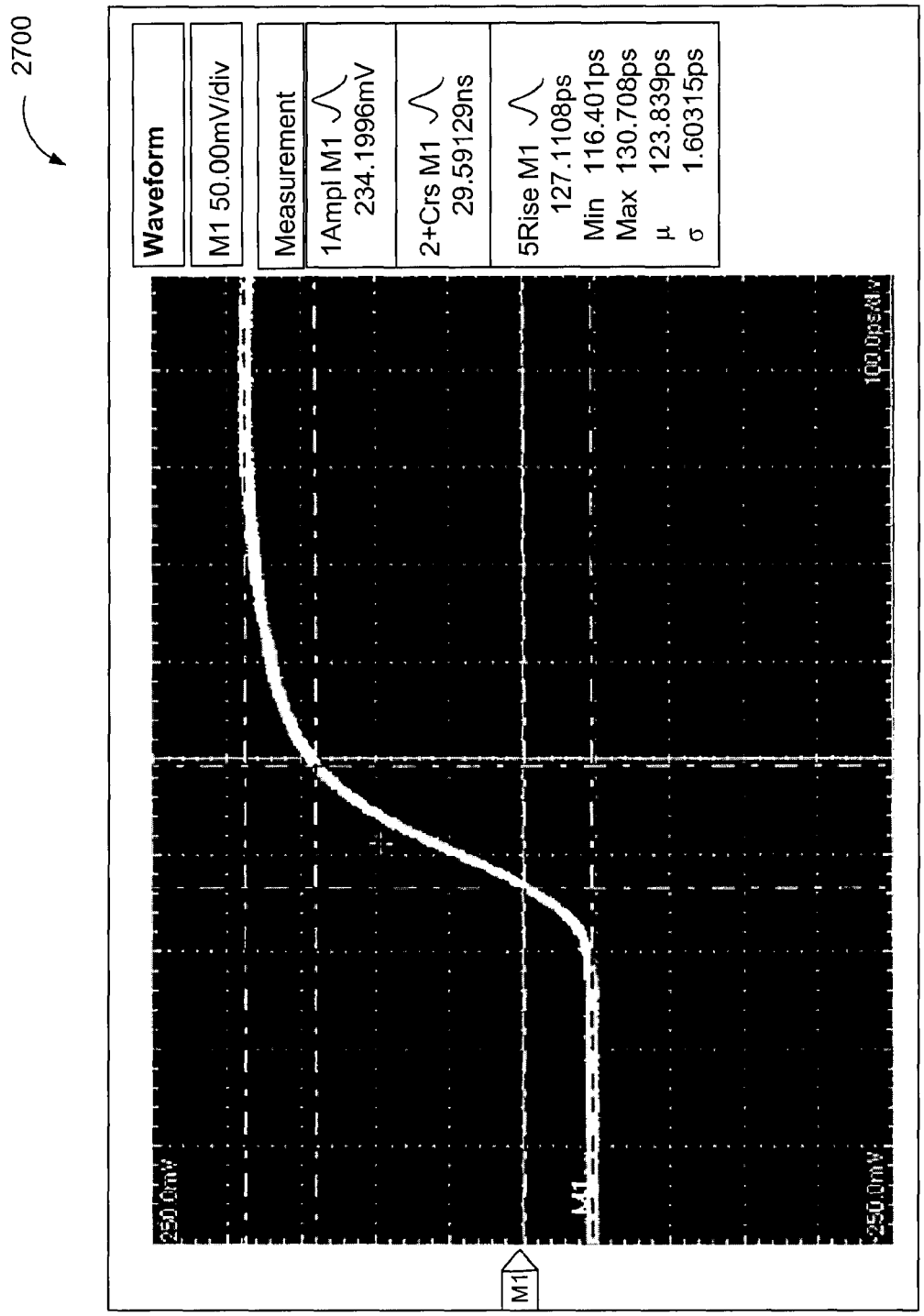
FIG. 27 is a plot of rise time for an emulation circuit according to an exemplary embodiment of the present invention.

FIG. 27 illustrates an exemplary plot 2700 of rise time for an emulation channel circuit 1510 in accordance with an embodiment of the present invention. More specifically, the plot 2700 presents data obtained in laboratory testing of a physical, 0.13-μm integrated circuit implementation of the emulation channel 1510. The 20%-80% rise time of the pulse is 127 ps after going through the emulation channel. That is, the pulse rises from 20% to 80% of its steady state value after about 127 ps.

Figure 28:
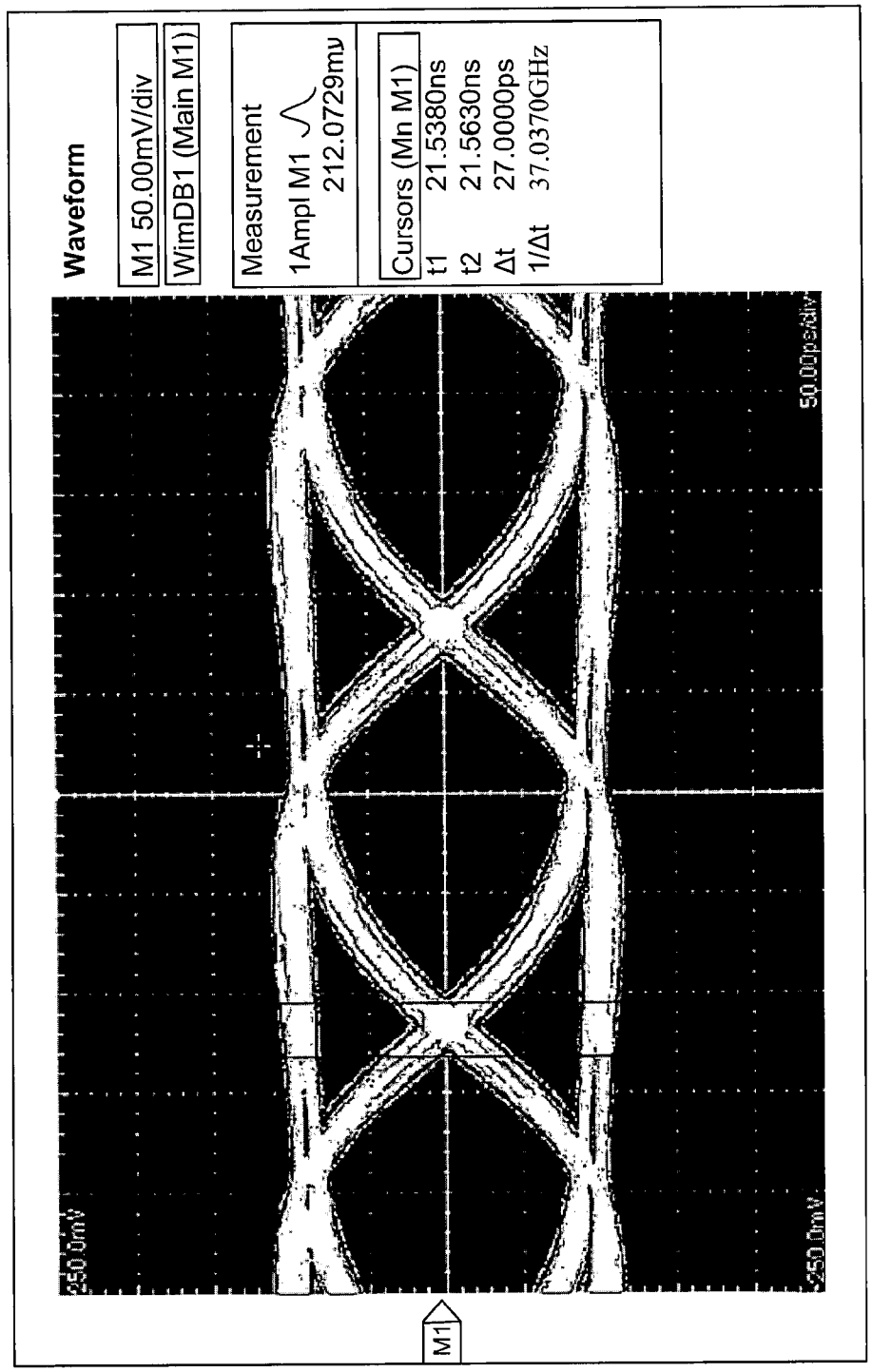
FIG. 28 is an eye diagram for an emulation circuit according to an exemplary embodiment of the present invention.

FIG. 28 figure illustrates an exemplary eye diagram 2700 for an emulation channel circuit 1510 in accordance with an embodiment of the present invention. The illustrated eye diagram 2700 was collected in laboratory tests of an emulation channel circuit 1510 involving 5 Gbs communication signal comprising a pseudo random bit sequence (PRBS) based on PRBS31.

As discussed above, eye diagrams provide a visual indication of signal quality. The level of openness of an "eye" in an eye diagram correlates with the level of signal quality or integrity. That is, a noisy, distorted, or closed eye in an eye diagram typically indicates signal impairment. An eye diagram can reveal impairments such as jitter, timing problems, noise, etc.

For the illustrated test, the FIR filter coefficients 2220A, 2220B, 2220C, 2220D, 2220E have been respectively set to a normalized (0 0 1 0 0). This open eye diagram 2800 shows that signal integrity is desirably preserved as the signal propagates through the emulation channel 1510.

Figure 29:
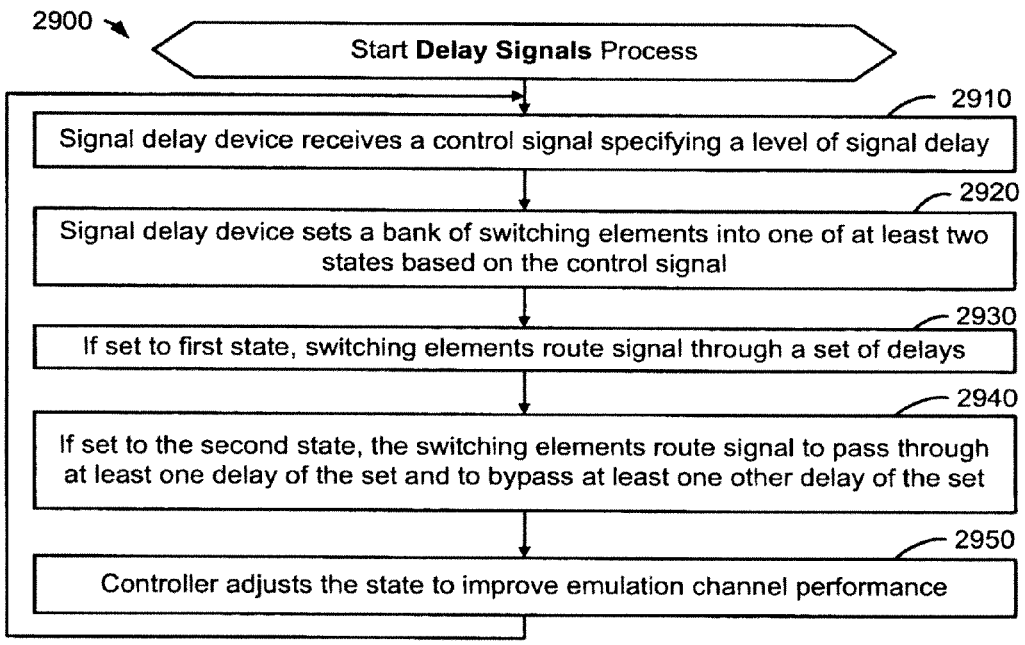
FIG. 29 is a flowchart of a process for delaying a signal in connection with emulating an effect on the signal according to an exemplary embodiment of the present invention.

Turning now to FIG. 29, this figure illustrates a flowchart of an exemplary process 2900 for delaying a signal in connection with emulating an effect on the signal in accordance with an embodiment of the present invention. Process 2900, which is entitled Delay Signals, will be discussed with exemplary reference to FIG. 20, as described above.

In an exemplary embodiment, Process 2900, or selected steps therein, can occur at the system 1800 of FIG. 18, the system 1535 of FIG. 15, the coarse temporal alignment module 1530A, the fine temporal alignment module 1530B, the variable delay module 1530C, or the FIR filter 1560. Process 2900 can be viewed as an example of a method for routing a signal through a network of delay elements to provide an adjustable amount of delay based on the route that the signal follows through the network.

At Step 2910, a signal delay device, for example the circuit 1530, receives a control signal on the control line 2005 that specifies a desired level of signal delay. The control signal may specify or define an absolute delay, a target delay, a relative delay, a time, an incremental change in time delay, or an instruction to increase or decrease a time delay, for example. The control bus 1570 can feed the control line 2005 or can comprise the control line 2005.

At Step 2920, a bank or a set of switching elements 2030A, 2030B, 2030C assume a state according to the control signal. That is, each of the switching elements 2030A, 2030B, 2030C, which can be viewed as routing elements, is set to direct the flow of electricity through one of two or more paths. For example, the switches 2030A, 2030B, 2030C can have a state as set forth in the table described above.

At Step 2930, if the switching elements 2030A, 2030B, 2030C are set to one state, the signal flows through all of the delay elements 1800A, 1800B, 1800C. In this situation, the delay of each of the delay elements 1800A, 1800B, 1800C is accumulative, and the transmitted signal is delayed by a relatively large amount of time. In this state, the switches 2030A, 2030B, 2030C (which are typically solid state and comprise transistors) are connected in a series configuration. For this configuration, the switch 2030A has the opposite state from that illustrated in FIG. 20, while the switches 2030B and 2030C have the illustrated configuration.

As Step 2940, if the control signal has set the switches 2030A, 2030B, 2030C to the second state, the signal routes around or bypasses at least one delay element 1800A and routes through at least one other delay element 1800B, 1800C. FIG. 20 illustrates the switches 2030A, 2030B, 2030C in such an exemplary configuration.

At Step 2950, a controller, such as the module 505 of FIGS. 5, 7, and/or 8 or the module 900 of FIG. 9, adjusts, changes, or updates the state to refine the delay. That is, the emulation channel 1510 uses dynamic feedback as discussed above to provide a match between the imparted delay and the emulated signal effect. Process 2900 iterates following Step 2950 to continue refining the level of delay applied to the signal in connection with emulation processing.

Turning now to FIG. 30, this figure illustrates a flowchart of an exemplary process 3000 for combining delayed signals in connection with emulating a signal transformation in accordance with an embodiment of the present invention. Process 3000, which is entitled Add Delayed and Weighted Signals, will be discussed with exemplary reference to FIG. 18, as described above.

In an exemplary embodiment, Process 3000, or selected steps therein, can occur at the system 1800 of FIG. 18, the system 1535 of FIG. 15, the coarse temporal alignment module 1530A, the fine temporal alignment module 1530B, the variable delay module 1530C, or the FIR filter 1560.

Moreover, Process 3000 and Process 2900 can execute in parallel with one another, Process 3000 can feed Process 2900, or Process 2900 can feed Process 3000. Process 3000 can be viewed as an example of a method feeding a signal through two signal paths, each having a different delay, and creating a weighted sum of the outputs of the two signal paths.

At Step 3010, the emulation channel 1510 directs a first portion of a sample signal through a delay line 1810 while directing a second portion for transmission over a through line 1805. In other words, the sample signal, in whole or in part, transmits through two signal paths 1805, 1810 that provide different amounts of delay. The delay path 1810, which can be viewed as a delay line, has at least one delay element 1815A, 1815B, 1815C, 1815N. Thus, the transmission time for the signal to propagate through the delay path 1810 is greater than the transmission time for the signal to propagate through the through path 1805.

At Step 3020 the adjustable selection circuit 1820 receives the respective signals from the delay path 1810 and the through path 1805, with the signal of the through path arriving in advance of the delay-path signal.

At Step 3030, the adjustable selection circuit 1820 applies complementary weighting factors to the delayed signal and the through-path signal and combines the result. Thus, the adjustable selection circuit 1830 applies a first gain to the signal from the through path 1805 and a second gain to the signal from the delay path 1810. As discussed above with reference to FIG. 18, the two gains are typically complementary with respect to one another. Combining the weighted or complementarily amplified signal typically comprises adding or summing the two signals together.

At Step 3040, the adjustable selection circuit 1820 receives a control signal, comprising a weighting specification, via the control line 1822. The control signal sets the relative weights or gains that the adjustable selection circuit 1820 applies to the outputs of the delay path 1810 and the through path 1805.

A controller, such as the module 505 of FIGS. 5, 7, and/or 8 or the module 900 of FIG. 9 adjusts, changes, updates the control signal and its weighting specification. The system 1530 uses dynamic feedback as discussed above, thus providing an emulation signal that resembles another signal or a signal effect. Process 3000 iterates following Step 3040 to continue refining the level of signal processing applied to a signal sample in connection with emulation processing.

In summary, an exemplary embodiment of the present invention can apply analog and digital signal processing (or analog signal processing under digital control) to a sample of a digital signal (or to a signal pulse or to some other signal). The signal processing can shape and delay the sample to create a representation of a signal effect. The represented signal effect could be crosstalk or some other phenomenon, for example.

Although a system in accordance with the present invention can comprise a circuit that cancels, corrects, or compensates for crosstalk imposed on one communication signal by another signal, those skilled in the art will appreciate that the present invention is not limited to this application and that the embodiments described herein are illustrative and not restrictive. Furthermore, it should be understood that various other alternatives to the embodiments of the invention described here may be employed in practicing the invention. The scope of the invention is intended to be limited only by the claims below.

What is claimed is:

1. A communication system comprising:
   an aggressor communication channel;
   a victim communication channel; and
   a crosstalk cancellation system, coupled between the aggressor communication channel and the victim communication channel, comprising:
   an emulation channel that comprises:
      a tap connected to the aggressor communication channel;
      a limiting amplifier electrically coupled to an output of the tap;
      a crosstalk modeling filter that is coupled to an output of the limiting amplifier and that comprises an adjustable delay and a filter arranged in electrical series with one another; and
      a port coupling an output of the crosstalk modeling filter towards the victim communication channel; and
   a control module comprising:
      an input electrically coupled to the victim communication channel;
      a delay control output electrically coupled to the adjustable delay; and
      a filter control output electrically coupled to the filter.

2. The communication system of claim 1, further comprising a backplane-to-line card connector that comprises the aggressor communication channel and the victim communication channel.

3. The communication system of claim 1, further comprising a backplane that comprises the aggressor communication channel and the victim communication channel.

4. The communication system of claim 1, wherein the communication system is rack-mounted and comprises a backplane, and wherein the crosstalk cancellation system is operable to suppress crosstalk in the rack-mounted communication system.

5. The communication system of claim 1, further comprising a first line card and a second line card, wherein the aggressor communication channel and the victim communication channel each extends between the first line card and the second line card.

6. The communication system of claim 1, wherein the aggressor communication channel and the victim communication channel are physically separated from one another.

7. The communication system of claim 1, wherein the communication system comprises a rack-mounted digital communication system that comprises a backplane and a plurality of line cards connected to the backplane,
   wherein at least one of the aggressor communication channel and the victim communication channel extends to one of the line cards.

8. The communication system of claim 1, wherein the control module is operable to refine the emulation channel for crosstalk cancellation via feeding delay control signals to the adjustable delay over the delay control output and feeding filter control signals to control gains on variable coefficient amplifiers of the filter.

9. The communication system of claim 1, wherein the filter comprises a plurality of delay elements, each operative to compensate for roll-off by applying frequency-dependent gain.

10. A system for emulating a transformation of a digital signal, comprising:
   a tap operable to obtain a sample of the digital signal from a signal channel;
   a delay module, electrically coupled to an output of the tap, operable to receive the sample and to apply a selectable level of delay to the sample;
   a programmable filter, electrically connected in series with the delay module, operable to shape the sample according to an adjustable filtering parameter; and a port, electrically coupled to the programmable filter, operable to output an emulation of the transformation that comprises the shaped and delayed sample, wherein the programmable filter comprises a plurality of delay elements.

11. The system of claim 10, further comprising a controller that is operable to adjust the filtering parameter to refine emulation of the transformation.

12. The system of claim 10, further comprising a control module that is operable to adjust delay of the delay module to refine emulation of the transformation.

13. The system of claim 10, wherein the signal channel comprises an aggressor communication channel and wherein the port is coupled to a victim communication channel disposed adjacent the aggressor communication channel.

14. The system of claim 13, comprising a rack-mounted digital communication system that comprises at least part of the victim communication channel and at least part of the aggressor communication channel.

15. The system of claim 10, wherein each delay element is operable to compensate for roll-off via applying frequency-dependent gain to the sample.

16. A system that emulates a transformation of a digital signal, the system comprising:

a tap operable to sample the digital signal from a communication channel;

a delay module connected to the tap to receive a sample of the digital signal from the tap, the delay module operable to delay the sample by a selectable amount of delay;

a programmable filter connected in electrical series with the delay module, the programmable filter operable to shape the sample according to an adjustable filtering parameter; and a port electrically coupled to the programmable filter, the port operable to output an emulation of the transformation comprising the shaped and delayed sample.

17. The system of claim 16, further comprising a rack, a plurality of line cards mounted in the rack, and a backplane providing the line cards connectivity, wherein the communication channel comprises an aggressor communication channel, and wherein the backplane comprises at least a section of the aggressor communication channel.

18. The system of claim 17, further comprising a victim communication channel oriented with respect to the aggressor communication channel to receive crosstalk from the aggressor communication channel, wherein the backplane comprises at least a section of the victim communication channel.

19. A method for shaping a digital signal that carries information by modulation between discrete signals levels, the method comprising the steps of:

reinforcing discrete signal levels of the digital signal;

shaping the reinforced digital signal according to an adjustable filtering parameter with an adjustable filter that comprises a plurality of delay elements; and compensating for roll-off of the sampled digital signal.

20. The method of claim 19, further comprising the steps of:

applying a delay to the digital signal; and dynamically adjusting the delay to refine suppression of crosstalk caused by the digital signal.

21. The method of claim 19, wherein the digital signal transmits in a rack-mounted digital communication system during the shaping step.

22. The method of claim 19, wherein the shaping step comprises transmitting the digital signal over a backplane.

23. The method of claim 19, further comprising the step of:

in response to adjusting the adjustable filtering parameter, refining crosstalk cancellation occurring at a line card.

24. A method for emulating a transformation of a digital signal transmitting on a communication system, the method comprising the steps of:

obtaining a sample of the digital signal from a first communication channel of the communication system;

buffering the communication channel from an emulation channel via processing the sample;

applying to the processed sample a level of delay that is dynamically refined;

shaping the processed sample according to at least one filtering parameter that is dynamically refined; and applying to a second communication channel of the communication system an emulation of the transformation that comprises the shaped and delayed sample.

25. The method of claim 24, wherein the first communication channel comprises an aggressor communication channel disposed in a rack-mounted digital communication system, and wherein the second communication channel comprises a victim communication channel disposed in the rack-mounted digital communication system.

26. The method of claim 24, wherein the first communication channel and the second communication channel extend through a back plane.

27. The method of claim 24, wherein a line card comprises at least a portion of the first communication channel and at least a portion of the second communication channel, and wherein the first communication channel and the second communication channel are physically separated.

28. The method of claim 24, wherein a backplane-to-line card connector comprises the aggressor communication channel and the victim communication channel.

* * * * *